United States Patent
Lee et al.

(10) Patent No.: US 12,055,851 B2
(45) Date of Patent: Aug. 6, 2024

(54) CORE-SHELL COMPOUND, PHOTOSENSITIVE RESIN COMPOSITION INCLUDING THE SAME, PHOTOSENSITIVE RESIN LAYER, COLOR FILTER AND CMOS IMAGE SENSOR

(71) Applicant: SAMSUNG SDI CO., LTD., Yongin-si (KR)

(72) Inventors: Young Lee, Suwon-si (KR); Sundae Kim, Suwon-si (KR); Yeji Yang, Suwon-si (KR); Chaehyuk Ko, Suwon-si (KR); Ieju Kim, Suwon-si (KR); Arum Yu, Suwon-si (KR); Myungho Cho, Suwon-si (KR); Xinhui Feng, Suwon-si (KR); Jungsun Lee, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 294 days.

(21) Appl. No.: 17/487,515

(22) Filed: Sep. 28, 2021

(65) Prior Publication Data
US 2022/0100085 A1   Mar. 31, 2022

(30) Foreign Application Priority Data

Sep. 29, 2020 (KR) .................. 10-2020-0127362
Sep. 29, 2020 (KR) .................. 10-2020-0127363

(51) Int. Cl.
*G03F 7/00* (2006.01)
*G02B 1/04* (2006.01)
*G02B 5/20* (2006.01)
*G03F 7/027* (2006.01)
*H01L 27/146* (2006.01)

(52) U.S. Cl.
CPC ............. *G03F 7/0007* (2013.01); *G02B 1/04* (2013.01); *G03F 7/027* (2013.01); *H01L 27/14621* (2013.01); *G02B 5/20* (2013.01)

(58) Field of Classification Search
CPC ......... G03F 7/0007; G03F 7/027; G02B 1/04; G02B 5/20; H01L 27/14621; C09B 57/007
See application file for complete search history.

(56) References Cited

U.S. PATENT DOCUMENTS

| | | | |
|---|---|---|---|
| 6,386,383 B1 | 5/2002 | Roudonis | |
| 2019/0056713 A1 | 2/2019 | Ogawa | |
| 2019/0382587 A1 | 12/2019 | Seo et al. | |
| 2020/0142301 A1 | 5/2020 | Kwon et al. | |
| 2020/0308099 A1 | 10/2020 | Jeong et al. | |

FOREIGN PATENT DOCUMENTS

| | | |
|---|---|---|
| CN | 110997867 A | 4/2020 |
| EP | 161005 B1 | 5/1985 |
| JP | 1991-276159 A | 12/1991 |
| JP | 2016-117858 A | 6/2016 |
| JP | 2019-148796 A | 5/2019 |
| JP | 2019-530765 A | 10/2019 |
| JP | 2019-532145 A | 11/2019 |
| JP | 2019-532918 A | 11/2019 |
| JP | 2020-076995 A | 5/2020 |
| KR | 10-2015-0098587 A | 8/2015 |
| KR | 10-2018-0026967 A | 3/2018 |
| KR | 10-2019-0054408 A | 5/2019 |
| KR | 10-2019-0063974 A | 6/2019 |
| KR | 10-2018236 B1 | 9/2019 |
| KR | 10-2023710 B1 | 9/2019 |

(Continued)

OTHER PUBLICATIONS

"Core/Shell Nanoparticles: Classes, Properties, Synthesis Mechanisms, Characterization, and Applications" Rajib Ghosh Chaudhuri and Santanu Paria Chemical Reviews 2012 112 (4), 2373-2433 (Year: 2012).*

(Continued)

*Primary Examiner* — Peter L Vajda
*Assistant Examiner* — Jayson D Cosgrove
(74) *Attorney, Agent, or Firm* — Lee IP Law, P.C.

(57) ABSTRACT

A core-shell compound, a photosensitive resin composition including the same, a photosensitive resin layer produced using the photosensitive resin composition, a color filter including the photosensitive resin layer, and a CMOS image sensor including the color filter, the core-shell compound including a core represented by Chemical Formula 1; and a shell surrounding the core, the shell being represented by Chemical Formula 2:

[Chemical Formula 1]

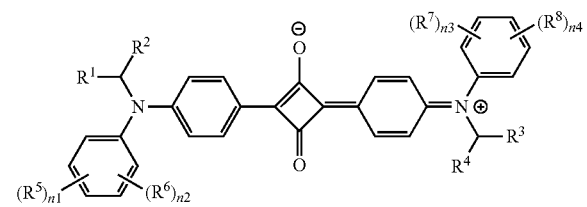

[Chemical Formula 2]

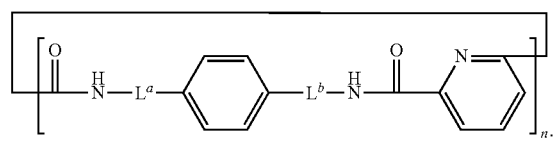

20 Claims, No Drawings

(56) References Cited

FOREIGN PATENT DOCUMENTS

| | | |
|---|---|---|
| KR | 10-2020-0052160 A | 5/2020 |
| KR | 10-2020-0072212 A | 6/2020 |
| KR | 10-2021-0156125 A | 12/2021 |
| TW | 201807079 A | 3/2018 |
| WO | WO 2008-094637 A2 | 8/2008 |
| WO | WO 2018-043829 A1 | 3/2018 |

OTHER PUBLICATIONS

Della Pelle et al., J. Phys. Chem. C, vol. 118, No. 4, 00. 1793-1799.
Taiwanese Search Report dated Oct. 14, 2022.
Korean Office Action dated May 22, 2024 for corresponding Korean Patent Application No. 10-2020-0127362.
Korean Notice of Allowance dated May 22, 2024 for corresponding Korean Patent Application No. 10-2020-0127363.

* cited by examiner

CORE-SHELL COMPOUND, PHOTOSENSITIVE RESIN COMPOSITION INCLUDING THE SAME, PHOTOSENSITIVE RESIN LAYER, COLOR FILTER AND CMOS IMAGE SENSOR

CROSS-REFERENCE TO RELATED APPLICATION

This application claims priority to and the benefit of Korean Patent Application No. 10-2020-0127363 filed in the Korean Intellectual Property Office on Sep. 29, 2020, and Korean Patent Application No. 10-2020-0127362 filed in the Korean Intellectual Property Office on Sep. 29, 2020, the entire contents of which are incorporated herein by reference.

BACKGROUND

1. Field

Embodiments relate to a core-shell compound, a photosensitive resin composition including the same, a photosensitive resin layer produced using the photosensitive resin composition, a color filter including the photosensitive resin layer, and a CMOS image sensor including the color filter.

2. Description of the Related Art

With the recent rapid development of advanced information and communication processing technology and overall electronics industry, a next generation detector rapidly transmitting and receiving a large amount of information and the development of a new concept device and system has been considered. In particular, with the rise of video processing and the like in mobile devices, technology development of an ultra-down-sized and ultra-power-saving image sensor is rapidly accelerated, centering on existing CCD (Charge Coupled Device) and CMOS (Complementary Metal Oxide Semiconductor).

An image sensor, which is a semiconductor that converts photons into electrons and displays them on a display or stores them in a storage device, may include a light receiving element that converts light signals into electrical signals, a pixel circuit portion that amplifies and compresses the converted electrical signals, and an ASIC portion that converts these pre-treated analog signals into digital signals to treat image signals and for example, includes CCD, CMOS, CIS (Contact Image Sensor), and the like.

The CCD and CMOS image sensors may use the same light-receiving element, but in the CCD image sensor, charges generated in the light-receiving element sequentially move through MOS capacitors connected in series and are converted into voltages in a source follower connected at the final end. On the other hand, in the CMOS image sensor, the charges are converted into voltages in a source follower built into each pixel and output to the outside. More specifically, the CCD image sensor moves electrons generated by light as they are to an output unit by using a gate pulse, but the CMOS image sensor convert the electrons generated by light into voltages in each pixel and then output them through several CMOS switches. These image sensors are very widely applied from household products such as a digital camera and a mobile phone to an endoscope used in hospitals and a telescope used in a satellite orbiting the earth.

SUMMARY

The embodiments may be realized by providing a core-shell compound including a core represented by Chemical Formula 1; and a shell surrounding the core, the shell being represented by Chemical Formula 2:

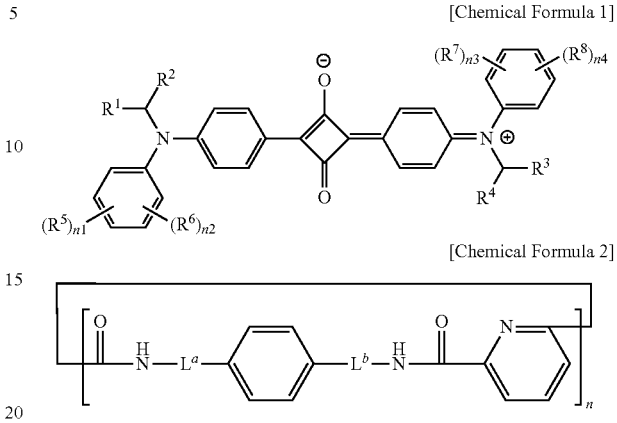

[Chemical Formula 1]

[Chemical Formula 2]

wherein, in Chemical Formula 1 and Chemical Formula 2, $R^1$ to $R^8$ are each independently a hydrogen atom, a substituted or unsubstituted C1 to C20 alkyl group, or a substituted or unsubstituted C1 to C20 alkoxy group, provided that all of $R^1$ to $R^8$ are not simultaneously a hydrogen atom, $R^1$ and $R^2$ are separate or are fused to each other to form a ring, $R^3$ and $R^4$ are separate or fused to each other to form a ring, at least one of $R^1$, $R^2$, $R^5$, and $R^6$ is substituted with an epoxy group or a siloxane group at a terminal end thereof, at least one of $R^3$, $R^4$, $R^7$, and $R^8$ is substituted with an epoxy group or a siloxane group at a terminal end thereof, $L^a$ and $L^b$ are each independently a single bond or a substituted or unsubstituted C1 to C10 alkylene group, n1, n2, n3, and n4 are each independently an integer of 0 to 5, $1 \leq n1+n2 \leq 3$, $1 \leq n3+n4 \leq 3$, and n is an integer of greater than or equal to 2.

The embodiments may be realized by providing a photosensitive resin composition including the compound according to an embodiment.

The embodiments may be realized by providing a photosensitive resin layer produced by using the photosensitive resin composition according to an embodiment.

The embodiments may be realized by providing a color filter including the photosensitive resin layer according to an embodiment.

The embodiments may be realized by providing a CMOS image sensor including the color filter according to an embodiment.

DETAILED DESCRIPTION

Example embodiments will now be described more fully hereinafter; however, they may be embodied in different forms and should not be construed as limited to the embodiments set forth herein. Rather, these embodiments are provided so that this disclosure will be thorough and complete, and will fully convey exemplary implementations to those skilled in the art.

It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present.

As used herein, when specific definition is not otherwise provided, "substituted" refers to one substituted with a substituent, e.g., a halogen (F, Br, Cl, or I), a hydroxy group, a nitro group, a cyano group, an amino group ($NH_2$, $NH(R^{200})$, or $N(R^{201})(R^{202})$, wherein $R^{200}$, $R^{201}$, and $R^{202}$ are each independently a C1 to C10 alkyl group), an amidino group, a hydrazine group, a hydrazone group, a carboxyl group, a substituted or unsubstituted alkyl group, a substituted or unsubstituted alkenyl group, a substituted or unsubstituted alkynyl group, a substituted or unsubstituted alicyclic organic group, a substituted or unsubstituted aryl group, or a substituted or unsubstituted heterocyclic group. As used herein, the term "or" is not an exclusive term, e.g., "A or B" would include A, B, or A and B.

As used herein, when specific definition is not otherwise provided, "alkyl group" refers to a C1 to C20 alkyl group, and specifically a C1 to C15 alkyl group, "cycloalkyl group" refers to a C3 to C20 cycloalkyl group, and specifically a C3 to C18 cycloalkyl group, "alkoxy group" refers to a C1 to C20 alkoxy group, and specifically a C1 to C18 alkoxy group, "aryl group" refers to a C6 to C20 aryl group, and specifically a C6 to C18 aryl group, "alkenyl group" refers to a C2 to C20 alkenyl group, and specifically a C2 to C18 alkenyl group, "alkylene group" refers to a C1 to C20 alkylene group, and specifically C1 to C18 alkylene group, and "arylene group" refers to a C6 to C20 arylene group, and specifically a C6 to C16 arylene group.

As used herein, when specific definition is not otherwise provided, "(meth)acrylate" refers to "acrylate" and "methacrylate" and "(meth)acrylic acid" refers to "acrylic acid" and "methacrylic acid."

As used herein, when specific definition is not otherwise provided, the term "combination" refers to mixing or copolymerization. In addition, "copolymerization" refers to block copolymerization or random copolymerization, and "copolymer" refers to block copolymerization or random copolymerization.

In the chemical formula of the present specification, unless a specific definition is otherwise provided, hydrogen is boned at the position when a chemical bond is not drawn where supposed to be given.

In the present specification, when specific definition is not otherwise provided, "*" indicates a point where the same or different atom or chemical formula is linked.

An embodiment provides a core-shell compound including or consisting of, e.g., a core represented by Chemical Formula 1 and a shell surrounding the core, the shell being represented by Chemical Formula 2.

[Chemical Formula 1]

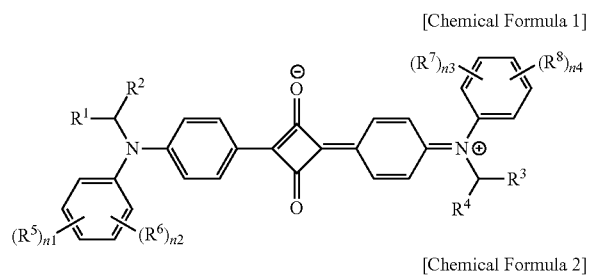

[Chemical Formula 2]

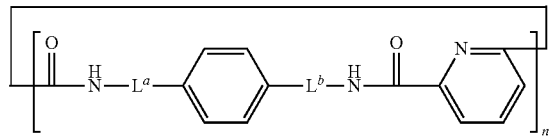

In Chemical Formula 1 and Chemical Formula 2, $R^1$ to $R^8$ may each independently be or include, e.g., a hydrogen atom, a substituted or unsubstituted C1 to C20 alkyl group, or a substituted or unsubstituted C1 to C20 alkoxy group. In an implementation, all of $R^1$ to $R^8$ may not simultaneously be a hydrogen atom.

In an implementation, $R^1$ and $R^2$ may be separate or fused to each other to form a ring, or $R^3$ and $R^4$ may be separate or fused to each other to form a ring, In an implementation, at least one of $R^1$, $R^2$, $R^5$, and $R^6$ may include or be substituted with, e.g., an epoxy group or a siloxane group (e.g., at a terminal end thereof).

In an implementation, at least one of $R^3$, $R^4$, $R^7$, and $R^8$ may include or be substituted with, e.g., an epoxy group or a siloxane group (e.g., at a terminal end thereof).

$L^a$ and $L^b$ may each independently be or include, e.g., a single bond or a substituted or unsubstituted C1 to C10 alkylene group.

n1, n2, n3, and n4 may each independently be, e.g., an integer of 0 to 5, $1 \le n1+n2 \le 3$, $1 \le n3+n4 \le 3$.

n may be, e.g., an integer of greater than or equal to 2.

In an implementation, when at least one of $R^1$, $R^2$, $R^5$, and $R^6$ is substituted with the siloxane group at the terminal end and at least one of $R^3$, $R^4$, $R^7$, and $R^8$ is substituted with the siloxane group at the terminal end, n1, n2, n3, and n4 may be each independently an integer of 0 or 1, $n1+n2 \ne 0$, and $n3+n4 \ne 0$.

A color filter formed of a pigment-type photosensitive resin composition may have a color mixing problem due to particle sizes of the pigment and a limit to film-thinning. In addition, a color imaging device for an image sensor may use a smaller dispersed particle size to form a fine pattern. In order to address these issues, a non-particle dye may be used (instead of the pigment) to prepare a photosensitive resin composition suitable for the dye.

One or more embodiments may relate to a green dye used in a color filter for a CMOS image sensor. As pixels have a smaller size, there may be a limit to manufacture a fine pattern by using a pigment, and accordingly, a dye may be used in order to compensate for this. A dye may have issues in terms of processability during the pattern manufacturing and particularly, may exhibit deteriorated chemical resistance, and it could be very difficult to form a fine pattern after the curing and thermal process. In addition, when a dye as a colorant is included in a small amount based on a total amount of the composition, the chemical resistance of the dye itself may be insufficient, but when the photosensitive resin composition for a CMOS image sensor includes the dye in a relatively high amount (e.g., about 15 wt % to about 30 wt %, or about 16 wt % to about 27 wt %, based on the total amount of the photosensitive resin composition), a dye may have excellent chemical resistance.

The embodiments may provide a core-shell compound, e.g., by introducing an epoxy group or a siloxane group under specific controls into or onto a squarylium-based compound forming a core and surround the core with a shell. The core-shell compound itself according to an embodiment may have excellent chemical resistance, and a photosensitive resin composition including a relatively large amount of such a compound as a green dye may not exhibit significant deterioration of the chemical resistance even after the curing and thermal process, and thus may be very suitable for a green color filter for the CMOS image sensor.

In an implementation, the substituent including the epoxy group or the siloxane group at the terminal end may include, e.g., an ether linking group (*—O—*).

In an implementation, at least one of $R^1$, $R^2$, $R^3$, and $R^6$ and at least one of $R^3$, $R^4$, $R^7$, and $R^8$ may independently be, e.g., represented by Chemical Formula 3-1 or Chemical Formula 3-2.

[Chemical Formula 3-1]

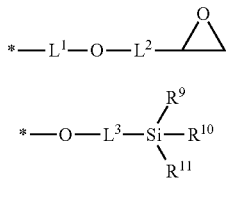

[Chemical Formula 3-2]

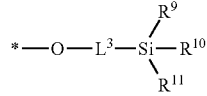

In Chemical Formula 3-1 and Chemical Formula 3-2, $L^1$ and $L^2$ may each independently be or include, e.g., a single bond or a substituted or unsubstituted C1 to C20 alkylene group.

$L^3$ may be or may include, e.g., a substituted or unsubstituted C1 to C20 alkylene group.

$R^9$ to $R^{11}$ may each independently be or include, e.g., a substituted or unsubstituted C1 to C20 alkyl group or a substituted or unsubstituted C1 to C20 alkoxy group.

In an implementation, in Chemical Formula 1, $R^5$ and $R^6$ may be different from each other, and simultaneously, $R^7$ and $R^8$ may be different from each other.

In an implementation, any one of $R^1$, $R^2$, $R^5$, and $R^6$ and any one $R^3$, $R^4$, $R^7$, and $R^8$ may independently include an epoxy group or a siloxane group at the terminal end.

In an implementation, the core represented by Chemical Formula 1 may include two epoxy groups or siloxane groups thereon. In an implementation, the core represented by Chemical Formula 1 may be represented by, e.g., Chemical Formula 1-1A, Chemical Formula 1-1B, Chemical Formula 1-2A, or Chemical Formula 1-2B.

[Chemical Formula 1-1A]

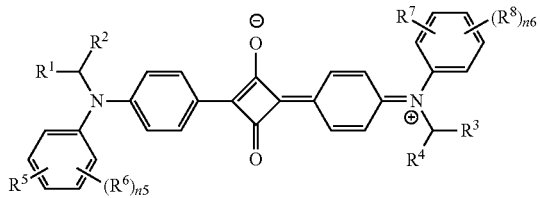

In Chemical Formula 1-1A, $R^1$ to $R^4$, $R^6$, and $R^8$ may each independently be, e.g., a hydrogen atom, a substituted or unsubstituted C1 to C20 alkyl group, or a substituted or unsubstituted C1 to C20 alkoxy group. In an implementation, all of $R^1$ to $R^4$, $R^6$, and $R^8$ may not simultaneously be a hydrogen atom.

In an implementation, none of $R^1$ to $R^4$, $R^6$, and $R^8$ may include an epoxy group.

$R^5$ and $R^7$ may each independently be, e.g., a C1 to C20 alkyl group including an epoxy group at the terminal end or a C1 to C20 alkoxy group including an epoxy group at the terminal end.

n5 and n6 may each independently be, e.g., an integer of 0 to 2.

[Chemical Formula 1-1B]

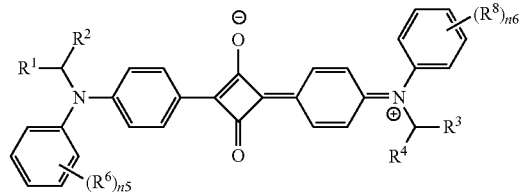

In Chemical Formula 1-1B, $R^1$ to $R^4$, $R^6$ and $R^8$ may each independently be, e.g., a hydrogen atom, a substituted or unsubstituted C1 to C20 alkyl group, or a substituted or unsubstituted C1 to C20 alkoxy group. In an implementation, all of $R^1$ to $R^4$, $R^6$, and $R^8$ may not simultaneously be a hydrogen atom.

In an implementation, $R^1$ and $R^2$ may be fused to each other to form a ring, or $R^3$ and $R^4$ may be fused to each other to form a ring.

In an implementation, none of $R^1$ to $R^4$, $R^6$, and $R^8$ may include a siloxane group.

$R^5$ and $R^7$ may each independently be, e.g., a C1 to C20 alkyl group including a siloxane group at the terminal end or a C1 to C20 alkoxy group including a siloxane group at the terminal end.

n5 and n6 may each independently be, e.g., an integer of 0 to 2.

[Chemical Formula 1-2A]

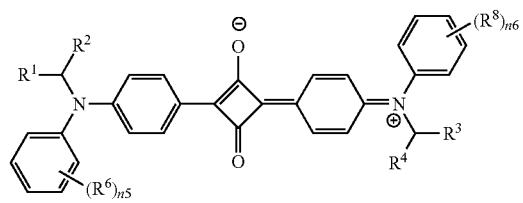

In Chemical Formula 1-2A, $R^2$, $R^4$, $R^6$, and $R^8$ may each independently be, e.g., a hydrogen atom, a substituted or unsubstituted C1 to C20 alkyl group, or a substituted or unsubstituted C1 to C20 alkoxy group. In an implementation, all of $R^2$, $R^4$, $R^6$, and $R^8$ may not simultaneously be a hydrogen atom.

In an implementation, none of $R^2$, $R^4$, $R^6$, and $R^8$ includes an epoxy group.

$R^1$ and $R^3$ may each independently be, e.g., a C1 to C20 alkyl group including an epoxy group at the terminal end or a C1 to C20 alkoxy group including an epoxy group at the terminal end.

n5 and n6 may each independently be, e.g., an integer of 0 to 2.

[Chemical Formula 1-2B]

In Chemical Formula 1-2B, $R^2$, $R^4$, $R^6$, and $R^8$ may each independently be, e.g., a hydrogen atom, a substituted or unsubstituted C1 to C20 alkyl group, or a substituted or unsubstituted C1 to C20 alkoxy group. In an implementation, all of $R^2$, $R^4$, $R^6$, and $R^8$ are not simultaneously a hydrogen atom.

In an implementation, none of $R^2$, $R^4$, $R^6$, and $R^8$ includes a siloxane group, $R^1$ and $R^3$ may each independently be, e.g., a C1 to C20 alkyl group including a siloxane group at the terminal end or a C1 to C20 alkoxy group including a siloxane group at the terminal end.

n5 and n6 may each independently be, e.g., an integer of 0 to 2.

In an implementation, any two of $R^1$, $R^2$, $R^5$, and $R^6$ and any two of the $R^3$, $R^4$, $R^7$, and $R^8$ may independently include an epoxy group or a siloxane group at the terminal end. In an implementation, the core represented by Chemical Formula 1 may include four epoxy groups or siloxane groups thereon. In an implementation, the core represented by Chemical Formula 1 may be represented by, e.g., Chemical Formula 1-3A or Chemical Formula 1-3B.

[Chemical Formula 1-3A]

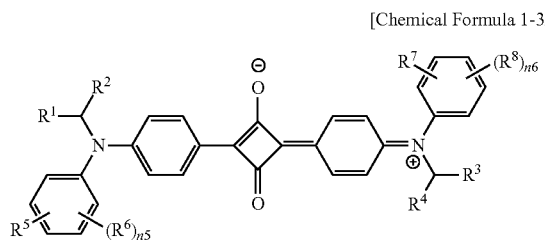

In Chemical Formula 1-3A, $R^2$, $R^4$, $R^6$, and $R^8$ may each independently be, e.g., a hydrogen atom, a substituted or unsubstituted C1 to C20 alkyl group, or a substituted or unsubstituted C1 to C20 alkoxy group. In an implementation, all of $R^2$, $R^4$, $R^6$, and $R^8$ are not simultaneously a hydrogen atom.

In an implementation, none of $R^2$, $R^4$, $R^6$, and $R^8$ includes an epoxy group.

$R^1$, $R^3$, $R^5$, and $R^7$ may each independently be, e.g., a C1 to C20 alkyl group including an epoxy group at the terminal end or a C1 to C20 alkoxy group including an epoxy group at the terminal end.

n5 and n6 may each independently be, e.g., an integer of 0 to 2.

[Chemical Formula 1-3B]

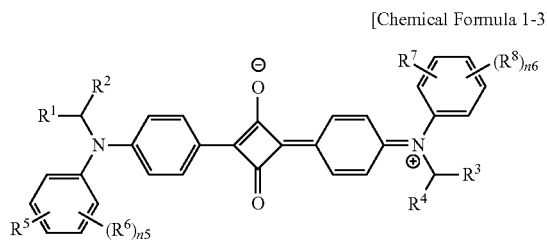

In Chemical Formula 1-3B, $R^2$, $R^4$, $R^6$, and $R^8$ may each independently be, e.g., a hydrogen atom, a substituted or unsubstituted C1 to C20 alkyl group, or a substituted or unsubstituted C1 to C20 alkoxy group. In an implementation, all of $R^2$, $R^4$, $R^6$, and $R^8$ are not simultaneously a hydrogen atom.

In an implementation, none of $R^2$, $R^4$, $R^6$, and $R^8$ includes a siloxane group.

$R^1$, $R^3$, $R^5$, and $R^7$ may each independently be, e.g., a C1 to C20 alkyl group including a siloxane group at the terminal end or a C1 to C20 alkoxy group including a siloxane group at the terminal end.

n5 and n6 may each independently be, e.g., an integer of 0 to 2.

In an implementation, any three of $R^1$, $R^2$, $R^5$, and $R^6$ and any three of $R^3$, $R^4$, $R^7$, and $R^8$ may independently include an epoxy group or a siloxane group at the terminal end. In an implementation, the core represented by Chemical Formula 1 may include six epoxy groups or siloxane groups thereon. In an implementation, the core represented by Chemical Formula 1 may be represented by, e.g., Chemical Formula 1-4A or Chemical Formula 1-4B.

[Chemical Formula 1-4A]

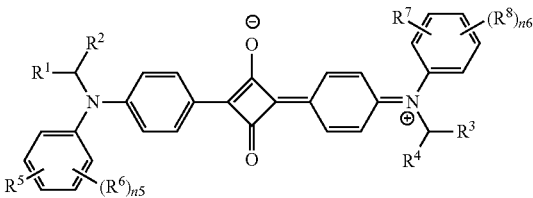

In Chemical Formula 1-4A, $R^6$ and $R^8$ may each independently be, e.g., a hydrogen atom, a substituted or unsubstituted C1 to C20 alkyl group or a substituted or unsubstituted C1 to C20 alkoxy group.

In an implementation, none of $R^6$ and $R^8$ includes an epoxy group.

$R^1$ to $R^5$ and $R^7$ may each independently be, e.g., a C1 to C20 alkyl group including an epoxy group at the terminal end or a C1 to C20 alkoxy group including an epoxy group at the terminal end.

n5 and n6 may each independently be, e.g., an integer of 0 to 2.

[Chemical Formula 1-4B]

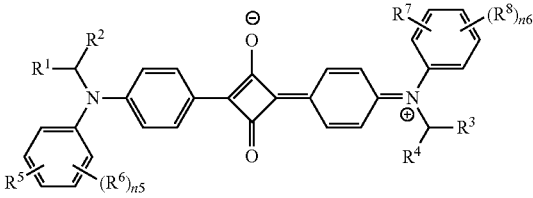

In Chemical Formula 1-4B, $R^6$ and $R^8$ may each independently be, e.g., a hydrogen atom, a substituted or unsubstituted C1 to C20 alkyl group or a substituted or unsubstituted C1 to C20 alkoxy group.

In an implementation, none of $R^6$ and $R^8$ includes a siloxane group.

$R^1$ to $R^5$ and $R^7$ may each independently be, e.g., a C1 to C20 alkyl group including a siloxane group at the terminal end or a C1 to C20 alkoxy group including a siloxane group at the terminal end.

n5 and n6 may each independently be, e.g., an integer of 0 to 2.

In an implementation, the core represented by Chemical Formula 1 may include, e.g., 2, 4, or 6 epoxy groups or siloxane groups thereon. A core represented by Chemical Formula 1, but having one, three, or five epoxy groups or siloxane groups, may be difficult to synthesize due to its structure (low yield), and even if the actual synthesis were to be successful, it could be costly and may not be economical when applied to an actual line.

In an implementation, the core represented by Chemical Formula 1 may be superior in chemical resistance when the number of epoxy groups is 2 compared with when the number of epoxy groups is 4, and may be superior in chemical resistance when the number of the epoxy groups is 4 compared with when the number of epoxy groups is 6. In an implementation, if only the chemical resistance of the compound were considered, the number of epoxy groups in the core structure represented by Chemical Formula 1 may be 4 rather than 6, and 2 rather than 4.

In an implementation, the core represented by Chemical Formula 1 may be superior in chemical resistance when the number of siloxane groups is 6 compared with when the number of siloxane groups is 4, and may be superior in chemical resistance when the number of siloxane groups is 4 compared with when the number of siloxane groups is 2. In an implementation, if only the chemical resistance of the compound is considered, the number of siloxane groups in the core structure represented by Chemical Formula 1 may be 4 rather than 2, and 6 rather than 4.

In an implementation, the core represented by Chemical Formula 1 may be superior in terms of solubility of the compound, when the number of siloxane groups is 2, compared with when the number of siloxane groups is 4, and may be superior in terms of solubility of the compound when the number of siloxane groups is 4 compared with when the number of siloxane groups is 6. In an implementation, if only the solubility of the compound were considered, the number of siloxane groups in the core structure represented by Chemical Formula 1 may be 4 rather than 6, and 2 rather than 4.

In an implementation, in the core represented by Chemical Formula 1, if the number of the epoxy groups or siloxane groups were one, it could be difficult to synthesize as described above, and the chemical resistance may be rather poor compared with when the number of the epoxy groups or siloxane groups is two. In an implementation, the core represented by Chemical Formula 1 may include two or more epoxy groups or siloxane groups.

In an implementation, the core represented by Chemical Formula 1 including a siloxane group at the terminal end may have four siloxane groups in consideration of both chemical resistance and solubility of the compound.

In an implementation, the core represented by Chemical Formula 1 may have a maximum absorption wavelength in the range of, e.g., about 610 nm to about 640 nm. Even if a dye compound were to have excellent solubility in organic solvents of about 10% or more, the transmittance may be low, so it may be unsuitable for use as a green photosensitive resin composition for CMOS image sensors if it does not have the maximum absorption wavelength at about 610 nm to about 640 nm.

In an implementation, the shell represented by Chemical Formula 2 may be represented by, e.g., Chemical Formula 2-1.

[Chemical Formula 2-1]

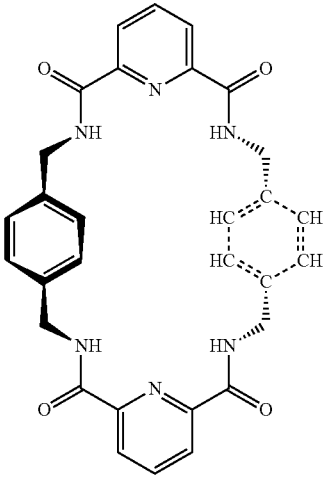

In an implementation, the core-shell compound may be represented by, e.g., one of Chemical Formula A1 to Chemical Formula K1 and Chemical Formula A2 to Chemical Formula K2.

[Chemical Formula A1]

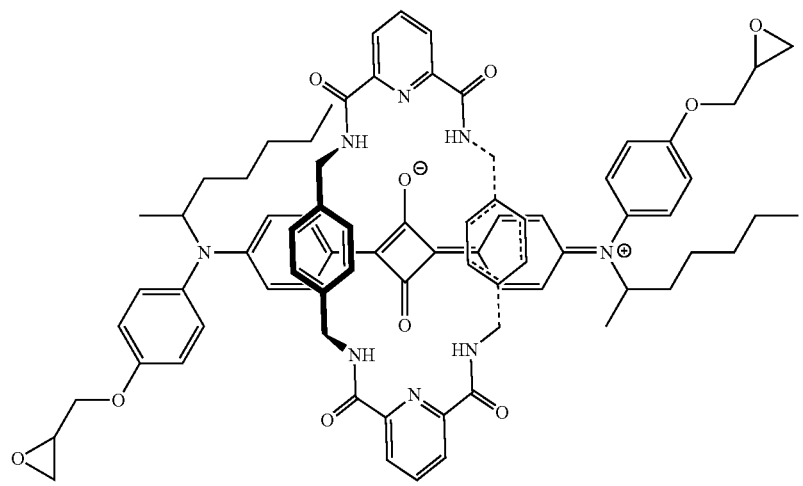

[Chemical Formula B1]
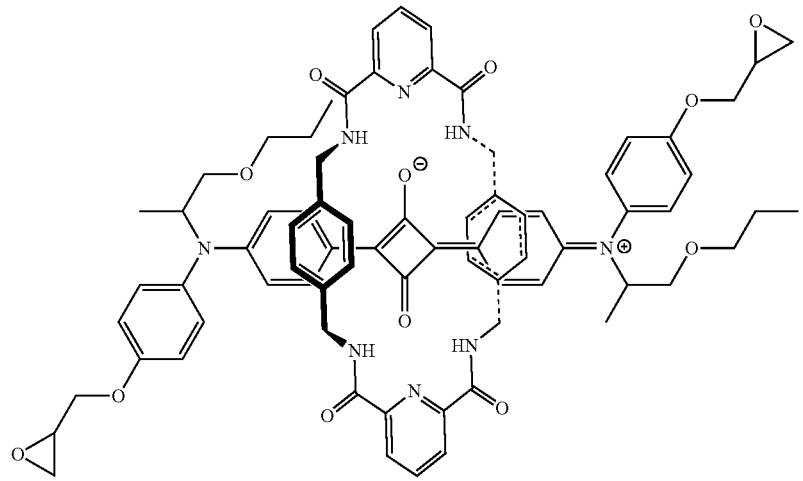
[Chemical Formula C1]
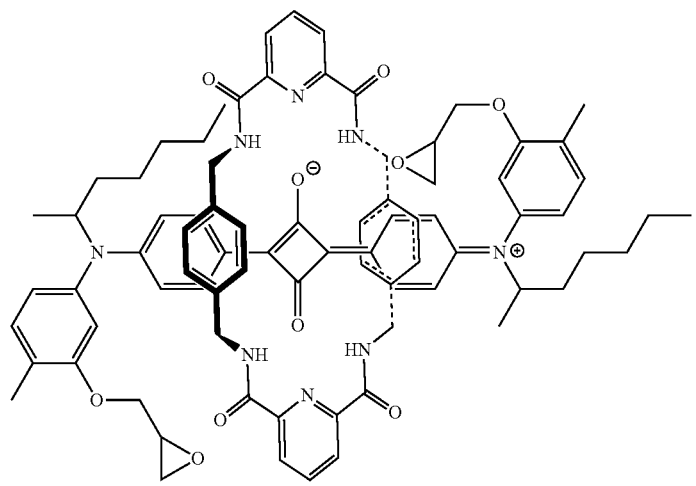
[Chemical Formula D1]
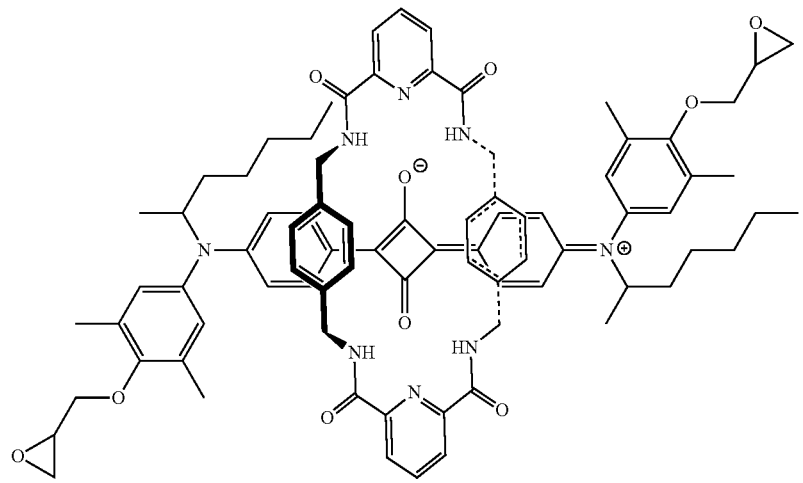

-continued
[Chemical Formula E1]
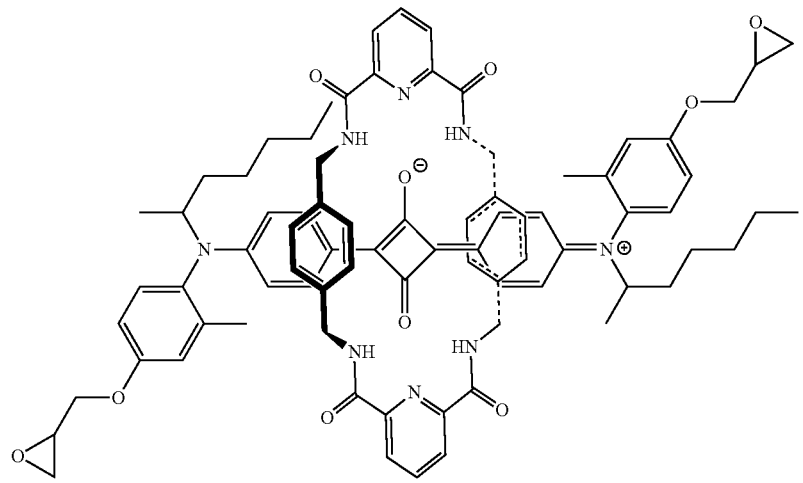
[Chemical Formula F1]
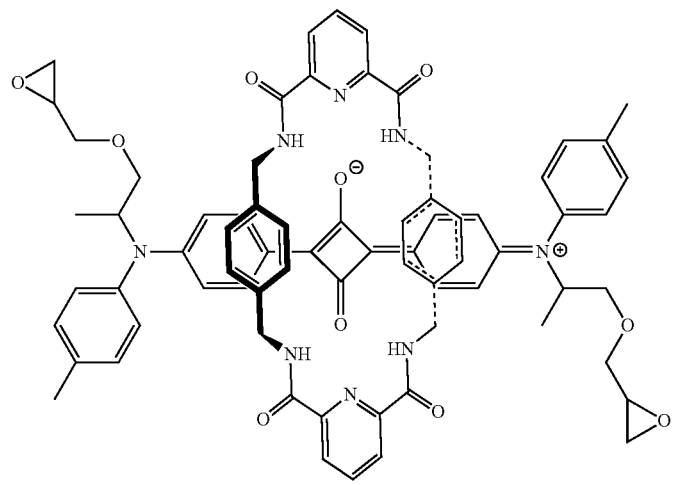
[Chemical Formula G1]
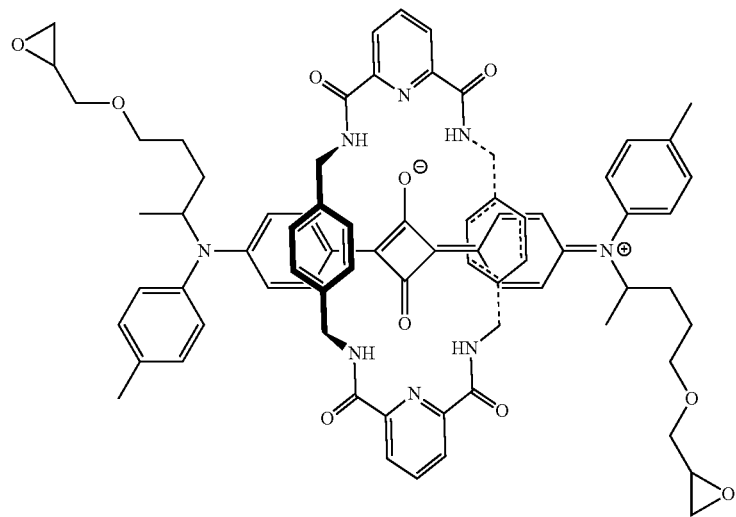

[Chemical Formula H1]
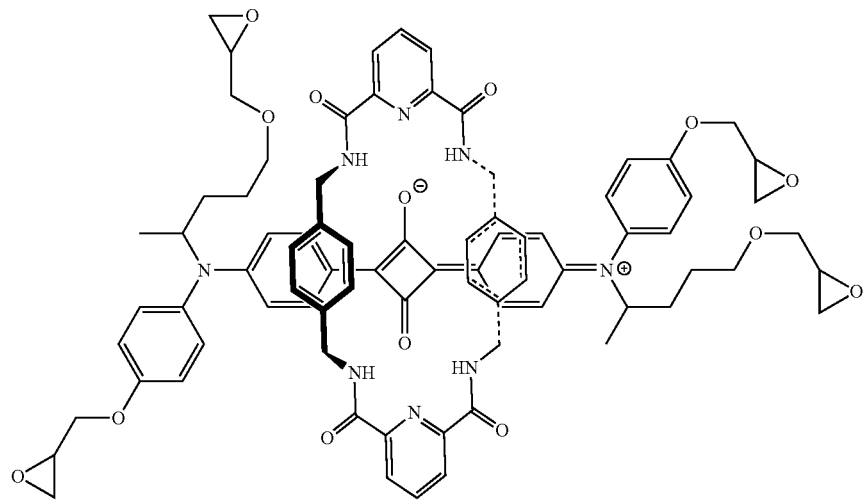
[Chemical Formula I1]
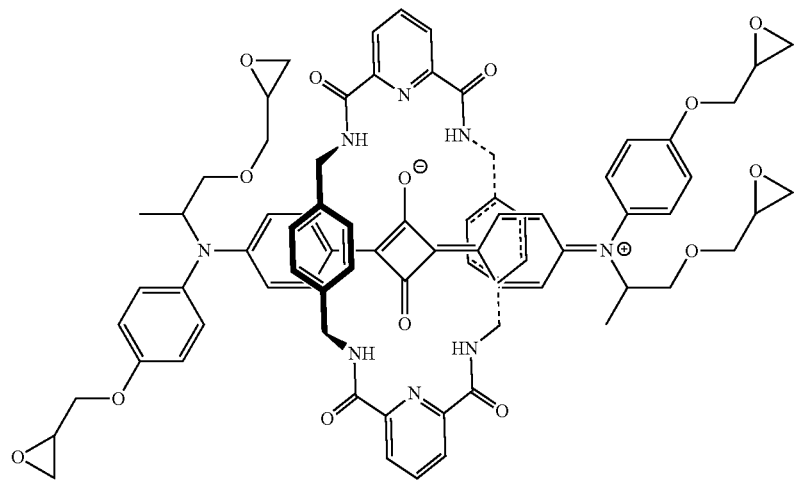
[Chemical Formula J1]
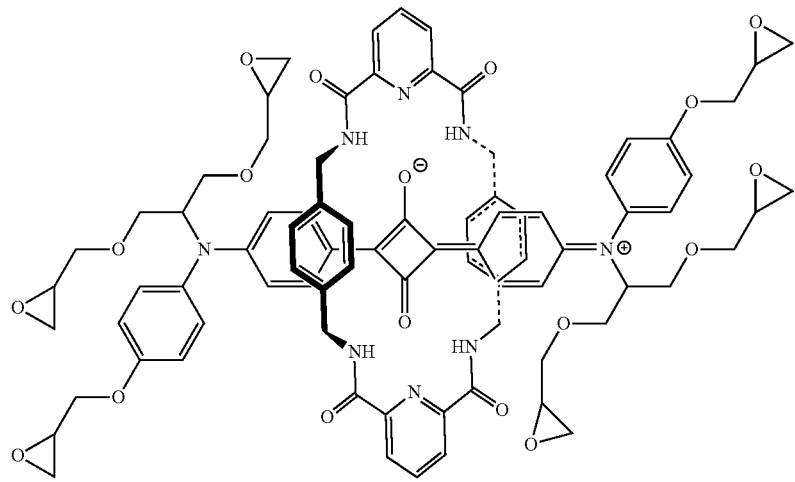

[Chemical Formula K1]
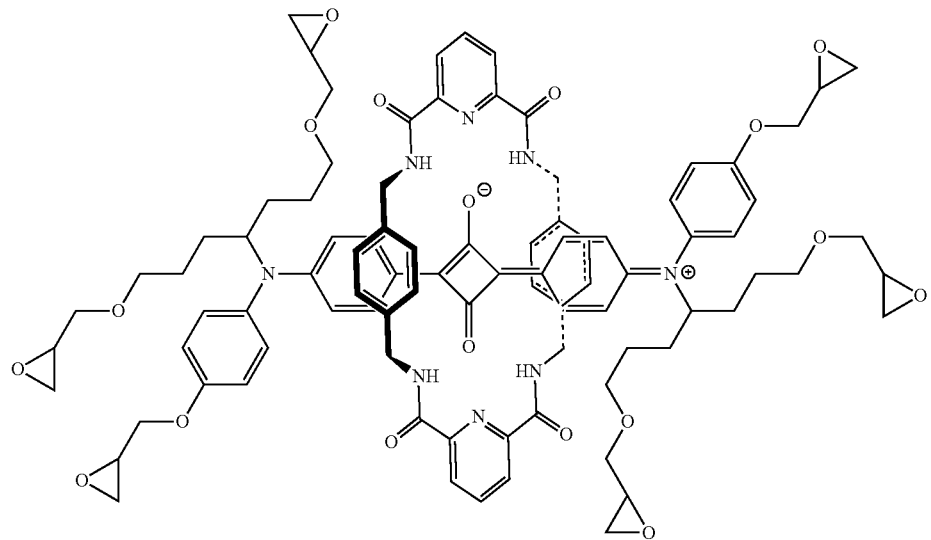
[Chemical Formula A2]
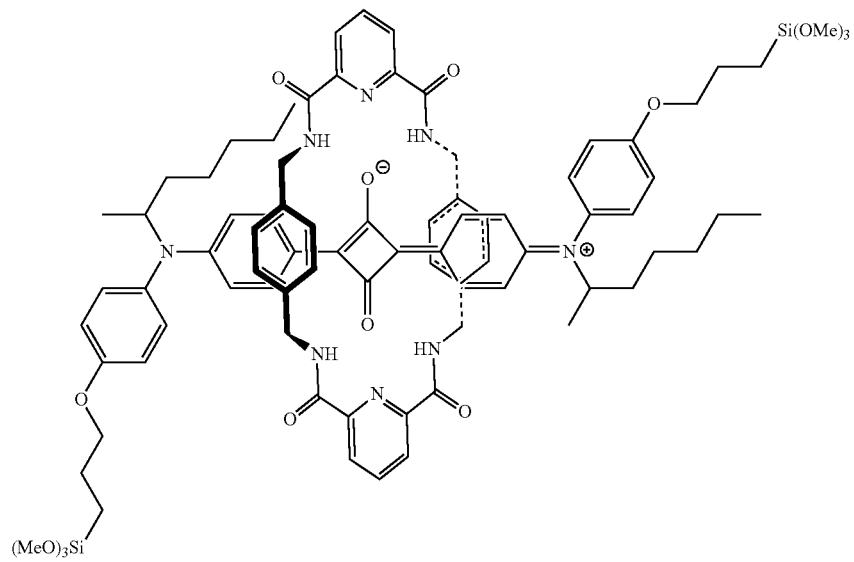
[Chemical Formula B2]                                    [Chemical Formula C2]
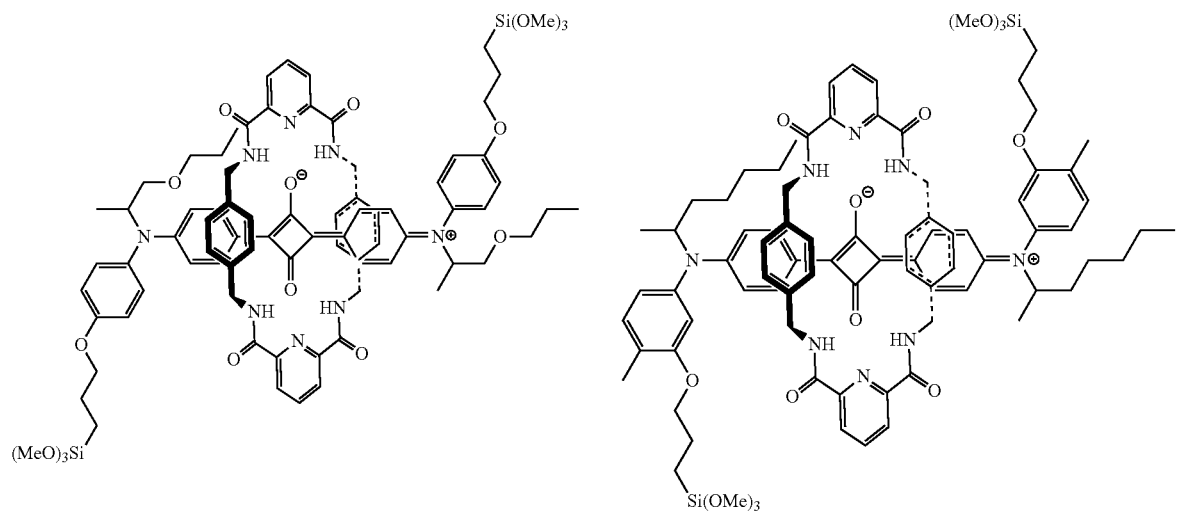

[Chemical Formula D2]
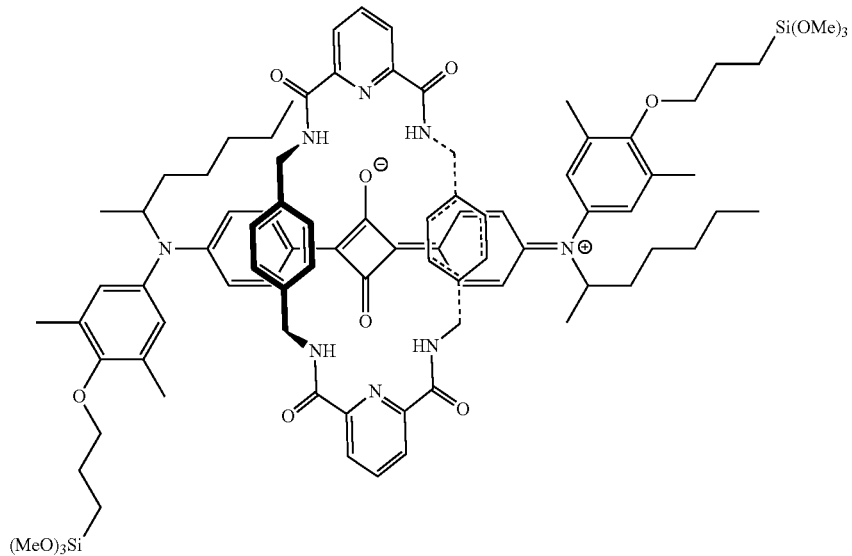
[Chemical Formula E2]
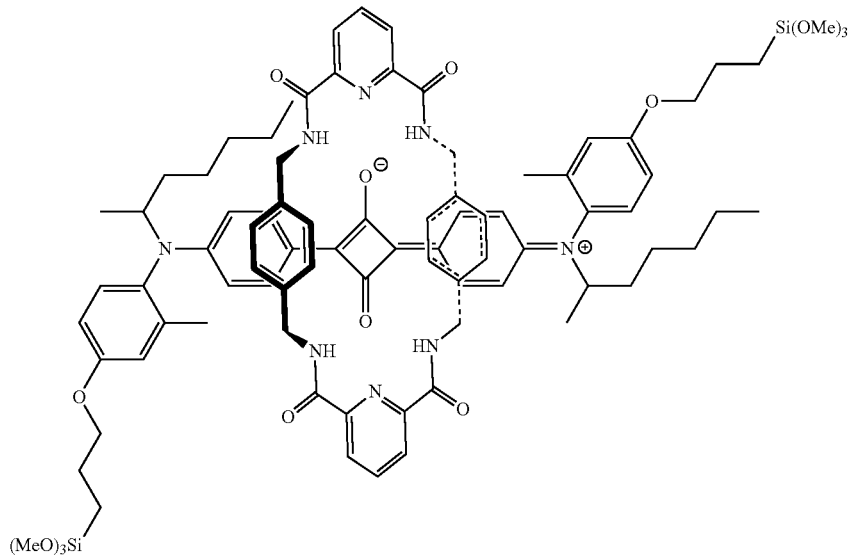
[Chemical Formula F2]
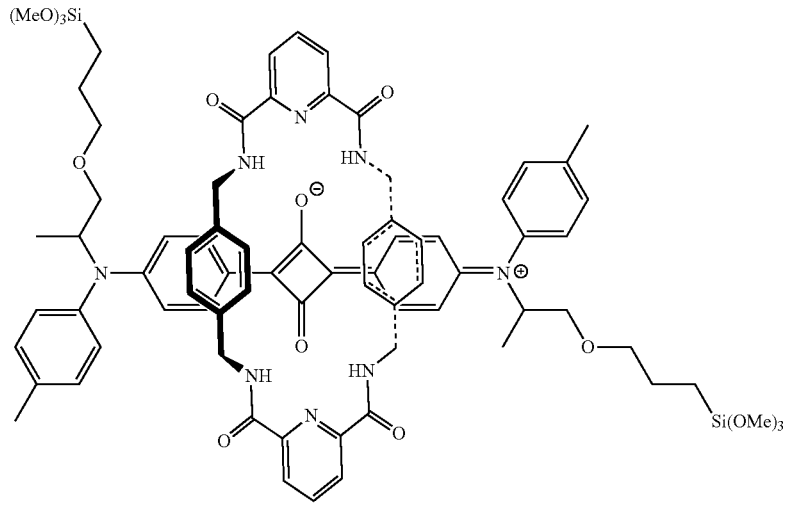

[Chemical Formula G2]
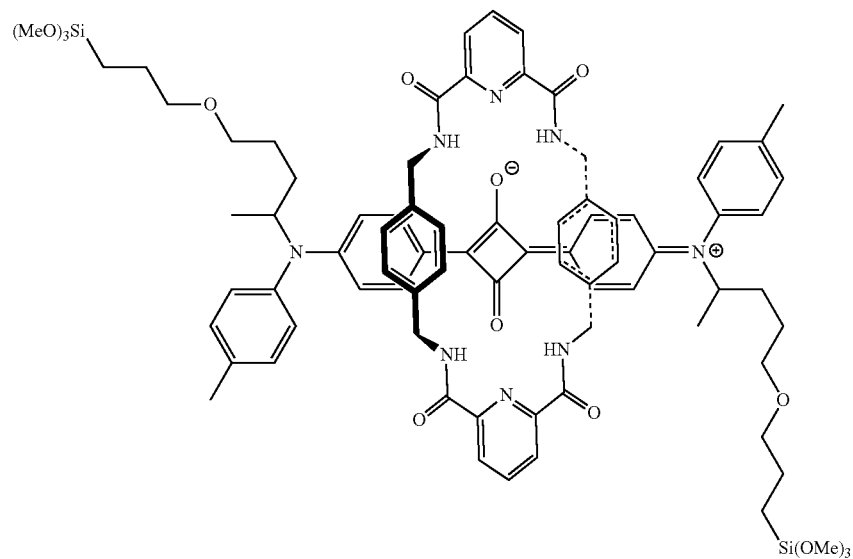
[Chemical Formula H2]
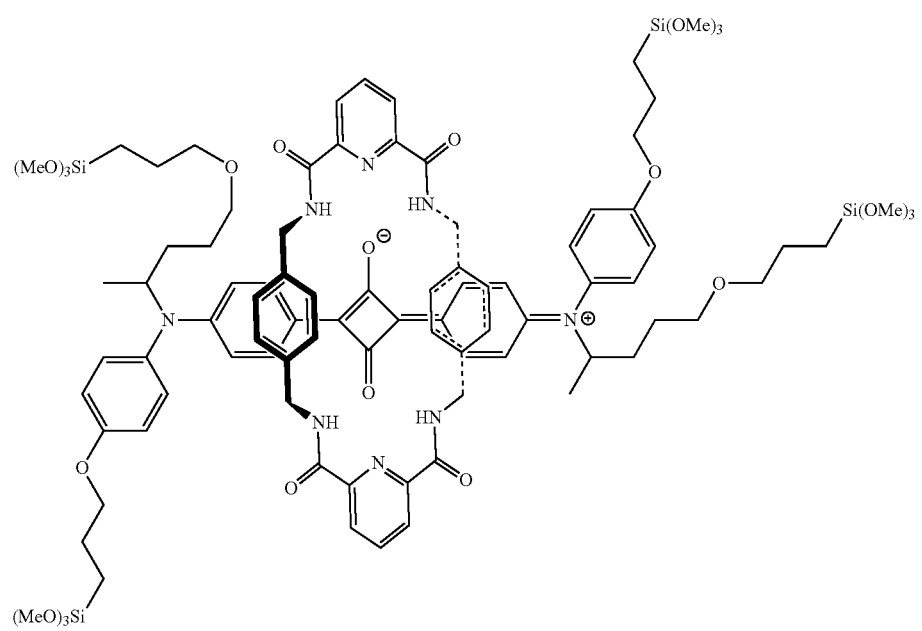

-continued
[Chemical Formula I2]
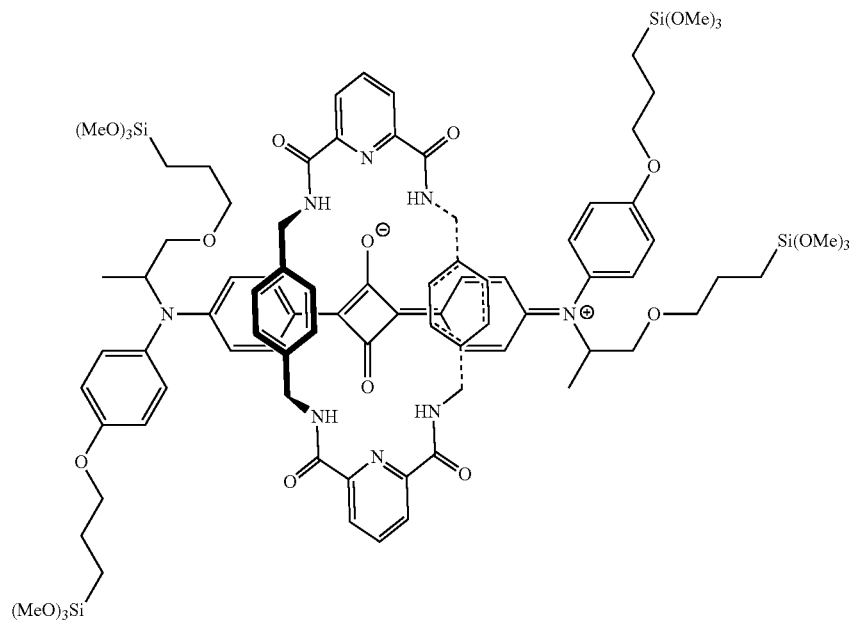
[Chemical Formula J2]
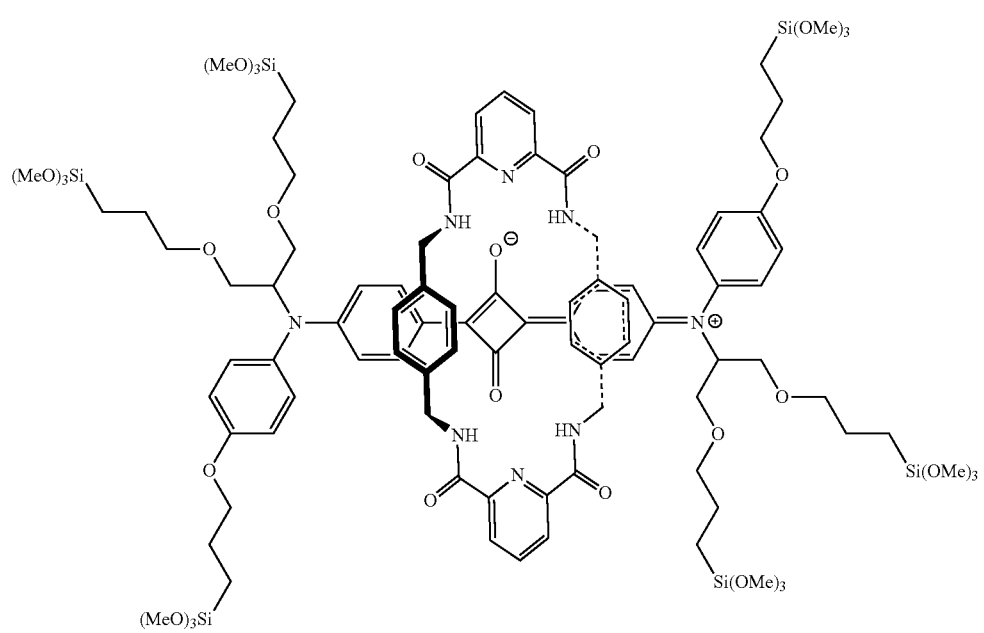

[Chemical Formula K2]

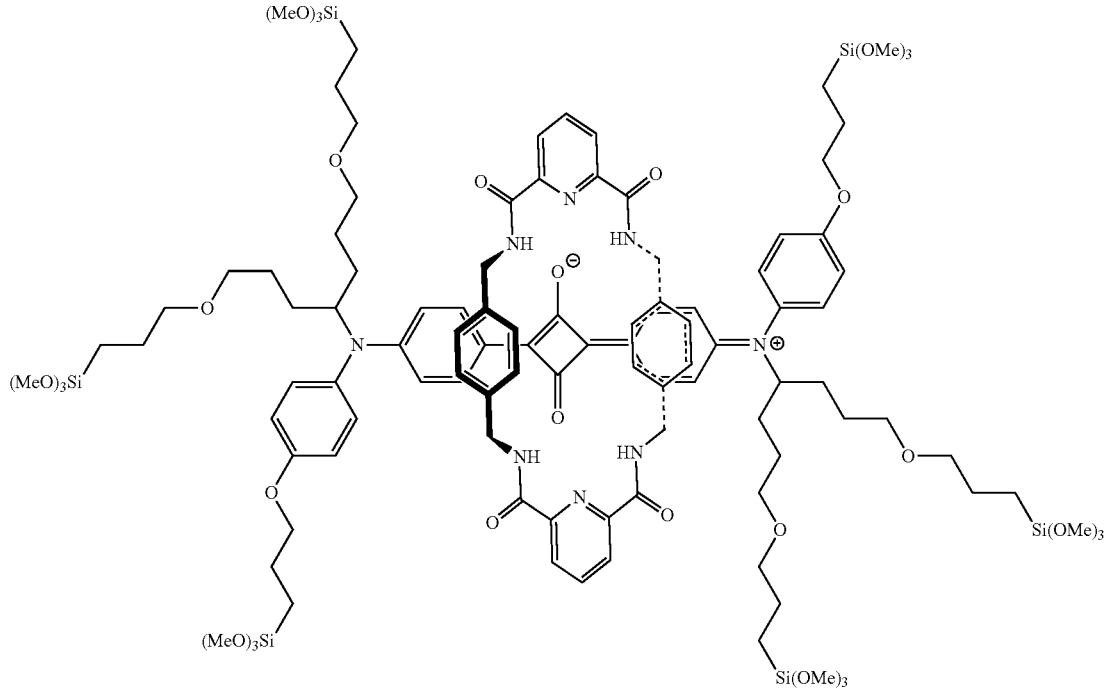

In an implementation, the core-shell compound may be a green dye.

According to another embodiment, a photosensitive resin composition including the core-shell compound according to the embodiment may be provided.

In an implementation, the photosensitive resin composition may have, e.g., a transmittance of 90% or more at 540 nm, a transmittance of 10% or less at 600 nm to 640 nm, and a transmittance of 5% or less at 450 nm and thus, may be suitable for realizing a green color filter for high transmission type CIS. In an implementation, the photosensitive resin composition may be used for a high transmission type CMOS image sensor.

The photosensitive resin composition may include, e.g., the core-shell compound, a binder resin, a photopolymerizable monomer, a photopolymerization initiator, and a solvent.

The core-shell compound according to an embodiment may be included in an amount of, e.g., about 15 wt % to about 30 wt %, or about 16 wt % to about 27 wt %, based on the total weight of the photosensitive resin composition. When the core-shell compound according to an embodiment is included in the above range, color reproducibility and contrast ratio are improved, and application to a CMOS image sensor may be enabled.

The photosensitive resin composition may further include a pigment, e.g., a yellow pigment, a green pigment, or a combination thereof.

The yellow pigment may include, e.g., C.I. pigment yellow 138, C.I. pigment yellow 139, C.I. pigment yellow 150, or the like, in a color index, and these may be used alone or as a mixture of two or more.

The green pigment may include, e.g., C.I. pigment green 36, C.I. pigment green 58, C.I. pigment green 59, or the like, in a color index, and these may be used alone or as a mixture of two or more.

The pigment may be included in the photosensitive resin composition in the form of pigment dispersion.

The pigment dispersion may include a solid pigment, a solvent, and a dispersing agent for uniformly dispersing the pigment in the solvent.

The solid pigment may be included in an amount of, e.g., about 1 wt % to about 20 wt %, about 8 wt % to about 20 wt %, about 8 wt % to about 15 wt %, about 10 wt % to about 20 wt %, or about 10 wt % to about 15 wt %, based on the total weight of pigment dispersion.

The dispersing agent may include, e.g., a non-ionic dispersing agent, an anionic dispersing agent, a cationic dispersing agent, or the like. Examples of the dispersing agent may include polyalkylene glycol and esters thereof, polyoxyalkylene, a polyhydric alcohol ester alkylene oxide addition product, an alcohol alkylene oxide addition product, sulfonate ester, a sulfonate salt, a carboxylate ester, a carboxylate salt, an alkylamide alkylene oxide addition product, alkyl amine, and the like, and these may be used alone or as a mixture of two or more.

Commercially available examples of the dispersing agent may include DISPERBYK-101, DISPERBYK-130, DISPERBYK-140, DISPERBYK-160, DISPERBYK-161, DISPERBYK-162, DISPERBYK-163, DISPERBYK-164, DISPERBYK-165, DISPERBYK-166, DISPERBYK-170, DISPERBYK-171, DISPERBYK-182, DISPERBYK-2000, DISPERBYK-2001, and the like made by BYK Co., Ltd.; EFKA-47, EFKA-47EA, EFKA-48, EFKA-49, EFKA-100, EFKA-400, EFKA-450, and the like made by EFKA Chemicals Co.; Solsperse 5000, Solsperse 12000, Solsperse 13240, Solsperse 13940, Solsperse 17000, Solsperse 20000, Solsperse24000GR, Solsperse 27000, Solsperse 28000, and the like made by Zeneka Co.; or PB711, PB821, and the like made by Ajinomoto Inc.

The dispersing agent may be included in an amount of, e.g., about 1 wt % to about 20 wt % based on the total amount of the pigment dispersion. When the dispersing agent is included within the range, dispersion of a photosensitive resin composition is improved due to an appropriate viscosity, and thus optical, physical, and chemical quality may be maintained when the photosensitive resin composition is applied to products.

A solvent for forming the pigment dispersion may include, e.g., ethylene glycol acetate, ethylcellosolve, propylene glycol methyletheracetate, ethyllactate, polyethylene glycol, cyclohexanone, propylene glycol methylether, or the like.

The pigment dispersion may be included in an amount of, e.g., about 10 wt % to about 20 wt %, or about 12 wt % to about 18 wt %, based on the total weight of the photosensitive resin composition. When the pigment dispersion is included within the above range, it is advantageous to secure a process margin, and may have improved color reproducibility and contrast ratio.

The binder resin may be an acryl-based binder resin.

The acryl-based binder resin may include, e.g., a copolymer of a first ethylenic unsaturated monomer and a second ethylenic unsaturated monomer that is copolymerizable therewith, and may be a resin including at least one acryl-based repeating unit.

The first ethylenic unsaturated monomer may include, e.g., an ethylenic unsaturated monomer including at least one carboxyl group and examples of the monomer may include acrylic acid, methacrylic acid, maleic acid, itaconic acid, fumaric acid, and a combination thereof.

The first ethylenic unsaturated monomer may be included in an amount of, e.g., about 5 wt % to about 50 wt %, or about 10 wt % to about 40 wt % based on the total weight of the acryl-based binder resin.

The second ethylenic unsaturated monomer may include, e.g., an aromatic vinyl compound such as styrene, α-methylstyrene, vinyl toluene, vinylbenzylmethylether and the like; an unsaturated carboxylate ester compound such as methyl(meth)acrylate, ethyl(meth)acrylate, butyl(meth)acrylate, 2-hydroxyethyl(meth)acrylate, 2-hydroxy butyl (meth)acrylate, benzyl(meth)acrylate, cyclohexyl(meth)acrylate, phenyl(meth)acrylate, and the like; an unsaturated amino alkyl carboxylate ester compound such as 2-aminoethyl(meth)acrylate, 2-dimethylaminoethyl(meth)acrylate, and the like; a carboxylic acid vinyl ester compound such as vinyl acetate, vinyl benzoate, and the like; an unsaturated glycidyl carboxylate ester compound such as glycidyl(meth)acrylate, and the like; a vinyl cyanide compound such as (meth)acrylonitrile and the like; an unsaturated amide compound such as (meth)acrylamide, or the like, and may be used alone or as a mixture of two or more.

Examples of the acryl-based binder resin may include a (meth)acrylic acid/benzylmethacrylate copolymer, a (meth)acrylic acid/benzylmethacrylate copolymer, a (meth)acrylic acid/benzylmethacrylate/styrene copolymer, a (meth)acrylic acid/benzylmethacrylate/2-hydroxyethylmethacrylate copolymer, a (meth)acrylic acid/benzylmethacrylate/styrene/2-hydroxyethylmethacrylate copolymer, and the like, and these may be used alone or as a mixture of two or more.

A weight average molecular weight of the binder resin may be, e.g., about 3,000 g/mol to about 150,000 g/mol, about 5,000 g/mol to about 50,000 g/mol, or about 20,000 g/mol to about 30,000 g/mol. When the binder resin has a weight average molecular weight within the range, the photosensitive resin composition has good physical and chemical properties, appropriate viscosity, and close-contacting properties with a substrate during manufacture of a color filter. The weight average molecular weight of the binder resin can be measured by gel permeation chromatography (GPC).

An acid value of the binder resin may be, e.g., about 15 mgKOH/g to about 60 mgKOH/g, or about 20 mgKOH/g to about 50 mgKOH/g. When the acid value of the binder resin is within the range, resolution of pixel patterns is improved.

The binder resin may be included in an amount of, e.g., about 1 wt % to about 30 wt %, or about 1 wt % to about 20 wt % based on the total weight of the photosensitive resin composition. When the binder resin is included within the range, the composition may have an excellent developability and improved crosslinking, and thus has excellent surface flatness when manufactured into a color filter.

The photopolymerizable monomer may include, e.g., mono-functional or multi-functional ester of (meth)acrylic acid including at least one ethylenic unsaturated double bond.

The photopolymerizable monomer may have the ethylenic unsaturated double bond and thus, may cause sufficient polymerization during exposure in a pattern-forming process and form a pattern having excellent heat resistance, light resistance, and chemical resistance.

Examples of the photopolymerizable monomer may include ethylene glycol di(meth)acrylate, diethylene glycol di(meth)acrylate, triethylene glycol di(meth)acrylate, propylene glycol di(meth)acrylate, neopentyl glycol di(meth)acrylate, 1,4-butanediol di(meth)acrylate, 1,6-hexanediol di(meth)acrylate, bisphenol A di(meth)acrylate, pentaerythritol di(meth)acrylate, pentaerythritol tri(meth)acrylate, pentaerythritol tetra(meth)acrylate, pentaerythritol hexa(meth)acrylate, dipentaerythritol di(meth)acrylate, dipentaerythritol tri(meth)acrylate, dipentaerythritol penta (meth)acrylate, dipentaerythritol hexa(meth)acrylate, bisphenol A epoxy(meth)acrylate, ethylene glycol monomethylether (meth)acrylate, trimethylol propane tri(meth)acrylate, tris(meth)acryloyloxyethyl phosphate, novolac epoxy (meth)acrylate, and the like.

Commercially available examples of the photopolymerizable monomer are as follows. The mono-functional (meth) acrylic acid ester may include, e.g., Aronix M-101®, M-111®, M-114® (Toagosei Chemistry Industry Co., Ltd.); KAYARAD TC-110S®, TC-120S® (Nippon Kayaku Co., Ltd.); V-158®, V-2311® (Osaka Organic Chemical Ind., Ltd.), or the like. Examples of a difunctional (meth)acrylic acid ester may include Aronix M-210®, M-240®, M-6200® (Toagosei Chemistry Industry Co., Ltd.), KAYARAD HDDA®, HX-220®, R-604® (Nippon Kayaku Co., Ltd.), V-260®, V-312®, V-335 HP® (Osaka Organic Chemical Ind., Ltd.), and the like. Examples of a tri-functional (meth) acrylic acid ester may include Aronix M-309®, M-400®, M-405®, M-450®, M-710®, M-8030®, M-8060®, and the like of Toagosei Chemistry Industry Co., Ltd.; KAYARAD TMPTA®, DPCA-20®, DPCA-30®, DPCA-60®, DPCA-120® of Nippon Kayaku Co., Ltd., V-295®, V-300®, V-360®, V-GPT®, V-3PA®, V400® of Osaka Yuki Kayaku Kogyo Co. Ltd., and the like. These may be used alone or as a mixture of two or more.

The photopolymerizable monomer may be treated with acid anhydride to improve developability.

The photopolymerizable monomer may be included in an amount of, e.g., about 1 wt % to about 15 wt %, or about 5 wt % to about 10 wt % based on the total weight of the photosensitive resin composition. When the photopolymerizable monomer is included within the ranges, the photopolymerizable monomer may be sufficiently cured during exposure in a pattern-forming process and has excellent reliability, and developability for alkali developing solution may be improved.

The photopolymerization initiator may be a suitable initiator for a photosensitive resin composition, e.g., an acetophenone-based compound, a benzophenone-based compound, a thioxanthone-based compound, a benzoin-based compound, a triazine-based compound, an oxime-based compound, or a combination thereof.

Examples of the acetophenone-based compound may include 2,2'-diethoxy acetophenone, 2,2'-dibutoxy acetophenone, 2-hydroxy-2-methylpropiophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like.

Examples of the benzophenone-based compound may include benzophenone, benzoyl benzoate, benzoyl methyl benzoate, 4-phenyl benzophenone, hydroxy benzophenone, acrylated benzophenone, 4,4'-bis(dimethylamino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like.

Examples of the thioxanthone-based compound may include thioxanthone, 2-methylthioxanthone, isopropyl thioxanthone, 2,4-diethyl thioxanthone, 2,4-diisopropyl thioxanthone, 2-chlorothioxanthone, and the like.

Examples of the benzoin-based compound may include benzoin, benzoin methyl ether, benzoin ethyl ether, benzoin isopropyl ether, benzoin isobutyl ether, benzyldimethylketal, and the like.

Examples of the triazine-based compound may include 2,4,6-trichloro-s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl 4,6-bis(trichloromethyl)-s-triazine, bis(trichloromethyl)-6-styryl-s-triazine, 2-(naphthol-yl)-4,6-bis(trichloromethyl)-s-triazine, 2-(4-methoxynaphthol-yl)-4,6-bis(trichloromethyl)-s-triazine, 2-4-bis(trichloromethyl)-6-piperonyl-s-triazine, 2-4-bis(trichloromethyl)-6-(4-methoxystyryl)-s-triazine, and the like.

Examples of the oxime-based compound may include O-acyloxime-based compound, 2-(o-benzoyloxime)-1-[4-(phenylthio)phenyl]-1,2-octandione, 1-(o-acetyloxime)-1-[9-ethyl-6-(2-methylbenzoyl)-9H-carbazol-3-yl]ethanone, O-ethoxycarbonyl-α-oxyamino-1-phenylpropan-1-one and the like. Specific examples of the O-acyloxime-based compound may be 1,2-octandione, 2-dimethylamino-2-(4-methylbenzyl)-1-(4-morpholin-4-yl-phenyl)-butan-1-one, 1-(4-phenylsulfanyl phenyl)-butane-1,2-dione2-oxime-O-benzoate, 1-(4-phenylsulfanyl phenyl)-octane-1,2-dione2-oxime-O-benzoate, 1-(4-phenylsulfanyl phenyl)-octan-1-oneoxime-O-acetate, and 1-(4-phenylsulfanyl phenyl)-butan-1-oneoxime-O-acetate, and the like.

The photopolymerization initiator may further include, e.g., a carbazole-based compound, a diketone-based compound, a sulfonium borate-based compound, a diazo-based compound, an imidazole-based compound, a biimidazole-based compound, a fluorene-based compound, or the like.

The photopolymerization initiator may be used with a photosensitizer capable of causing a chemical reaction by absorbing light and becoming excited and then, transferring its energy.

Examples of the photosensitizer may include tetraethylene glycol bis-3-mercapto propionate, pentaerythritol tetrakis-3-mercapto propionate, dipentaerythritol tetrakis-3-mercapto propionate, and the like.

The photopolymerization initiator may be included in an amount of, e.g., about 0.01 wt % to about 10 wt %, or about 0.1 wt % to about 5 wt % based on the total weight of the photosensitive resin composition. When the photopolymerization initiator is included within the ranges, sufficient photopolymerization may occur during exposure in a pattern-forming process, excellent reliability may be realized, heat resistance, light resistance, and chemical resistance of patterns, resolution and close-contacting properties may be improved, and decrease of transmittance due to a non-reaction initiator may be prevented.

The solvent is a material having compatibility with the core-shell compound, pigment according to an embodiment, the binder resin, the photopolymerizable monomer, and the photopolymerization initiator, but not reacting therewith.

Examples of the solvent may include alcohols such as methanol, ethanol, and the like; ethers such as dichloroethyl ether, n-butyl ether, diisoamyl ether, methylphenyl ether, tetrahydrofuran, and the like; glycol ethers such as ethylene glycol monomethylether, ethylene glycol monoethylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol monomethylether acetate, propylene glycol propylether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactic acid esters such as methyl lactate, ethyl lactate, and the like; oxy acetic acid alkyl esters such as oxy methyl acetate, oxy ethyl acetate, oxy butyl acetate, and the like; alkoxy acetic acid alkyl esters such as methoxy methyl acetate, methoxy ethyl acetate, methoxy butyl acetate, ethoxy methyl acetate, ethoxy ethyl acetate, and the like; 3-oxy propionic acid alkylesters such as 3-oxy methyl propionate, 3-oxy ethyl propionate, and the like; 3-alkoxy propionic acid alkyl esters such as 3-methoxy methyl propionate, 3-methoxy ethyl propionate, 3-ethoxy ethyl propionate, 3-ethoxy methyl propionate, and the like; 2-oxy propionic acid alkyl esters such as 2-oxy methyl propionate, 2-oxy ethyl propionate, 2-oxy propyl propionate, and the like; 2-alkoxy propionic acid alkyl esters such as 2-methoxy methyl propionate, 2-methoxy ethyl propionate, 2-ethoxy ethyl propionate, 2-ethoxy methyl propionate, and the like; 2-oxy-2-methyl propionic acid esters such as 2-oxy-2-methyl methyl propionate, 2-oxy-2-methyl ethyl propionate, and the like, monooxy monocarboxylic acid alkyl esters of 2-alkoxy-2-methyl alkyl propionates such as 2-methoxy-2-methyl methyl propionate, 2-ethoxy-2-methyl ethyl propionate, and the like; esters such as 2-hydroxy ethyl propionate, 2-hydroxy-2-methyl ethyl propionate, hydroxy ethyl acetate, 2-hydroxy-3-methyl methyl butanoate, and the like; ketonate esters such as ethyl pyruvate, and the like, and in addition, a high boiling point solvent such as N-methylformamide, N,N-dimethylformamide, N-methylformanilide, N-methylacetamide, N,N-dimethylacetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, and the like may also be used.

Considering compatibility and reactivity, glycol ethers such as ethylene glycol monoethylether, and the like; ethylene glycol alkylether acetates such as ethyl cellosolve acetate, and the like; esters such as 2-hydroxy ethyl propionate, and the like; carbitols such as diethylene glycol monomethylether, and the like; propylene glycol alkylether acetates such as propylene glycol monomethylether acetate, propylene glycol propylether acetate, and the like; or ketones such as cyclohexanone, and the like may be desirably used.

The solvent may be included in a balance amount, e.g., about 30 wt % to about 80 wt % based on the total weight of the photosensitive resin composition. When the solvent is included within the ranges, the photosensitive resin composition may have an appropriate viscosity resulting in improvement of coating characteristics of a color filter.

The photosensitive resin composition according to another embodiment may further include, e.g., an epoxy compound in order to help improve close-contacting properties with a substrate.

Examples of the epoxy compound may include a phenol novolac epoxy compound, a tetramethyl biphenyl epoxy compound, a bisphenol A epoxy compound, an alicyclic epoxy compound, or a combination thereof.

The epoxy compound may be included in an amount of, e.g., about 0.01 parts by weight to about 20 parts by weight, or about 0.1 parts by weight to about 10 parts by weight based on 100 parts by weight of the photosensitive resin composition. When the epoxy compound is included within the range, close-contacting properties, storage properties, and the like may be improved.

In an implementation, the photosensitive resin composition may further include, e.g., a silane coupling agent having a reactive substituent such as a carboxyl group, a methacryloyl group, an isocyanate group, an epoxy group, or the like, to help improve its adherence to a substrate.

Examples of the silane-based coupling agent may include trimethoxysilyl benzoic acid, γ-methacryl oxypropyl trimethoxysilane, vinyl triacetoxysilane, vinyl trimethoxysilane, γ-isocyanate propyl triethoxysilane, γ-glycidoxy propyl trimethoxysilane, β-(epoxycyclohexyl)ethyltrimethoxysilane, and the like and these may be used alone or in a mixture of two or more.

The silane-coupling agent may be included in an amount of, e.g., about 0.01 parts by weight to about 10 parts by weight based on 100 parts by weight of the photosensitive resin composition. When the silane-coupling agent is included within the range, close-contacting properties, storing properties, and the like may be improved.

In an implementation, the photosensitive resin composition may further include a surfactant in order to help improve coating properties and prevent a defect if necessary.

Examples of the surfactant may be fluorine-based surfactants that are commercially available as BM-1000®, BM-1100®, and the like of BM Chemie Inc.; F 142D®, F 172®, F 173®, F 183®, and the like of Dainippon Ink Kagaku Kogyo Co., Ltd.; FULORAD FC-135®, FC-170C®, FC-430®, FC-431®, and the like of Sumitomo 3M Co., Ltd.; SURFLON S-112®, S-113®, S-131®, S-141®, S-145®, and the like of ASAHI Glass Co., Ltd.; SH-28PA®, SH-190®, SH-193®, SZ-6032®, SF-8428®, and the like.

The surfactant may be included in an amount of, e.g., about 0.001 parts by weight to about 5 parts by weight based on 100 parts by weight of the photosensitive resin composition. When the surfactant is included within the range, the coating uniformity is secured, stains are not found, and the wetting property to the glass substrate is improved.

In an implementation, the photosensitive resin composition may further include other additives such as an oxidization inhibitor, a stabilizer, and the like in a predetermined amount, unless properties are deteriorated.

According to another embodiment, a photosensitive resin layer produced using the photosensitive resin composition according to an embodiment may be provided.

According to another embodiment, a color filter including the photosensitive resin layer may be provided.

A pattern-forming process in the color filter may be as follows.

The process may include coating the photosensitive resin composition according to an embodiment on a support substrate in a method of spin coating, slit coating, inkjet printing, and the like; drying the coated positive photosensitive resin composition to form a photosensitive resin composition film; exposing the positive photosensitive resin composition film to light; developing the exposed positive photosensitive resin composition film in an alkali aqueous solution to obtain a photosensitive resin layer; and heat-treating the photosensitive resin layer. Conditions for the patterning process are well known in a related art and will not be illustrated in detail in the specification.

Another embodiment may provide a CMOS image sensor including the color filter.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis of Compounds

Synthesis Example 1: Synthesis of Compound Represented by Intermediate 1-1

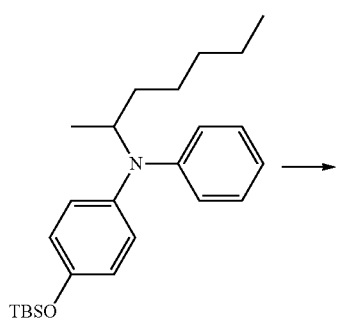

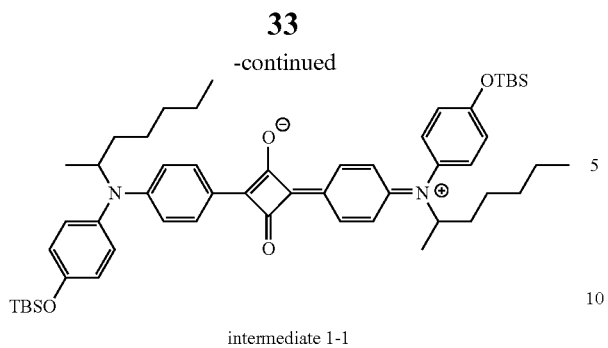

intermediate 1-1

[4-(tert-butyl-dimethyl-silanyloxy)-phenyl]-(1-methyl-hexyl)-phenyl-amine (100 mmol) and 3,4-dihydroxy-cyclobut-3-ene-1,2-dione (50 mmol) were added to toluene (300 mL) and butanol (300 mL) and then, refluxed, and water produced therefrom was removed with a Dean-stark distillation apparatus. After stiffing for 12 hours, the reactant was distilled under a reduced pressure and purified through column chromatography, obtaining a compound represented by Intermediate 1-1.

Synthesis Example 2: Synthesis of Synthesis of Compound Represented by Intermediate 1-2

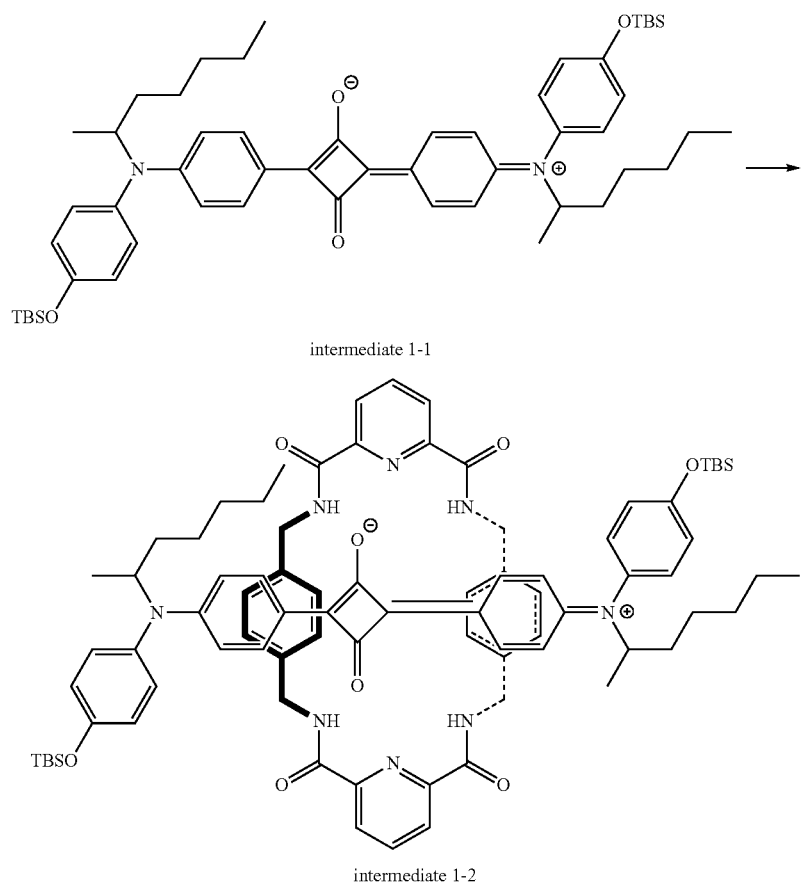

intermediate 1-2

A compound (5 mmol) represented by Intermediate 1-1 was dissolved in 600 mL of a chloroform solvent, and a solution prepared by dissolving pyridine-2,6-dicarbonyl dichloride (20 mmol) and p-xylylenediamine (20 mmol) in 60 mL of chloroform was simultaneously added dropwise thereto at ambient temperature for 5 hours. After 12 hours, the obtained mixture was distilled under a reduced pressure and separated through column chromatography, obtaining a compound represented by Intermediate 1-2.

Synthesis Example 3: Synthesis of Compound Represented by Intermediate 1-3

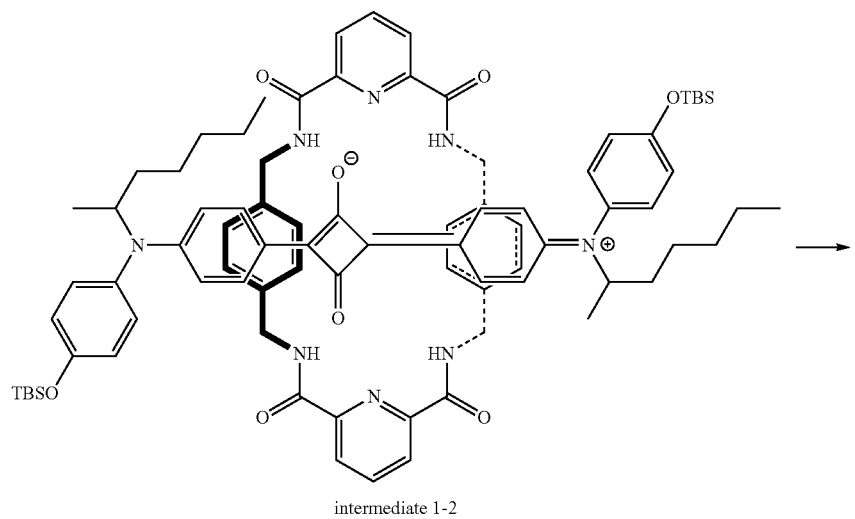

intermediate 1-2

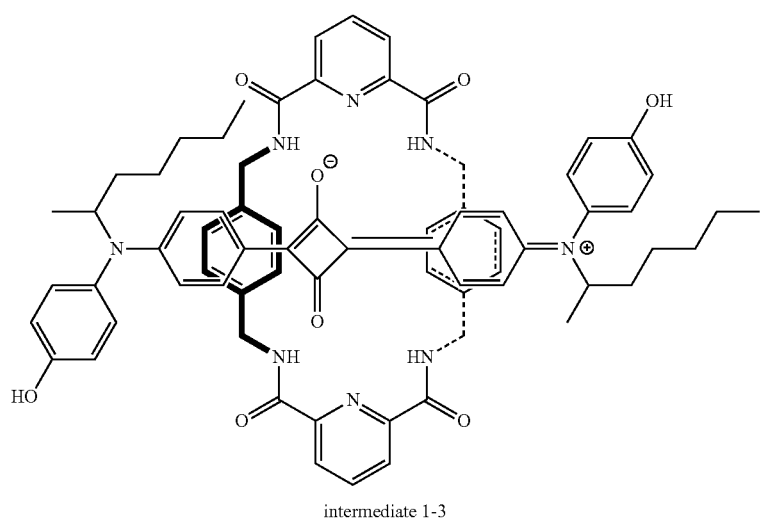

intermediate 1-3

A compound represented by Intermediate 1-2 (5 mmol) was dissolved in 50 mL of a tetrahydrofuran solvent, and tetrabutylammonium fluoride (11 mmol) was added thereto at ambient temperature. After 30 minutes, a product therefrom was separated through column chromatography, obtaining a compound represented by Intermediate 1-3.

Synthesis Example 4-1: Synthesis of Compound Represented by Chemical Formula A1

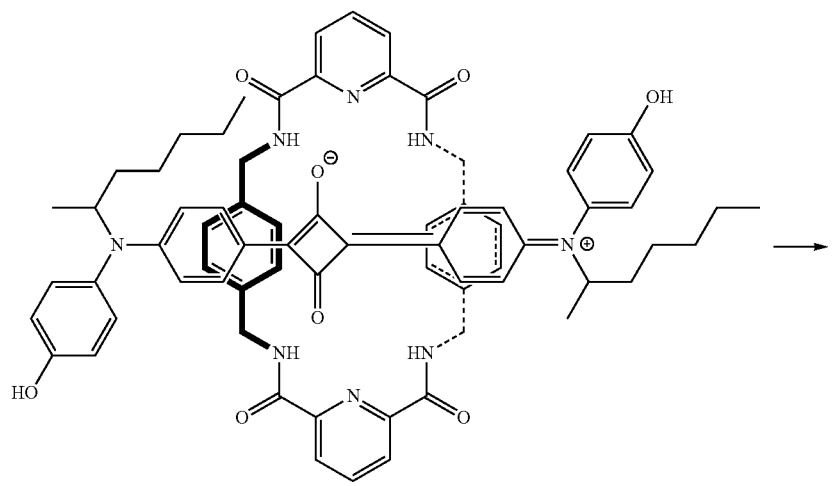

intermediate 1-3

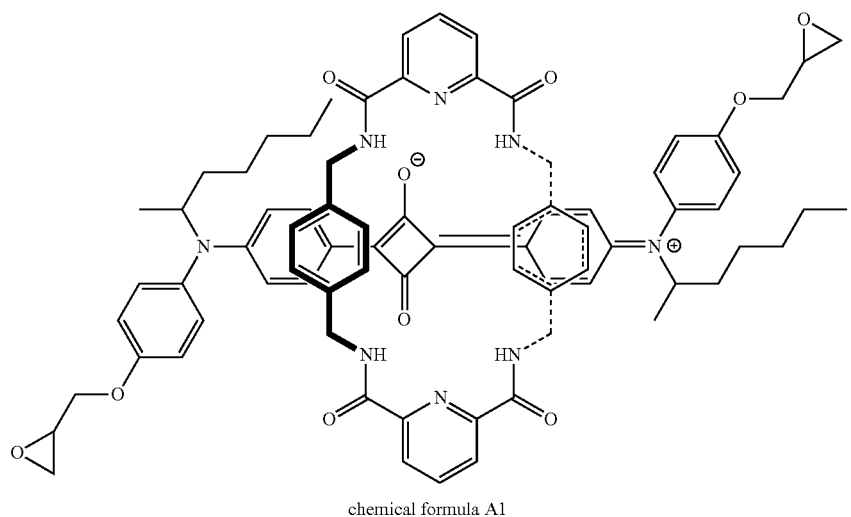

chemical formula A1

A compound represented by Intermediate 1-3 (5 mmol), KOH (25 mmol), and epichlorohydrin (50 mmol) were reacted in 25 mL of a dimethyl sulfoxide solvent for 2 hours and then, extracted with a 10% $NH_4Cl$ aqueous solution and ethyl acetate. The obtained mixture was separated through column chromatography, obtaining a compound represented by Chemical Formula A1.

[Chemical Formula A1]
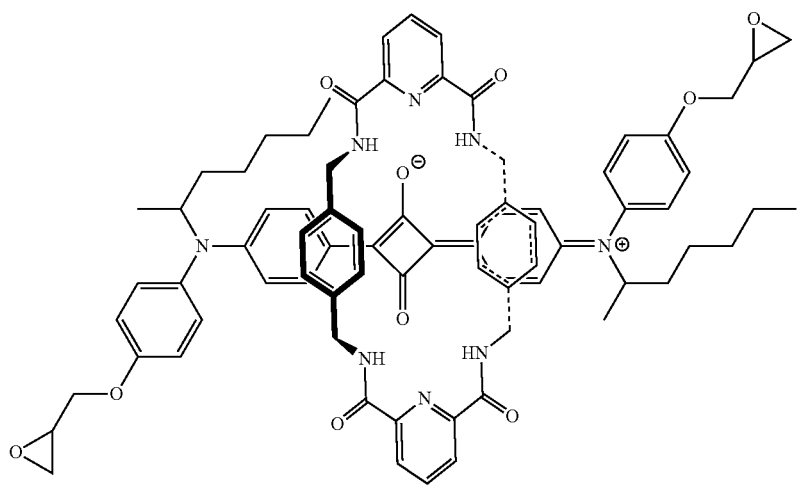
MALDI-TOF MS: 1291.6 m/z
Synthesis Example 4-2: Synthesis of Compound Represented by Chemical Formula A2
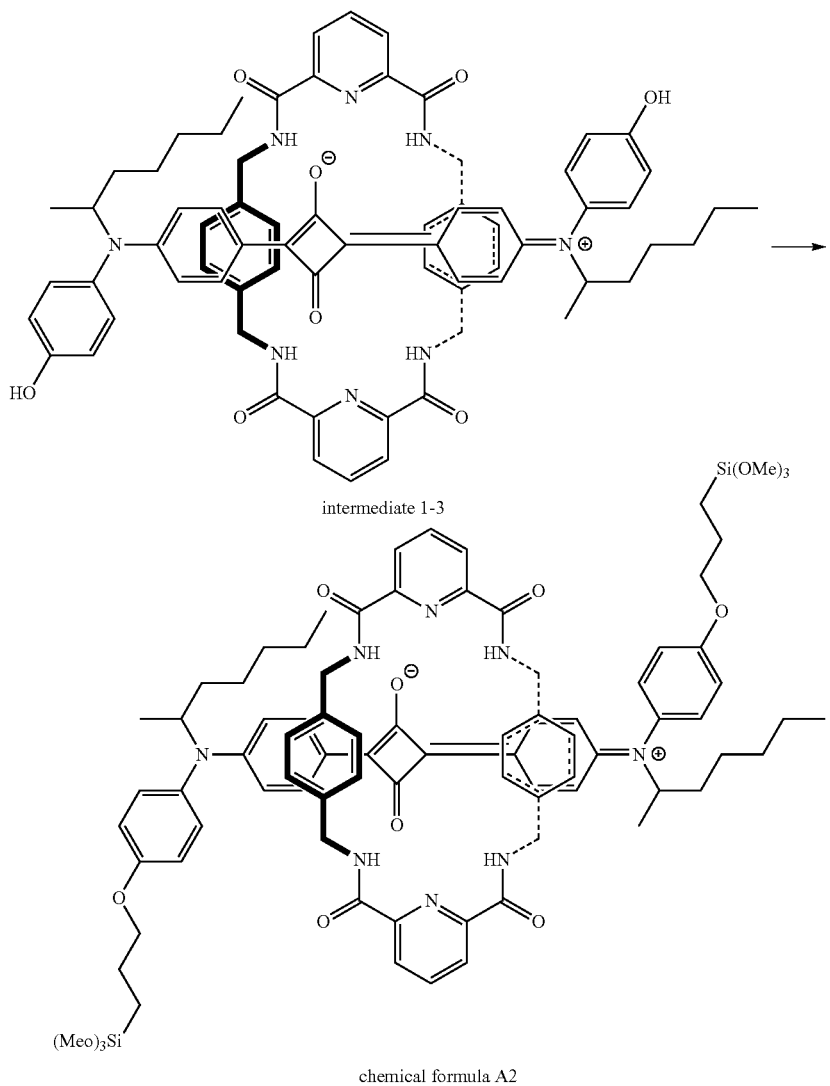
chemical formula A2

A compound represented by Intermediate 1-3 (5 mmol) and sodium hydride (15 mmol) were reacted in 25 mL of an N,N-dimethylformamide solvent for 1 hour, and (3-iodopropyl)trimethoxysilane (15 mmol) was added thereto and then, heated up to 50° C. After 8 hours, the mixture was separated through column chromatography, obtaining a compound represented by Chemical Formula A2.

[Chemical Formula A2]

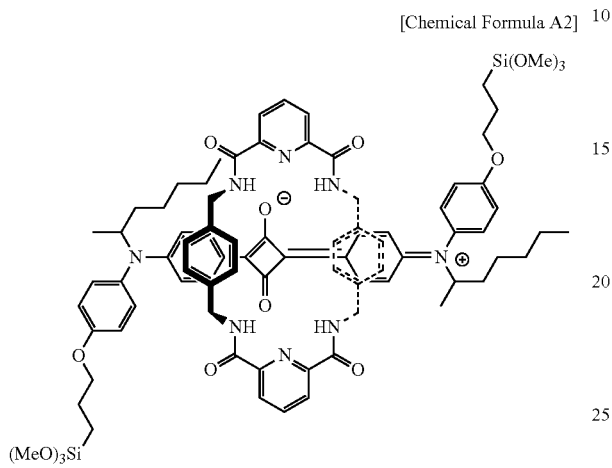

MALDI-TOF MS: 1503.9 m/z

Synthesis Example 5: Synthesis of Compound Represented by Intermediate 2-1

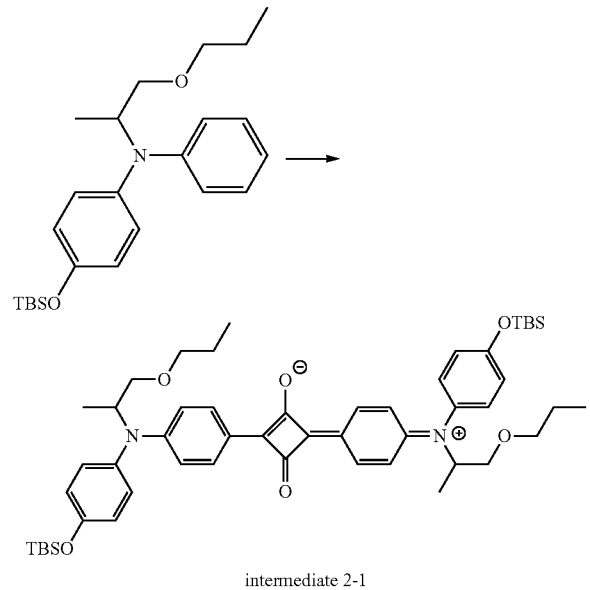

intermediate 2-1

A compound represented by Intermediate 2-1 was obtained according to the same method as Synthesis Example 1 except that [4-(tert-butyl-dimethyl-silanyloxy)-phenyl]-(1-methyl-2-propoxy-ethyl)-phenyl-amine was used instead of the [4-(tert-butyl-dimethyl-silanyloxy)-phenyl]-(1-methyl-hexyl)-phenyl-amine.

Synthesis Example 6: Synthesis of Compound Represented by Intermediate 2-2

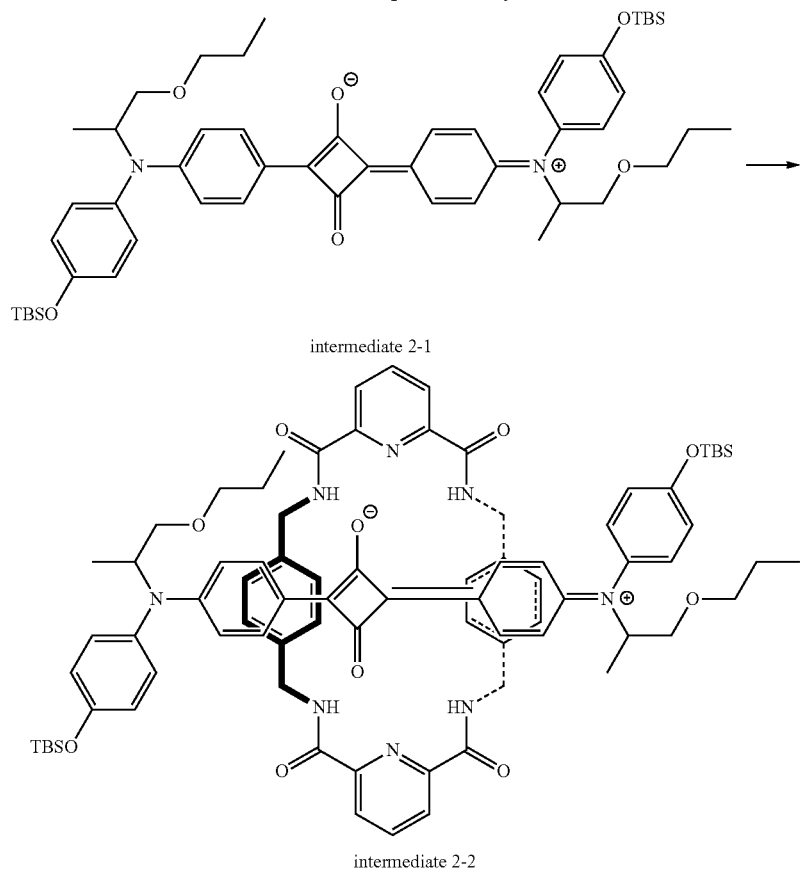

intermediate 2-1 intermediate 2-2

A compound represented by Intermediate 2-2 was obtained according to the same method as Synthesis Example 2 except that the compound represented by Intermediate 2-1 was used instead of the compound represented by Intermediate 1-1.

Synthesis Example 7: Synthesis of Compound Represented by Intermediate 2-3

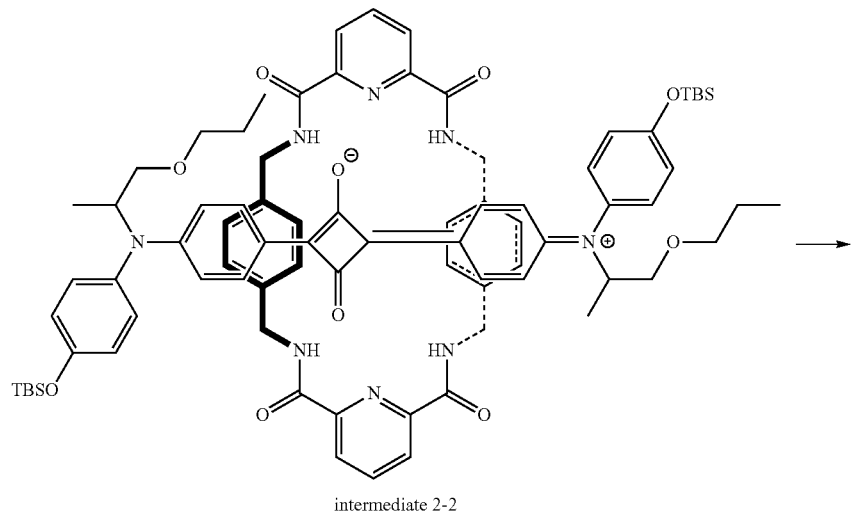

intermediate 2-2

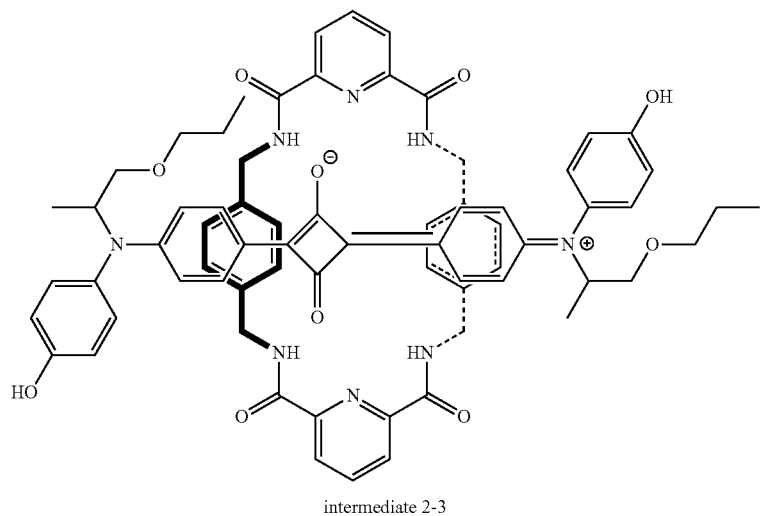

intermediate 2-3

A compound represented by Intermediate 2-3 was obtained according to the same method as Synthesis Example 3 except that the compound represented by Intermediate 2-2 was used instead of the compound represented by Intermediate 1-2.

Synthesis Example 8-1: Synthesis of Compound Represented by Chemical Formula B1

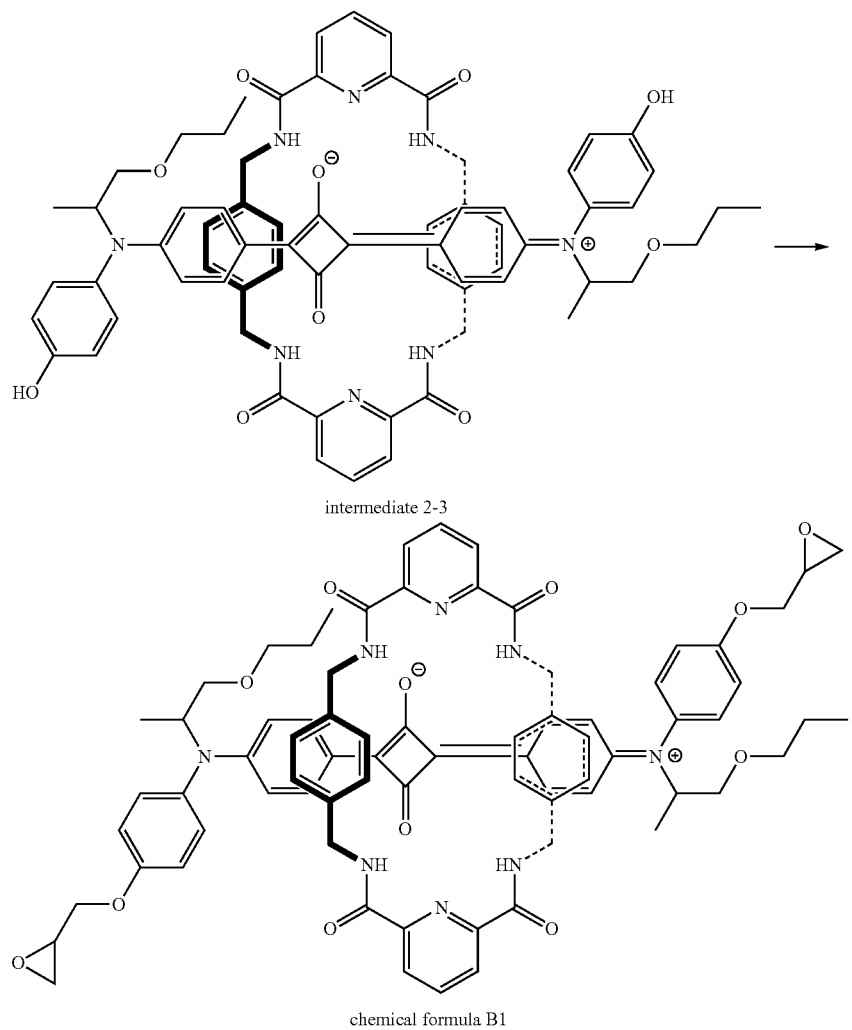

intermediate 2-3 chemical formula B1

A compound represented by Chemical Formula B1 was obtained according to the same method as Synthesis Example 4-1 except that the compound represented by Intermediate 2-3 was used instead of the compound represented by Intermediate 1-3.

[Chemical Formula B1]

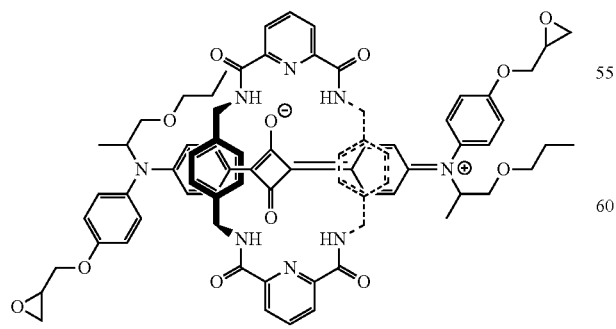

MALDI-TOF MS: 1295.6 m/z

Synthesis Example 8-2: Synthesis of Compound Represented by Chemical Formula B2

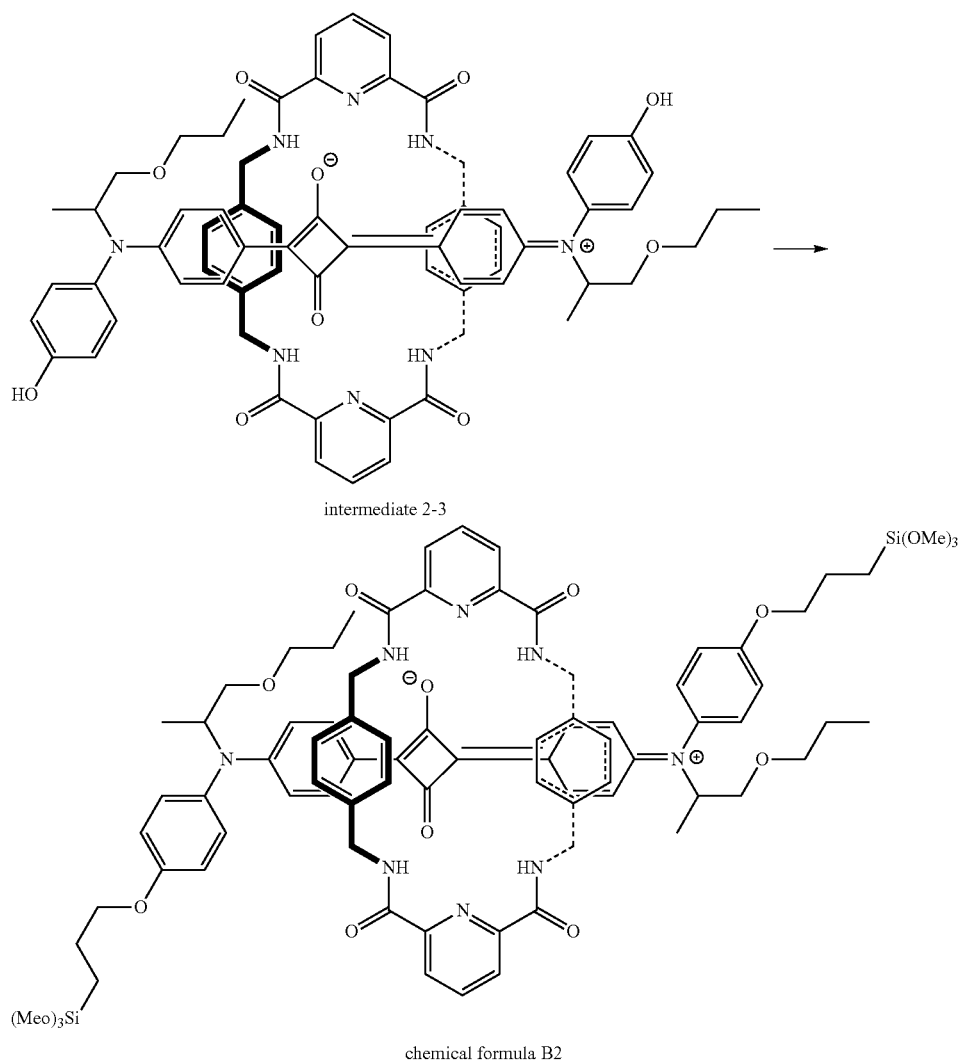

intermediate 2-3 chemical formula B2

A compound represented by Chemical Formula B2 was obtained according to the same method as Synthesis Example 4-2 except that the compound represented by Intermediate 2-3 was used instead of the compound represented by Intermediate 1-3.

[Chemical Formula B2]

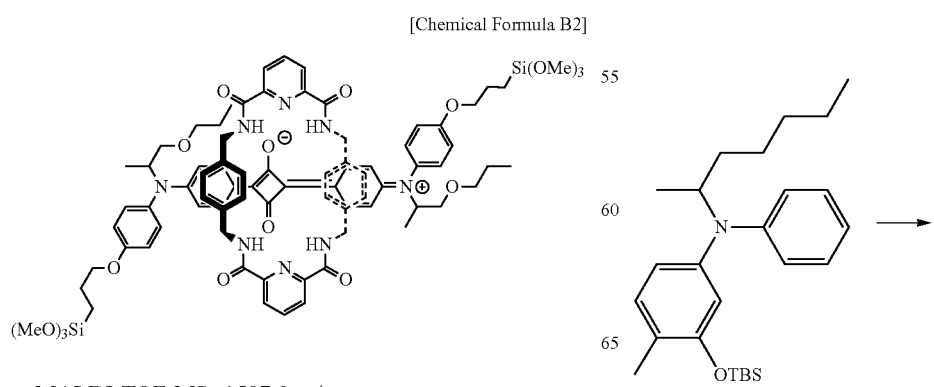

MALDI-TOF MS: 1507.9 m/z

Synthesis Example 9: Synthesis of Compound Represented by Intermediate 3-1

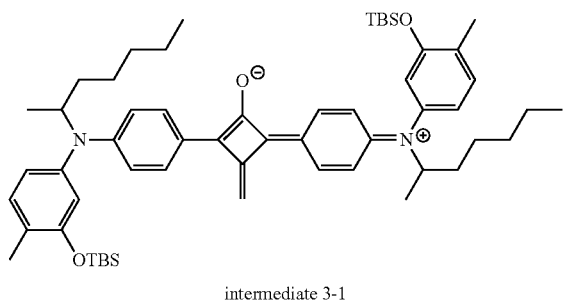

intermediate 3-1

A compound represented by Intermediate 3-1 was obtained according to the same method as Synthesis Example 1 except that [3-(tert-butyl-dimethyl-silanyloxy)-4-methyl-phenyl]-(1-methyl-hexyl)-phenyl-amine was used instead of the [4-(tert-butyl-dimethyl-silanyloxy)-phenyl]-(1-methyl-hexyl)-phenyl-amine.

Synthesis Example 10: Synthesis of Compound Represented by Intermediate 3-2

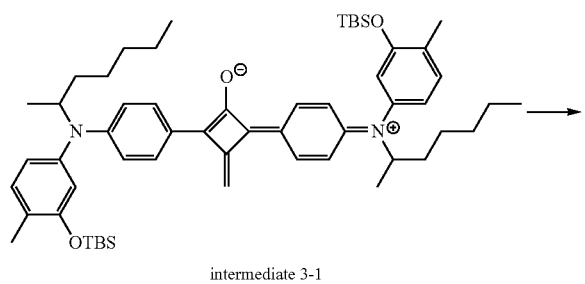

intermediate 3-1

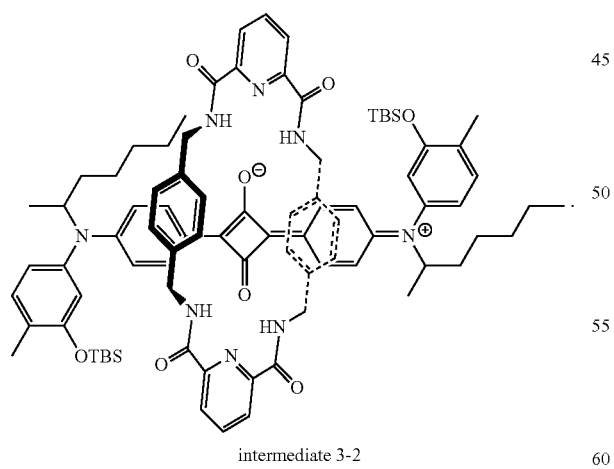

intermediate 3-2

A compound represented by Intermediate 3-2 was obtained according to the same method as Synthesis Example 2 except that the compound represented by Intermediate 3-1 was used instead of the compound represented by Intermediate 1-1.

Synthesis Example 11: Synthesis of Compound Represented by Intermediate 3-3

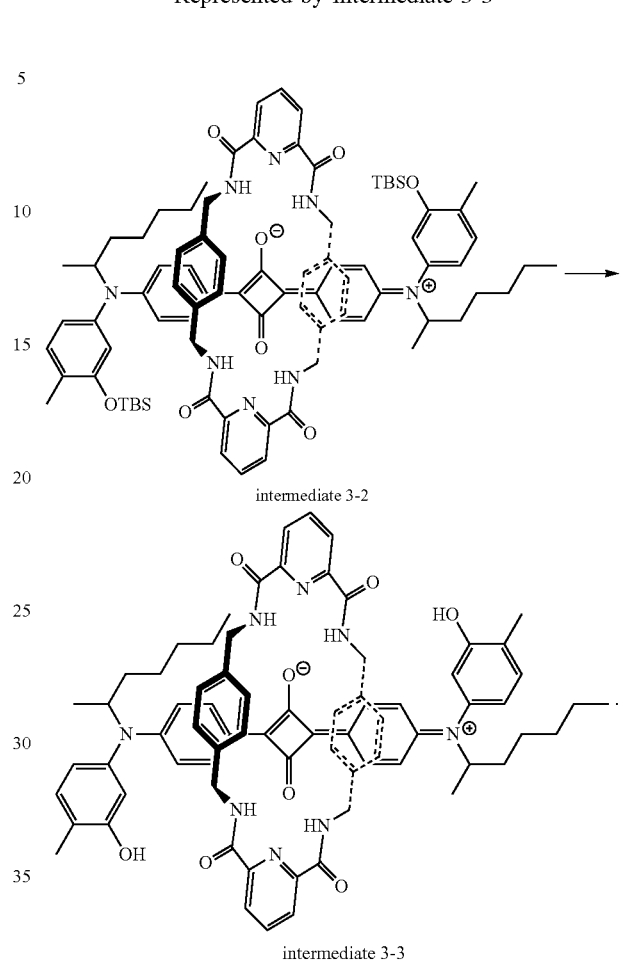

intermediate 3-2 intermediate 3-3

A compound represented by Intermediate 3-3 was obtained according to the same method as Synthesis Example 3 except that the compound represented by Intermediate 3-2 was used instead of the compound represented by Intermediate 1-2.

Synthesis Example 12-1: Synthesis of Compound Represented by Chemical Formula C1

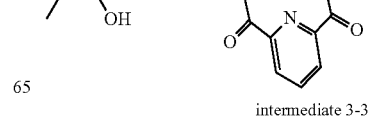

intermediate 3-3

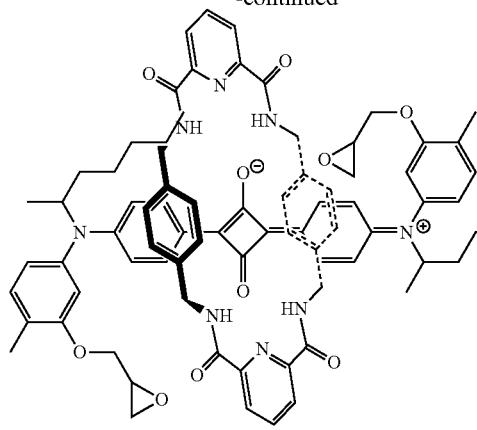

chemical formula C1

A compound represented by Chemical Formula C1 was obtained according to the same method as Synthesis Example 4-1 except that the compound represented by Intermediate 3-3 was used instead of the compound represented by Intermediate 1-3.

[Chemical Formula C1]

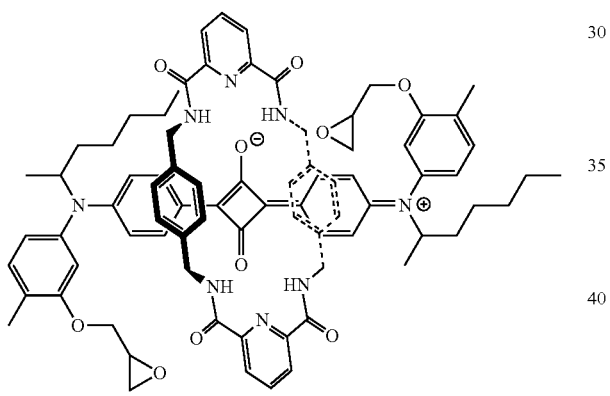

MALDI-TOF MS: 1320.6 m/z

Synthesis Example 12-2: Synthesis of Compound Represented by Chemical Formula C2

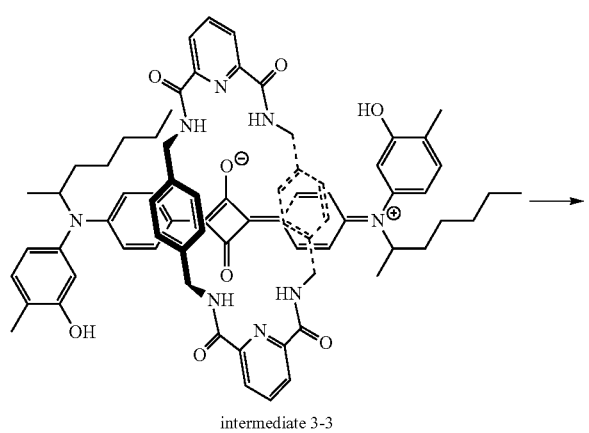

intermediate 3-3

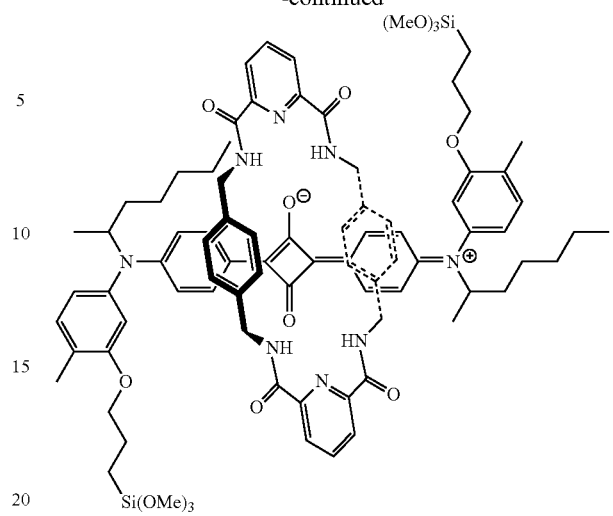

chemical formula C2

A compound represented by Chemical Formula C2 was obtained according to the same method as Synthesis Example 4-2 except that the compound represented by Intermediate 3-3 was used instead of the compound represented by Intermediate 1-3.

[Chemical Formula C2]

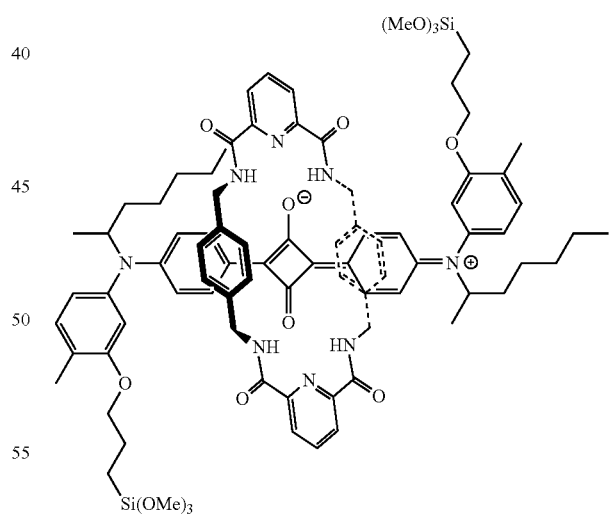

MALDI-TOF MS: 1532.0 m/z

Synthesis Example 13: Synthesis of Compound Represented by Intermediate 4-1

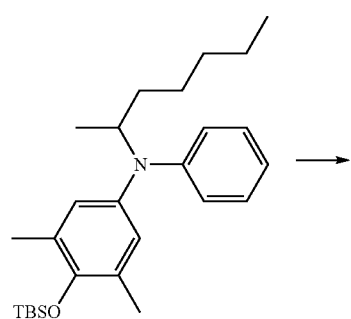

→

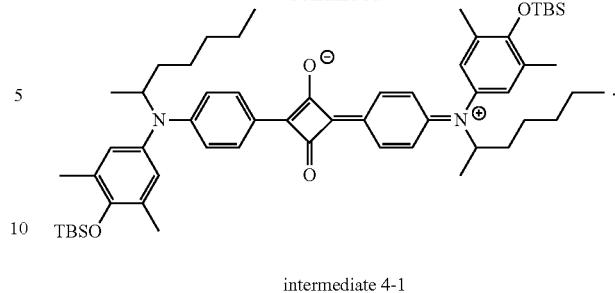

intermediate 4-1

A compound represented by Intermediate 4-1 was obtained according to the same method as Synthesis Example 1 except that [4-(tert-butyl-dimethyl-silanyloxy)-3,5-dimethyl-phenyl]-(1-methyl-hexyl)-phenyl-amine was used instead of the [4-(tert-butyl-dimethyl-silanyloxy)-phenyl]-(1-methyl-hexyl)-phenyl-amine.

Synthesis Example 14: Synthesis of Compound Represented by Intermediate 4-2

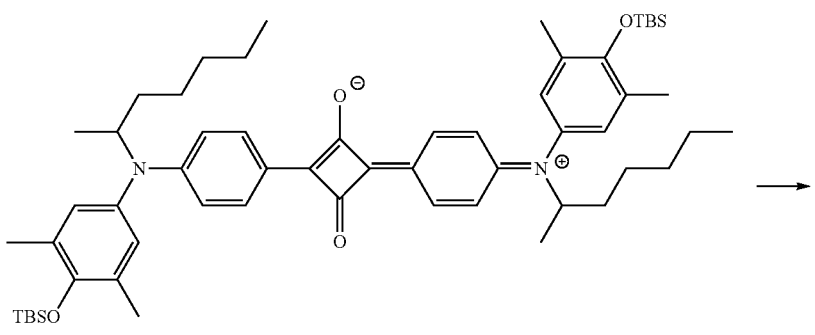

intermediate 4-1

→

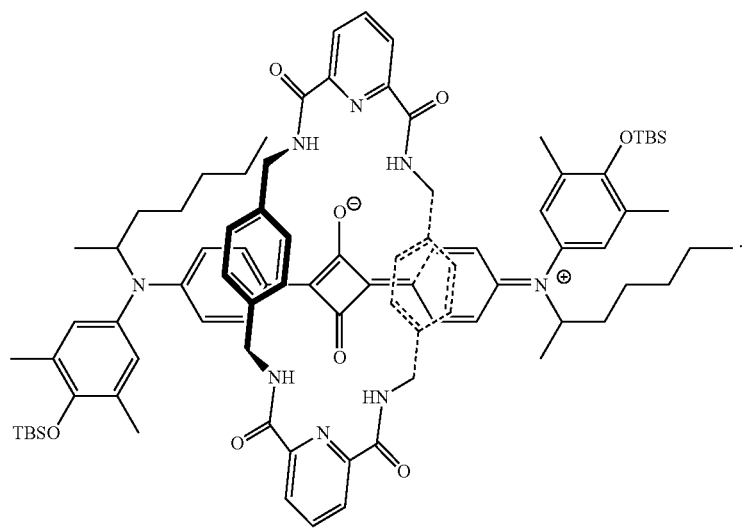

intermediate 4-2

A compound represented by Intermediate 4-2 was obtained according to the same method as Synthesis Example 2 except that a compound represented by Intermediate 4-1 was used instead of the compound represented by Intermediate 1-1.

Synthesis Example 15: Synthesis of Compound Represented by Intermediate 4-3

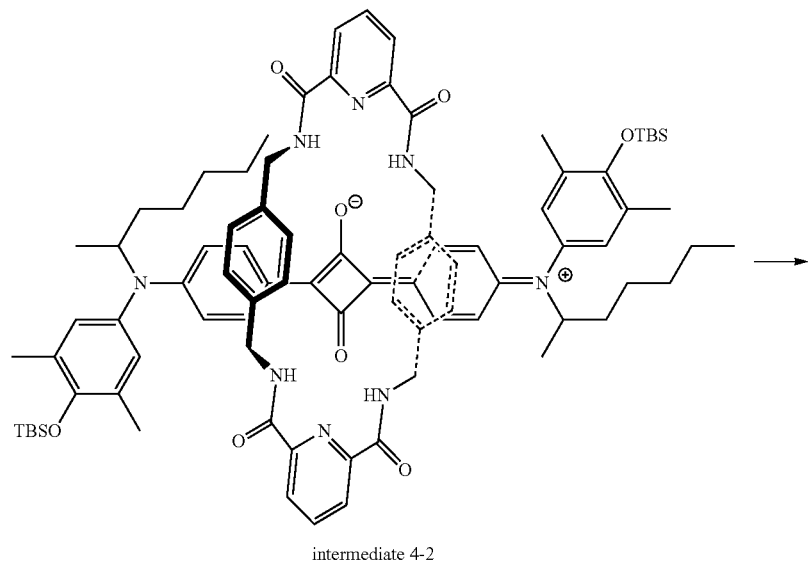

intermediate 4-2

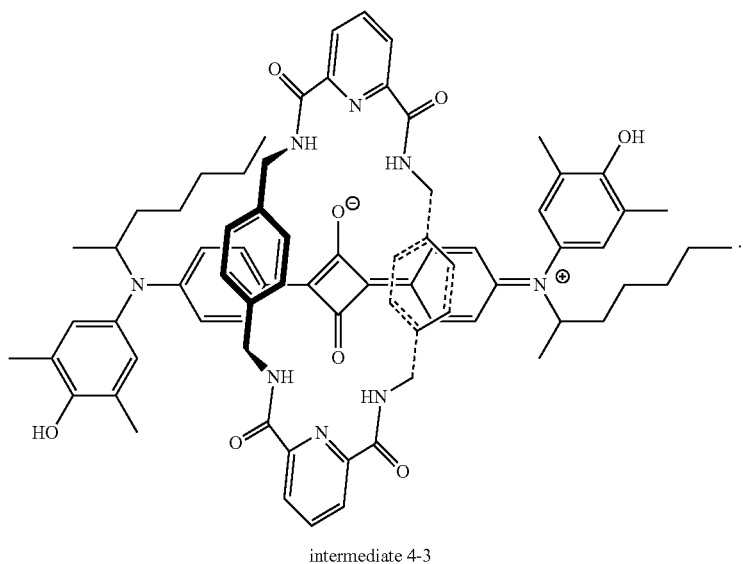

intermediate 4-3

A compound represented by Intermediate 4-3 was obtained according to the same method as Synthesis Example 3 except that a compound represented by Intermediate 4-2 was used instead of the compound represented by Intermediate 1-2.

Synthesis Example 16-1: Synthesis of Compound Represented by Chemical Formula D1
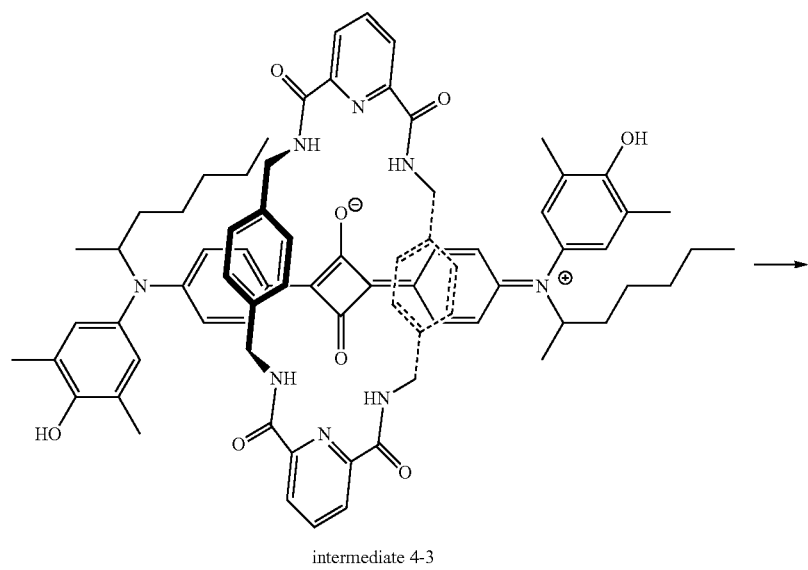
intermediate 4-3
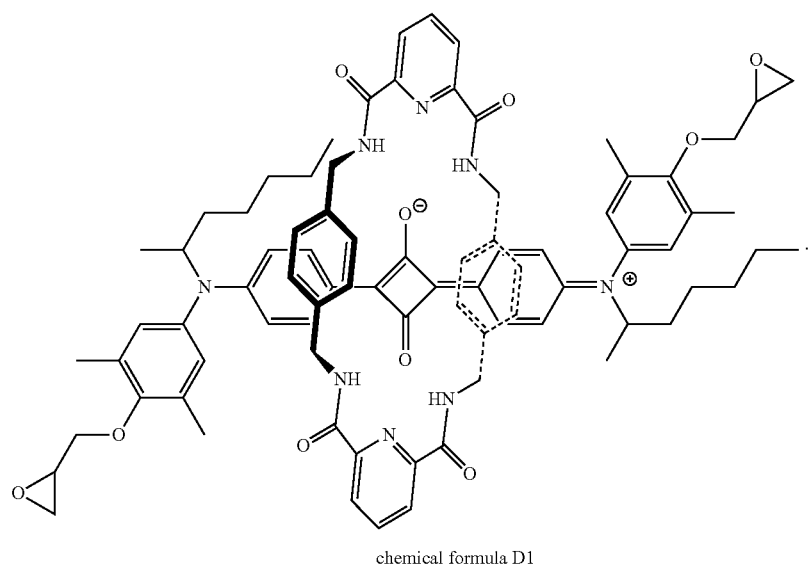
chemical formula D1
A compound represented by Chemical Formula D1 was obtained according to the same method as Synthesis Example 4-1 except that a compound represented by Intermediate 4-3 was used instead of the compound represented by Intermediate 1-3.

[Chemical Formula D1]
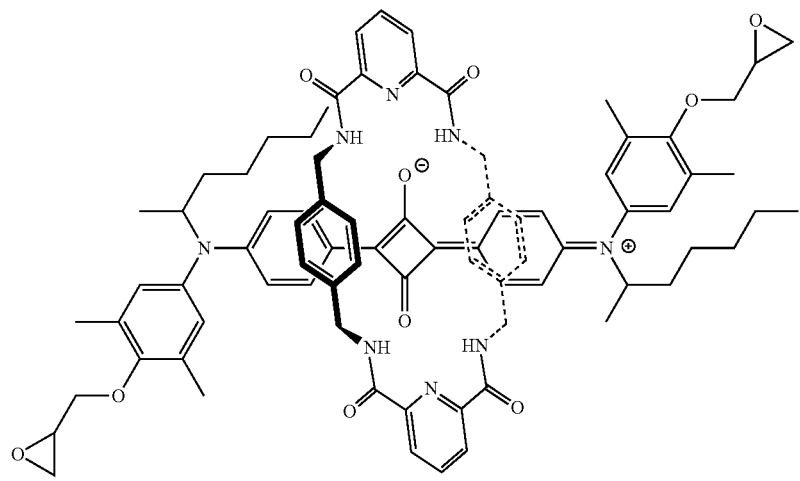
MALDI-TOF MS: 1347.6 m/z
Synthesis Example 16-2: Synthesis of Compound Represented by Chemical Formula D2
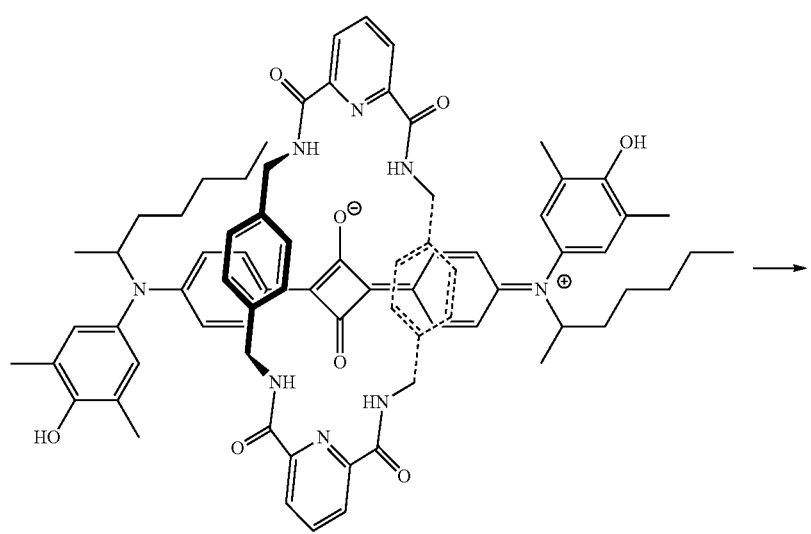
intermediate 4-3

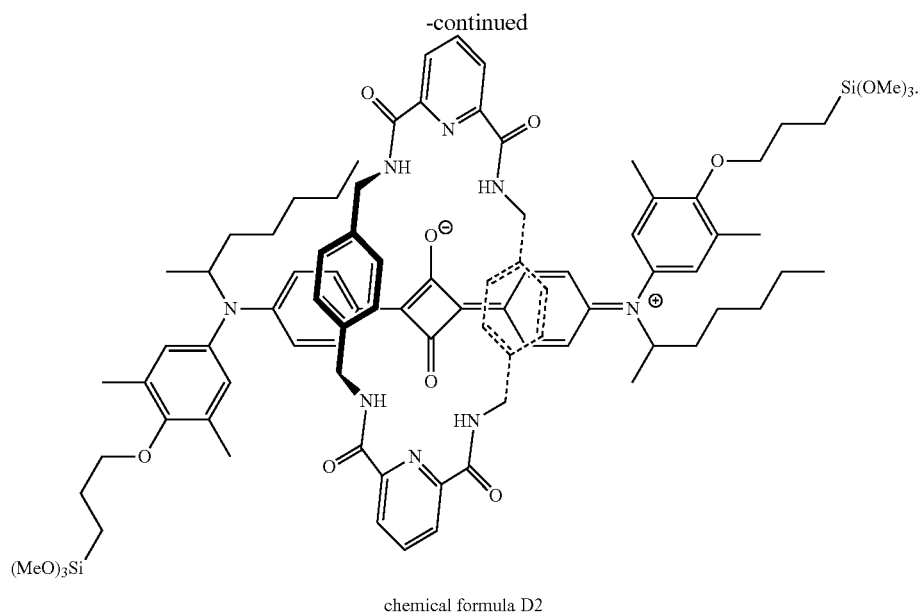
chemical formula D2
A compound represented by Chemical Formula D2 was obtained according to the same method as Synthesis Example 4-2 except that a compound represented by Intermediate 4-3 was used instead of the compound represented by Intermediate 1-3.
[Chemical Formula D2]
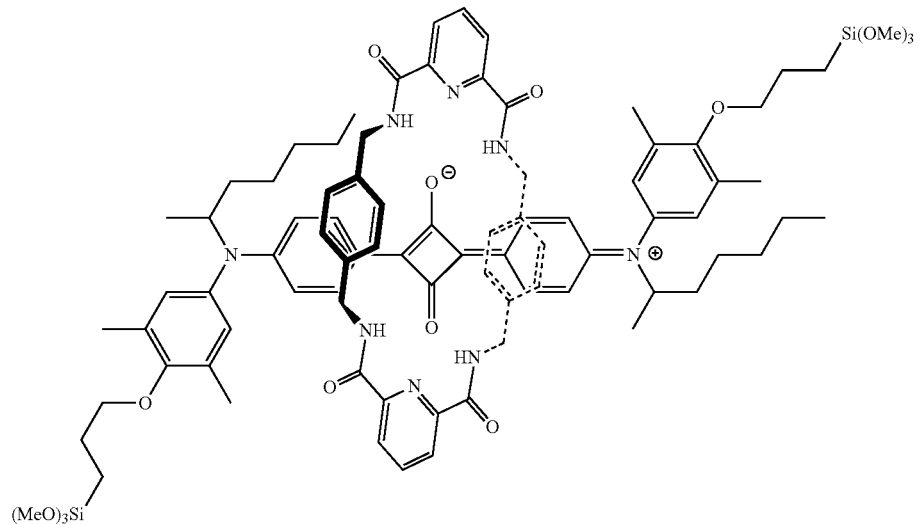
MALDI-TOF MS: 1561.0 m/z

Synthesis Example 17: Synthesis of Compound Represented by Intermediate 5-1

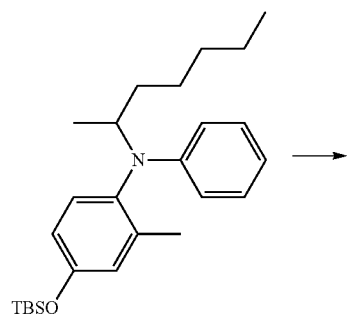 →

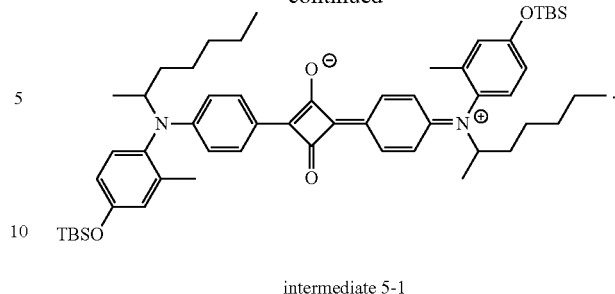

intermediate 5-1

A compound represented by Intermediate 5-1 was obtained according to the same method as Synthesis Example 1 except that [4-(tert-butyl-dimethyl-silanyloxy)-2-methyl-phenyl]-(1-methyl-hexyl)-phenyl-amine was used instead of the [4-(tert-butyl-dimethyl-silanyloxy)-phenyl]-(1-methyl-hexyl)-phenyl-amine.

Synthesis Example 18: Synthesis of Compound Represented by Intermediate 5-2

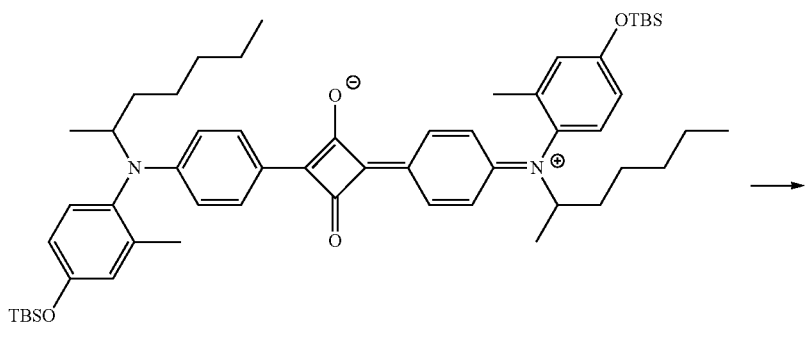 → intermediate 5-1

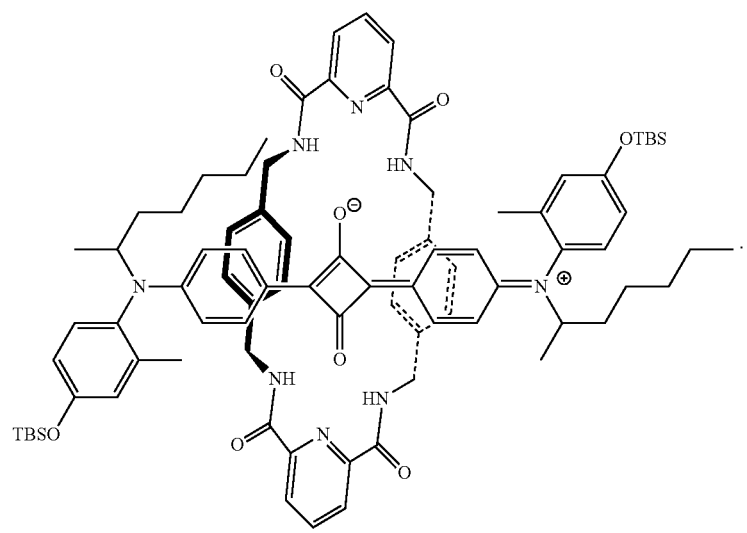

intermediate 5-2

A compound represented by Intermediate 5-2 was obtained according to the same method as Synthesis Example 2 except that a compound represented by Intermediate 5-1 was used instead of the compound represented by Intermediate 1-1.

Synthesis Example 19: Synthesis of Compound Represented by Intermediate 5-3

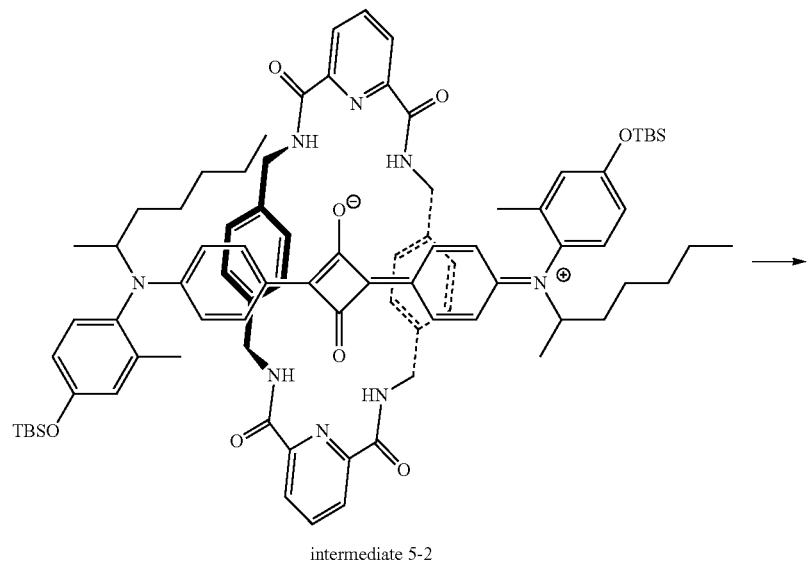

intermediate 5-2

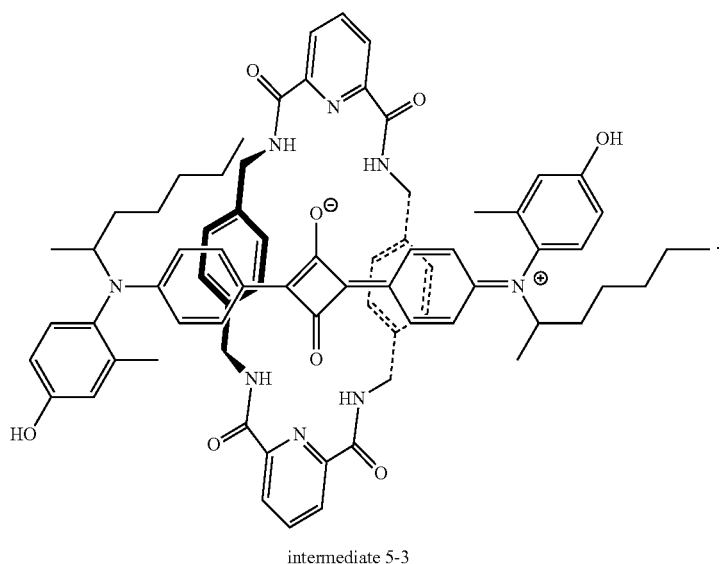

intermediate 5-3

A compound represented by Intermediate 5-3 was obtained according to the same method as Synthesis Example 3 except that a compound represented by Intermediate 5-2 was used instead of the compound represented by Intermediate 1-2.

Synthesis Example 20-1: Synthesis of Compound Represented by Chemical Formula E1
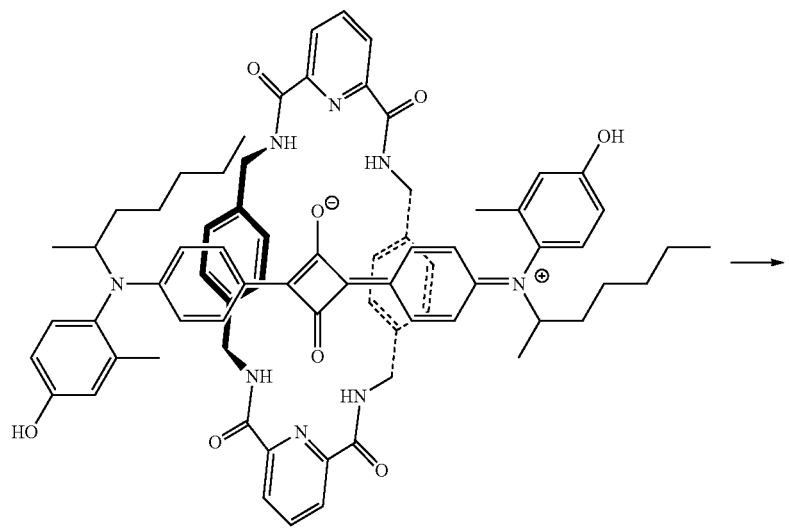
intermediate 5-3
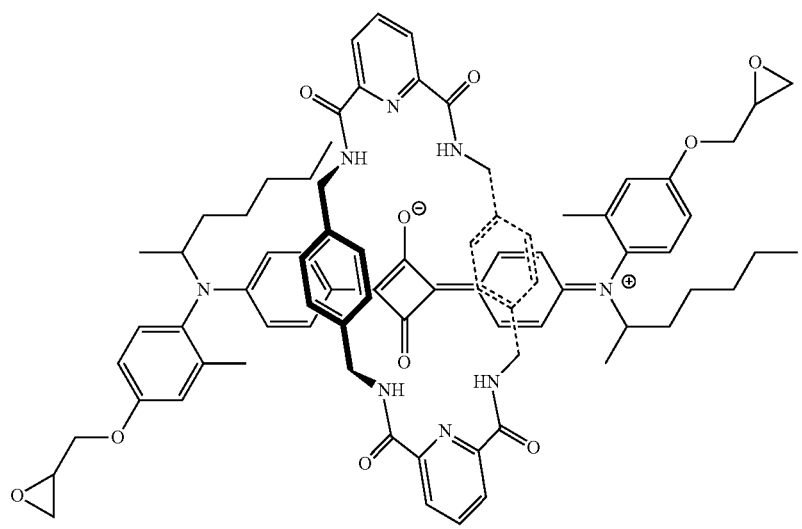
chemical formula E1
A compound represented by Chemical Formula E1 was obtained according to the same method as Synthesis Example 4-1 except that a compound represented by Intermediate 5-3 was used instead of the compound represented by Intermediate 1-3.

[Chemical Formula E1]
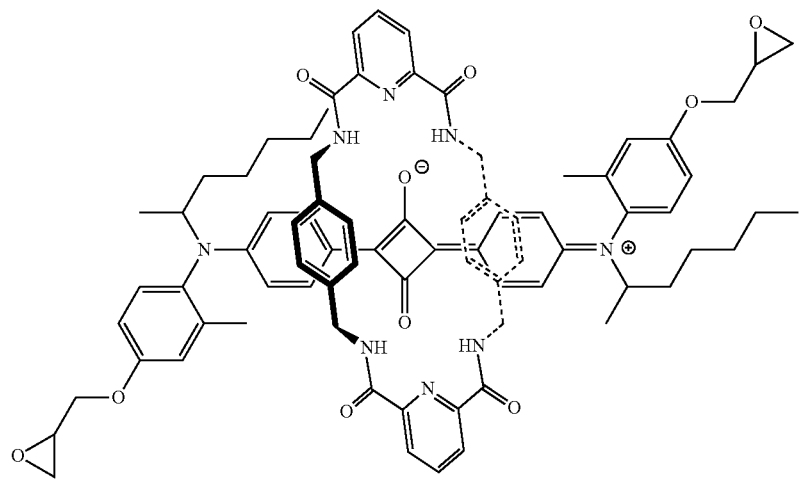
MALDI-TOF MS: 1319.6 m/z
Synthesis Example 20-2: Synthesis of Compound Represented by Chemical Formula E2
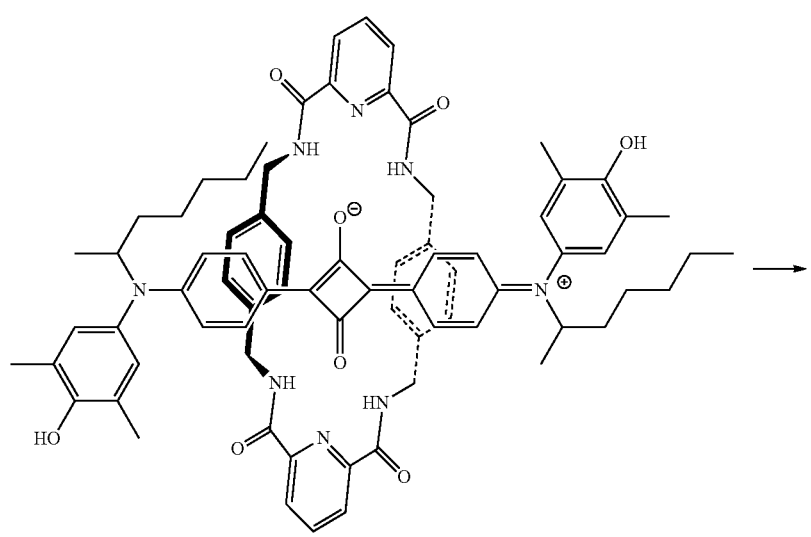
intermediate 5-3

-continued
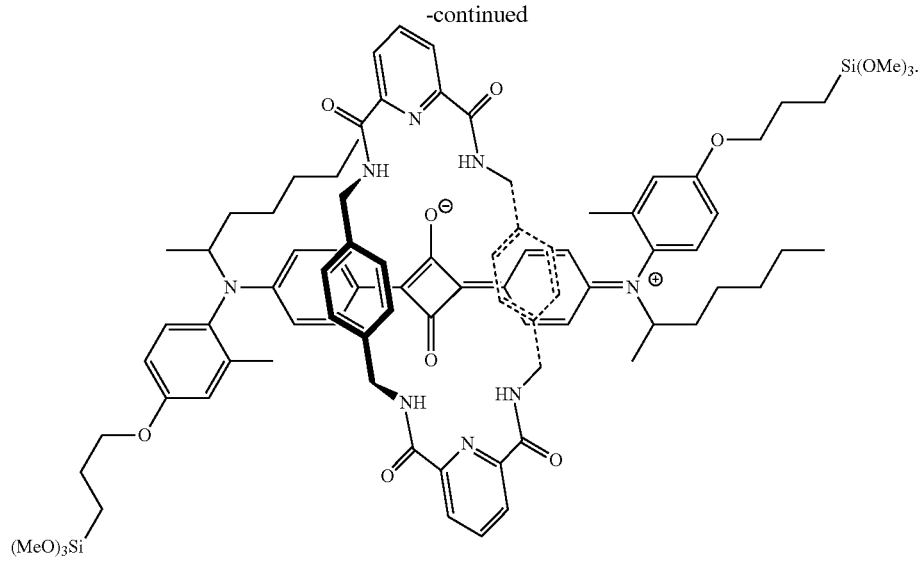
chemical formula E2
A compound represented by Chemical Formula E2 was obtained according to the same method as Synthesis Example 4-2 except that a compound represented by Intermediate 5-3 was used instead of the compound represented by Intermediate 1-3.
[Chemical Formula E2]
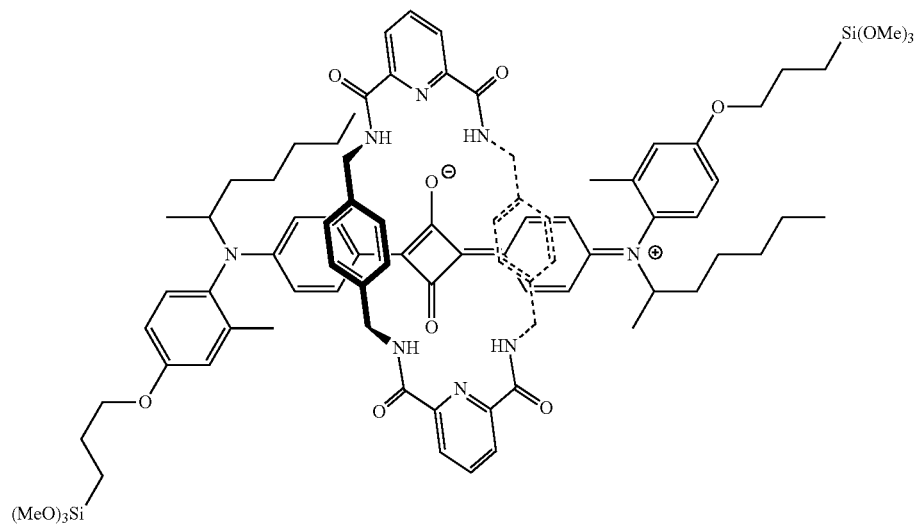
MALDI-TOF MS: 1531.9 m/z

Synthesis Example 21: Synthesis of Compound Represented by Intermediate 6-1

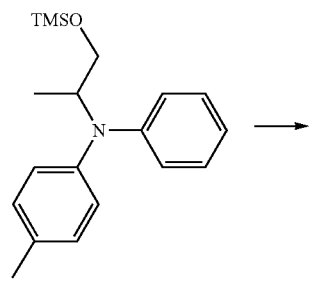

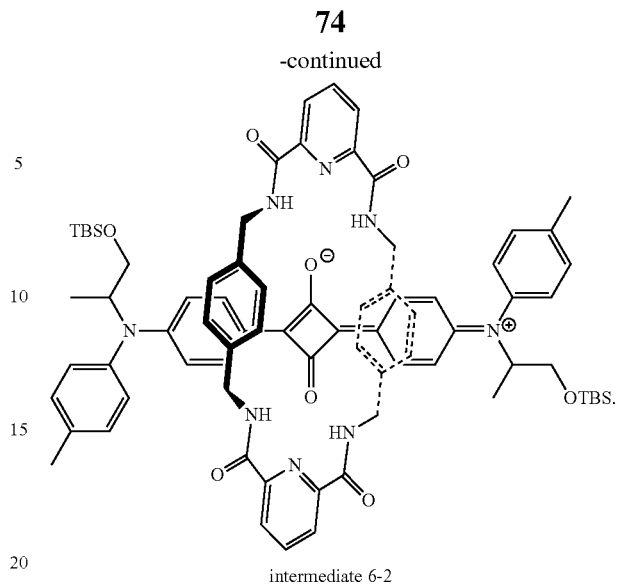

intermediate 6-2

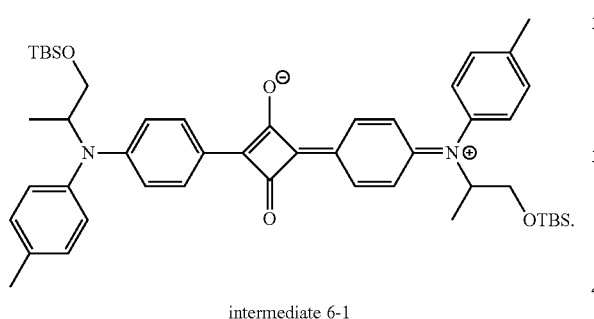

intermediate 6-1

A compound represented by Intermediate 6-1 was obtained according to the same method as Synthesis Example 1 except that [2-(tert-butyl-dimethyl-silanyloxy)-1-methyl-ethyl]-phenyl-p-tolyl-amine was used instead of the [4-(tert-butyl-dimethyl-silanyloxy)-phenyl]-(1-methyl-hexyl)-phenyl-amine.

Synthesis Example 22: Synthesis of Compound Represented by Intermediate 6-2

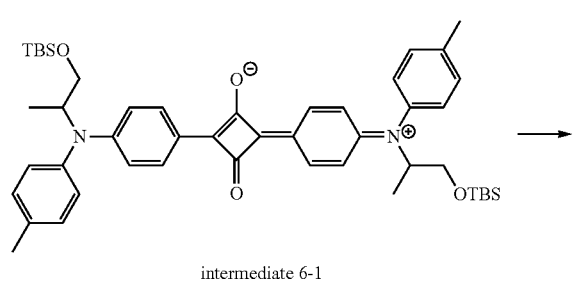

intermediate 6-1

A compound represented by Intermediate 6-2 was obtained according to the same method as Synthesis Example 2 except that a compound represented by Intermediate 6-1 was used instead of the compound represented by Intermediate 1-1.

Synthesis Example 23: Synthesis of Compound Represented by Intermediate 6-3

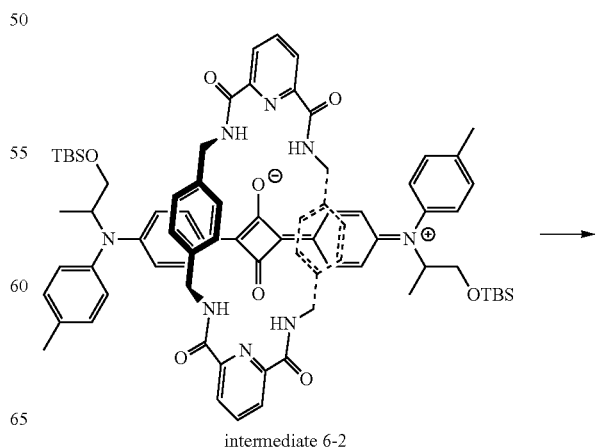

intermediate 6-2

75
-continued

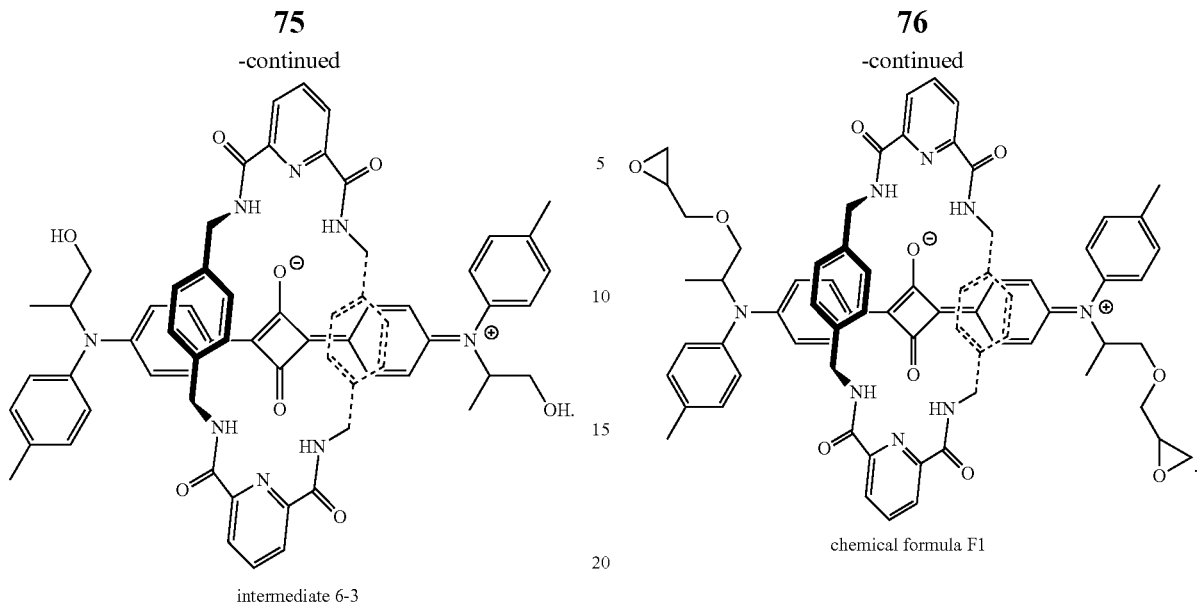

intermediate 6-3

A compound represented by Intermediate 6-3 was obtained according to the same method as Synthesis Example 3 except that a compound represented by Intermediate 6-2 was used instead of the compound represented by Intermediate 1-2.

Synthesis Example 24-1: Synthesis of Compound Represented by Chemical Formula F1

76
-continued chemical formula F1

A compound represented by Chemical Formula F1 was obtained according to the same method as Synthesis Example 4-1 except that a compound represented by Intermediate 6-3 was used instead of the compound represented by Intermediate 1-3.

[Chemical Formula F1]

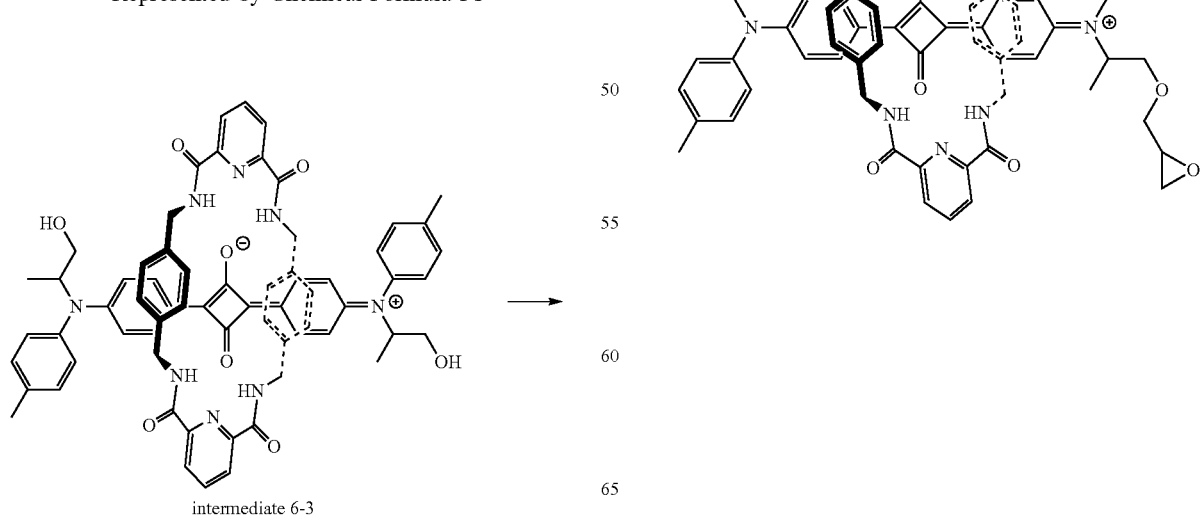

MALDI-TOF MS: 1208.4 m/z

Synthesis Example 24-2: Synthesis of Compound Represented by Chemical

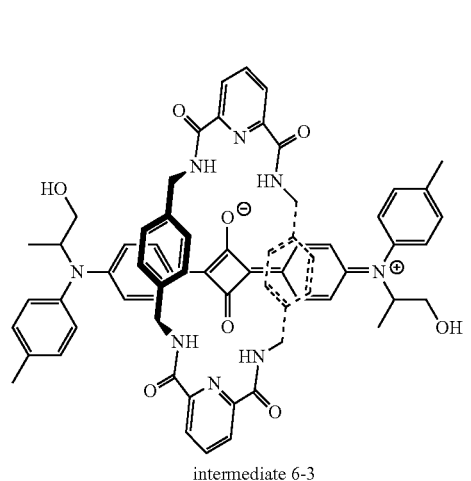

intermediate 6-3

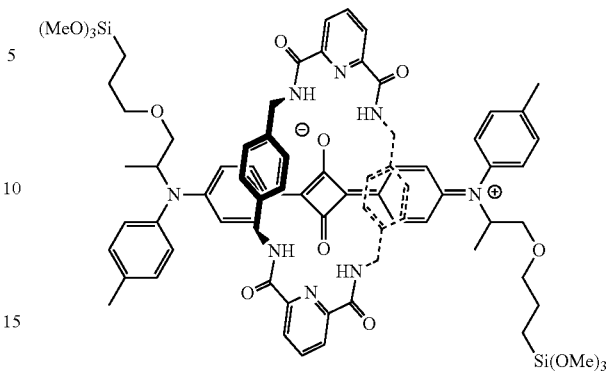

[Chemical Formula F2]

MALDI-TOF MS: 1419.7 m/z

Synthesis Example 25: Synthesis of Compound Represented by Intermediate 7-1

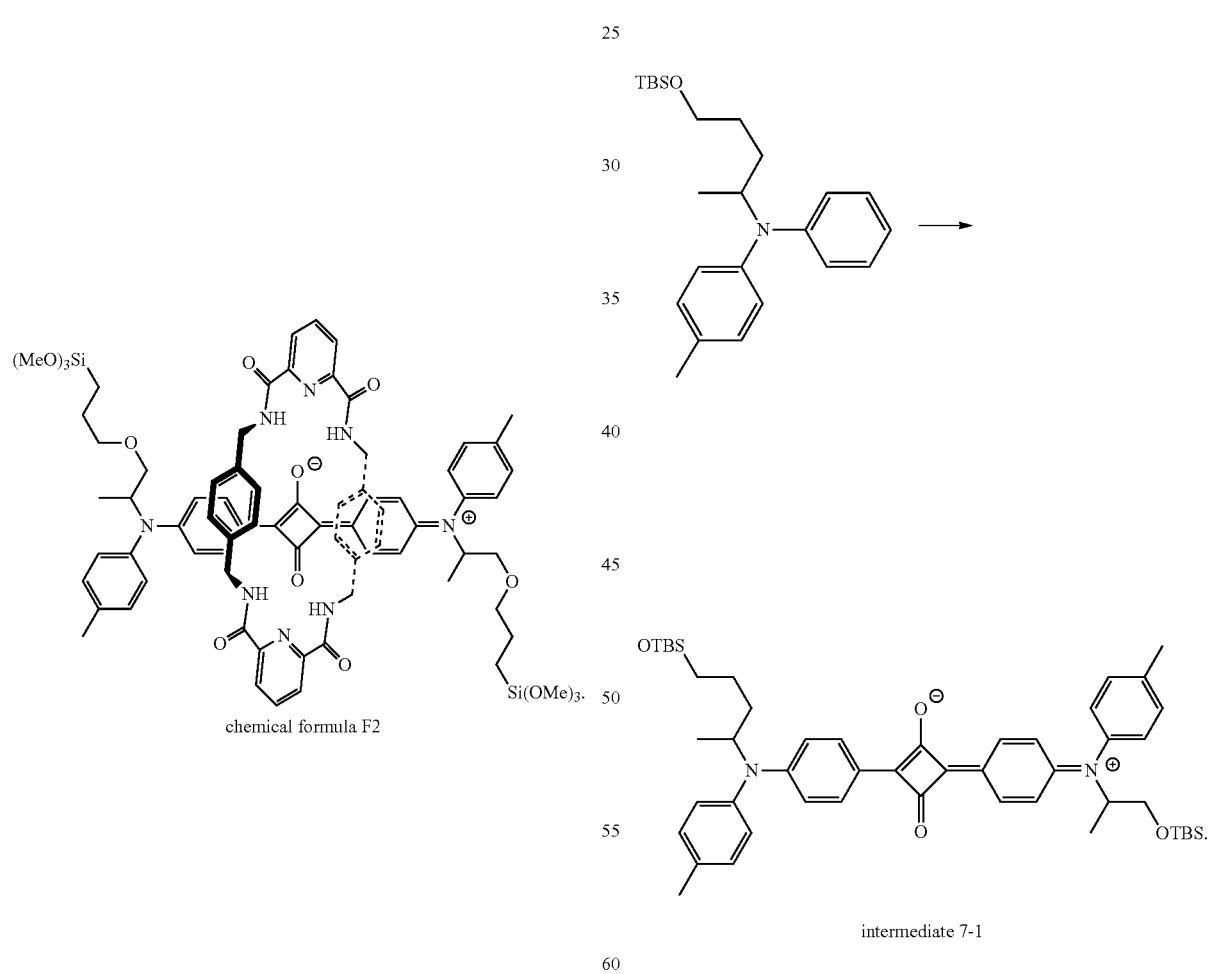

intermediate 7-1

A compound represented by Chemical Formula F2 was obtained according to the same method as Synthesis Example 4-2 except that a compound represented by Intermediate 6-3 was used instead of the compound represented by Intermediate 1-3.

A compound represented by Intermediate 7-1 was obtained according to the same method as Synthesis Example 1 except that [[4-(tert-butyl-dimethyl-silanyloxy)-1-methyl-butyl]-phenyl-p-tolyl-amine was used instead of the [4-(tert-butyl-dimethyl-silanyloxy)-phenyl]-(1-methyl-hexyl)-phenyl-amine.

Synthesis Example 26: Synthesis of Compound Represented by Intermediate 7-2
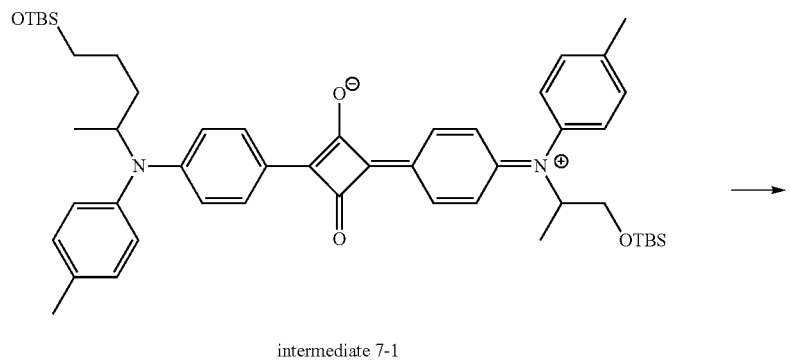
intermediate 7-1
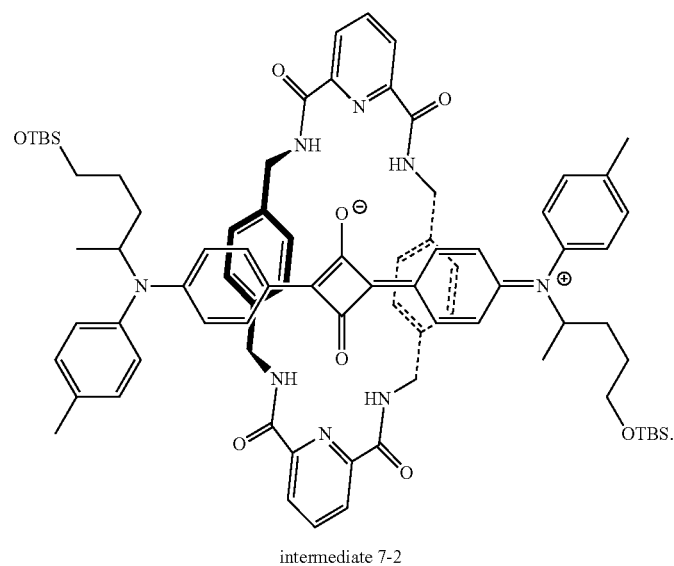
intermediate 7-2
A compound represented by Intermediate 7-2 was obtained according to the same method as Synthesis Example 2 except that a compound represented by Intermediate 7-1 was used instead of the compound represented by Intermediate 1-1.

Synthesis Example 27: Synthesis of Compound Represented by Intermediate 7-3
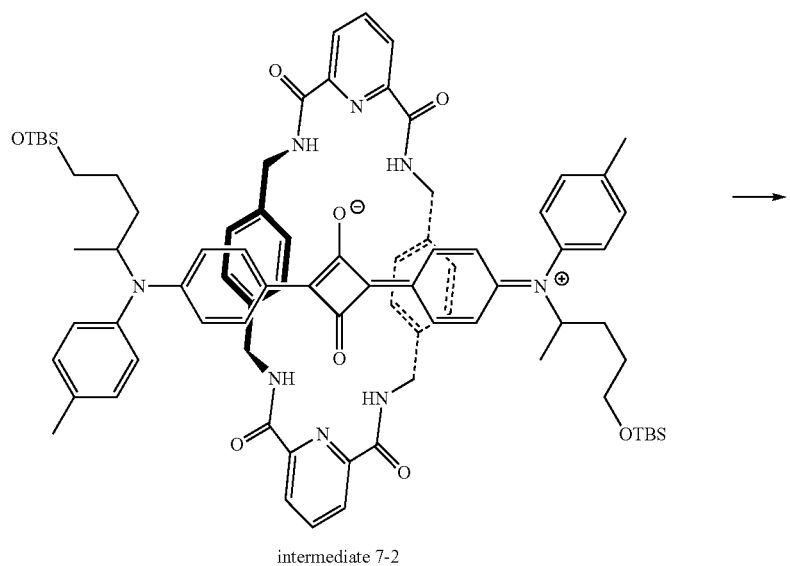
intermediate 7-2
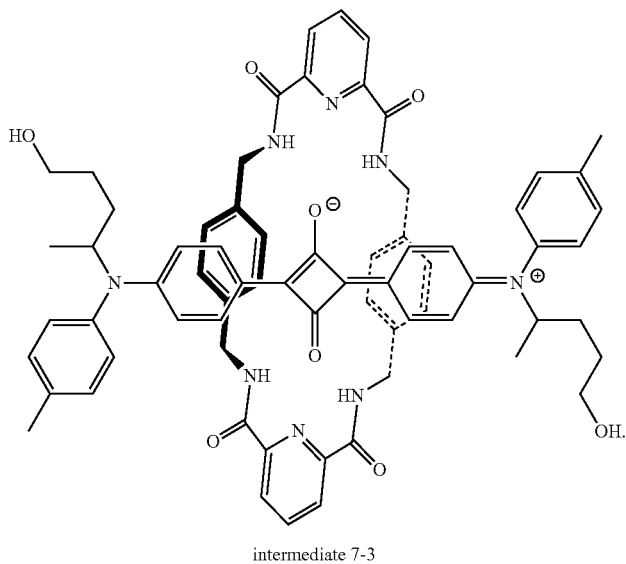
intermediate 7-3
A compound represented by Intermediate 7-3 was obtained according to the same method as Synthesis Example 3 except that a compound represented by Intermediate 7-2 was used instead of the compound represented by Intermediate 1-2.

Synthesis Example 28-1: Synthesis of Compound Represented by Chemical Formula G1

A compound represented by Chemical Formula G1 was obtained according to the same method as Synthesis Example 4-1 except that a compound represented by Intermediate 7-3 was used instead of the compound represented by Intermediate 1-3.

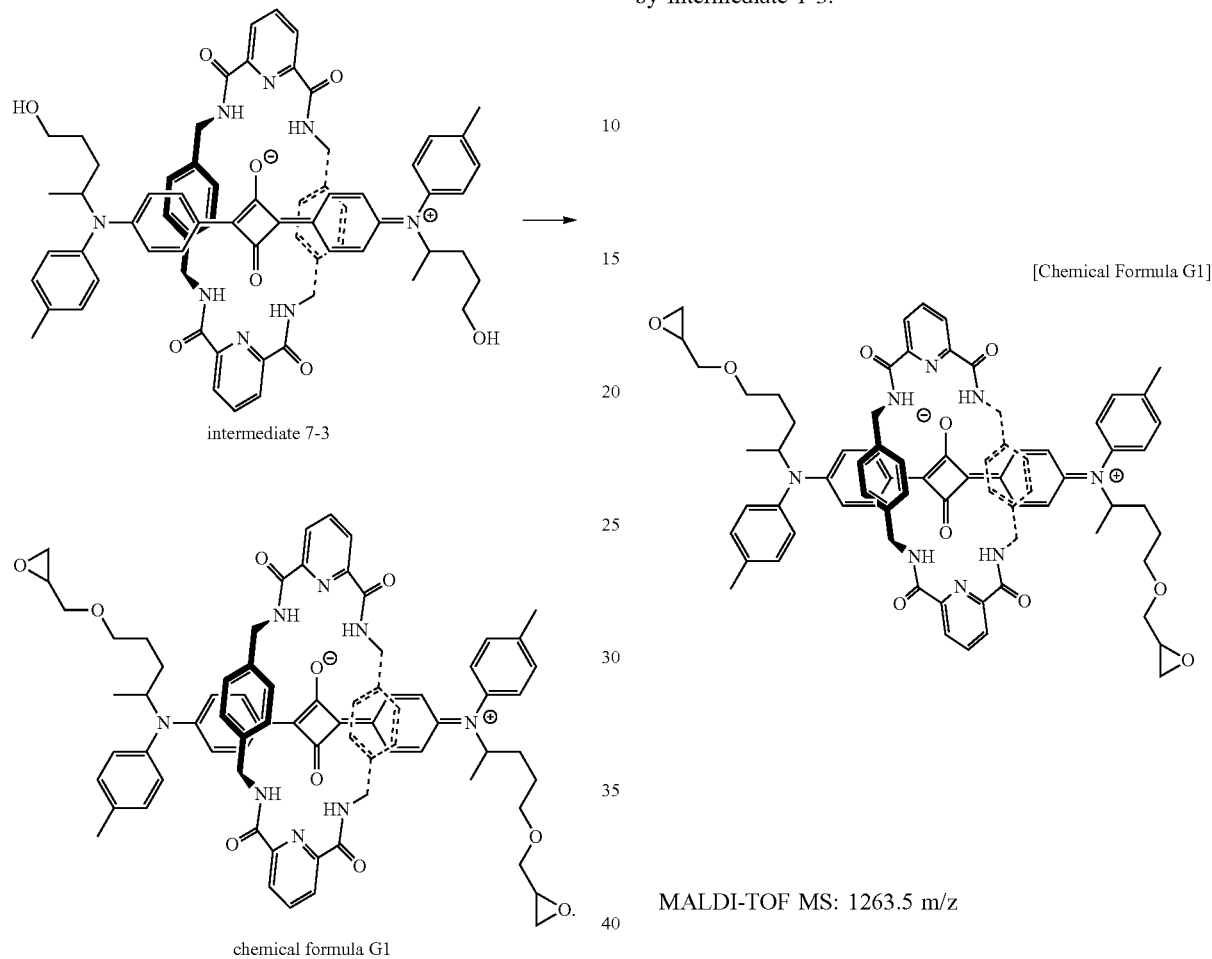

[Chemical Formula G1]

MALDI-TOF MS: 1263.5 m/z

Synthesis Example 28-2: Synthesis of Compound Represented by Chemical Formula G2

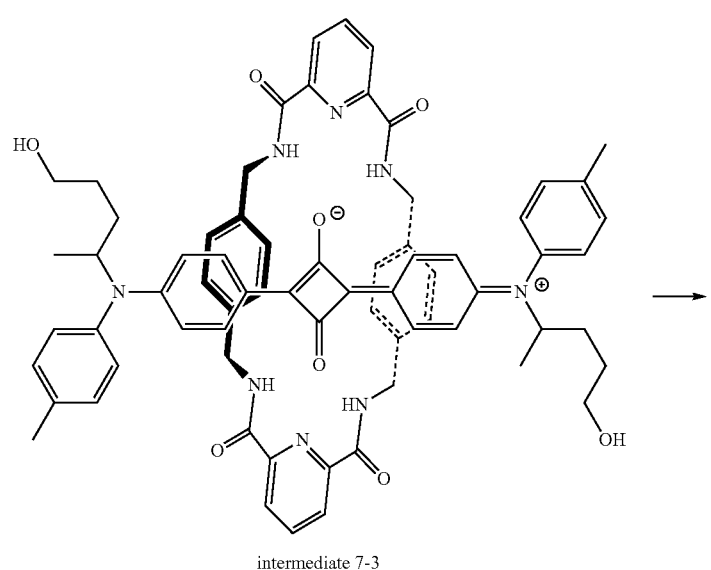

intermediate 7-3

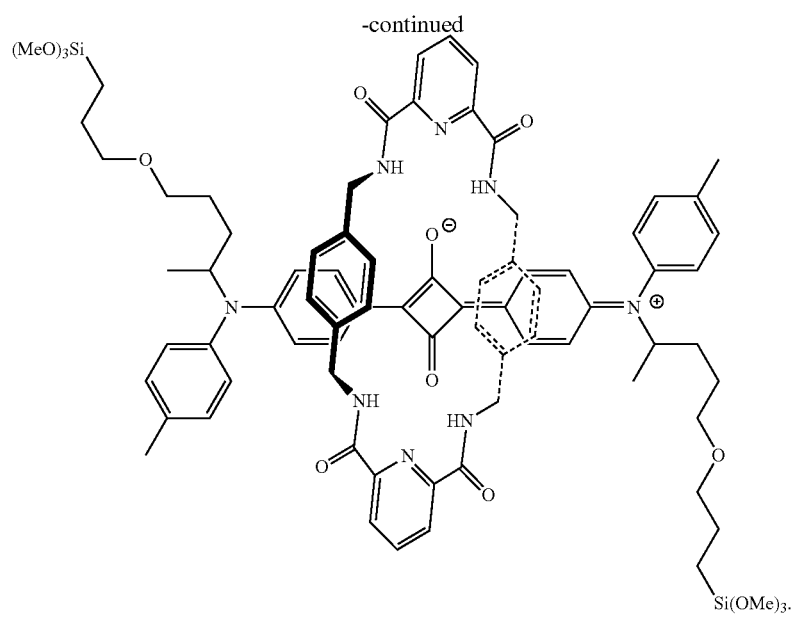
chemical formula G2
A compound represented by Chemical Formula G2 was obtained according to the same method as Synthesis Example 4-2 except that a compound represented by Intermediate 7-3 was used instead of the compound represented by Intermediate 1-3.
[Chemical Formula G2]
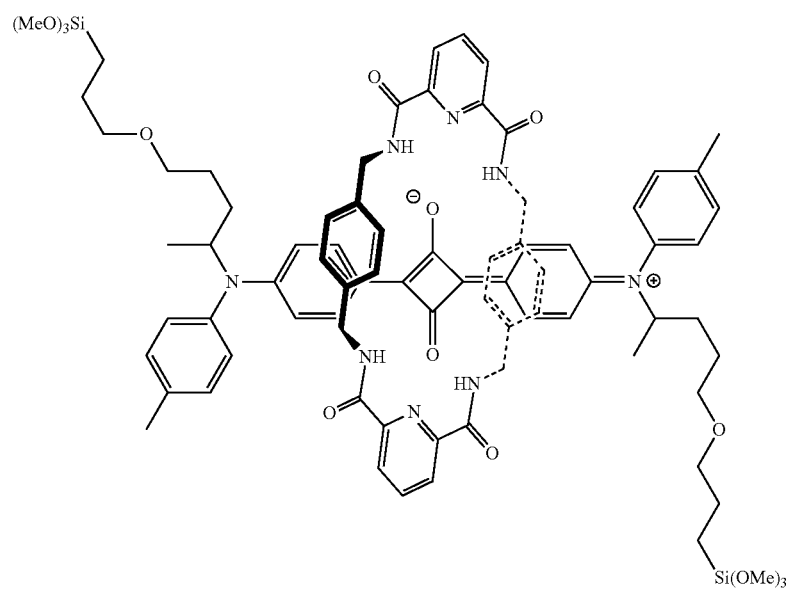
MALDI-TOF MS: 1475.8 m/z

Synthesis Example 29: Synthesis of Compound Represented by Intermediate 8-1

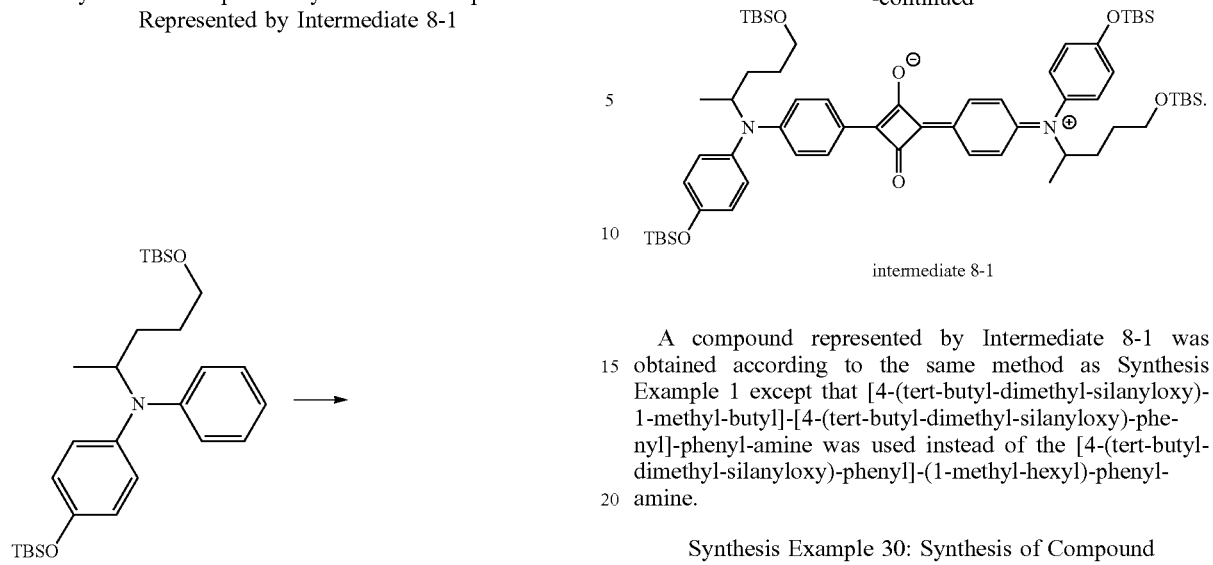

A compound represented by Intermediate 8-1 was obtained according to the same method as Synthesis Example 1 except that [4-(tert-butyl-dimethyl-silanyloxy)-1-methyl-butyl]-[4-(tert-butyl-dimethyl-silanyloxy)-phenyl]-phenyl-amine was used instead of the [4-(tert-butyl-dimethyl-silanyloxy)-phenyl]-(1-methyl-hexyl)-phenyl-amine.

Synthesis Example 30: Synthesis of Compound Represented by Intermediate 8-2

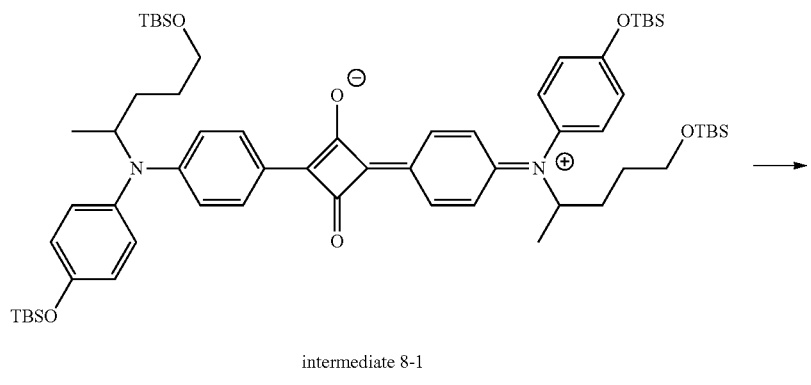

intermediate 8-1

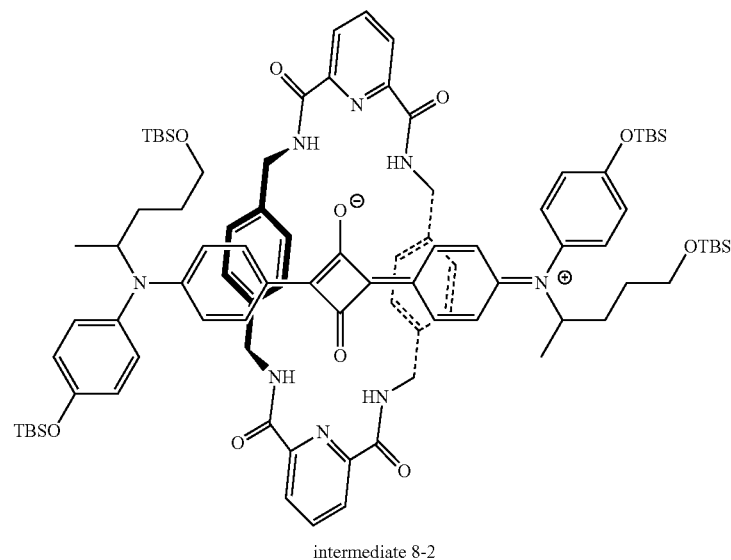

intermediate 8-2

A compound represented by Intermediate 8-2 was obtained according to the same method as Synthesis Example 2 except that a compound represented by Intermediate 8-1 was used instead of the compound represented by Intermediate 1-1.

Synthesis Example 31: Synthesis of Compound Represented by Intermediate 8-3

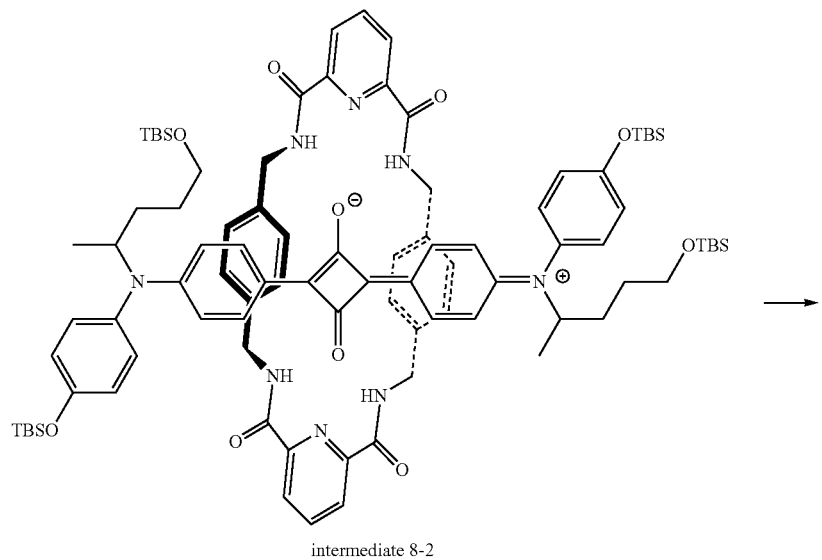

intermediate 8-2

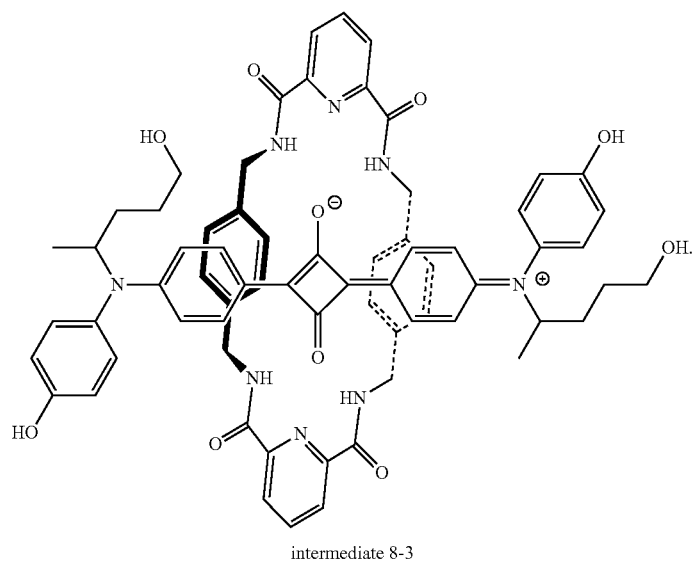

intermediate 8-3

The compound (5 mmol) represented by Intermediate 8-2 was dissolved in 50 mL of a tetrahydrofuran solvent, and tetrabutylammonium fluoride (22 mmol) was added thereto at ambient temperature. After 30 minutes, a product therein was separated through column chromatography, obtaining a compound represented by Intermediate 8-3.

Synthesis Example 32-1: Synthesis of Compound Represented by Chemical Formula H1

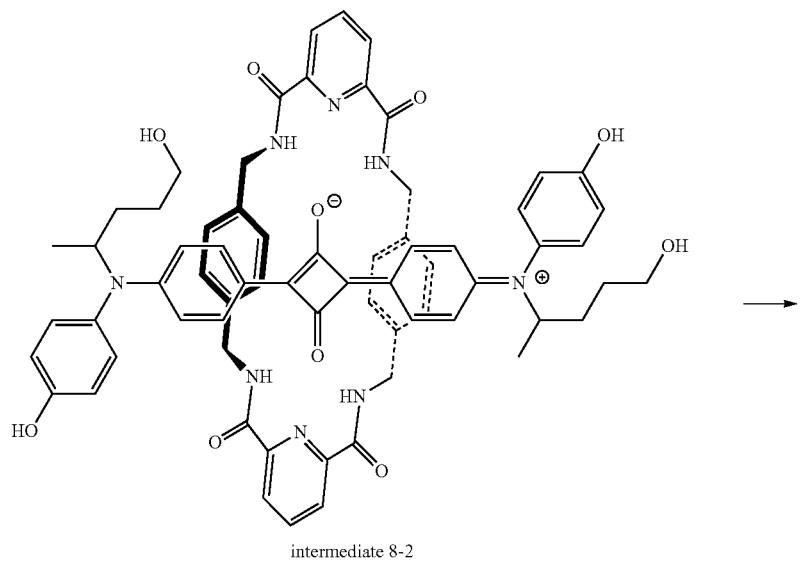

intermediate 8-2

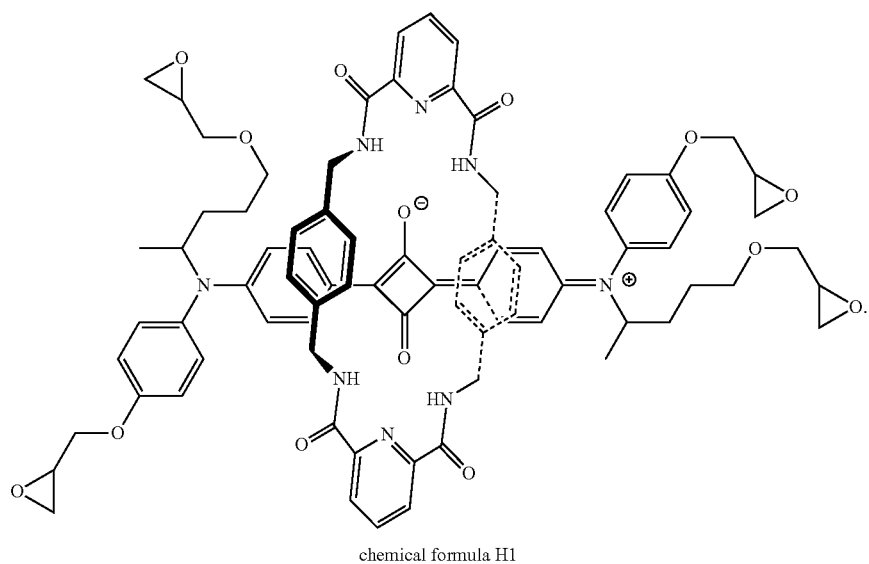

chemical formula H1

The compound (5 mmol) represented by Intermediate 8-3, KOH (50 mmol) and epichlorohydrin (100 mmol) were reacted in 25 mL of a dimethyl sulfoxide solvent for 2 hours and then, extracted with a 10% $NH_4Cl$ aqueous solution and ethyl acetate. An extract therefrom was separated through column chromatography, obtaining a compound represented by Chemical Formula HL.

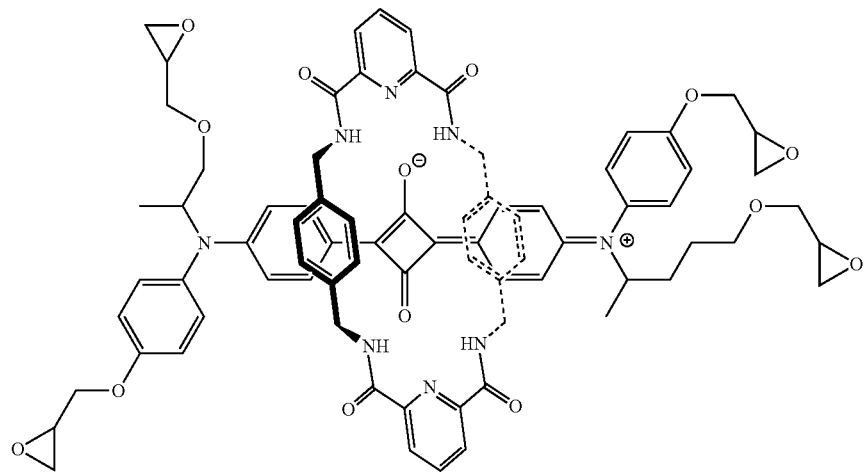
[Chemical Formula H1]
MALDI-TOF MS: 1379.6 m/z
Synthesis Example 32-2: Synthesis of Compound Represented by Chemical
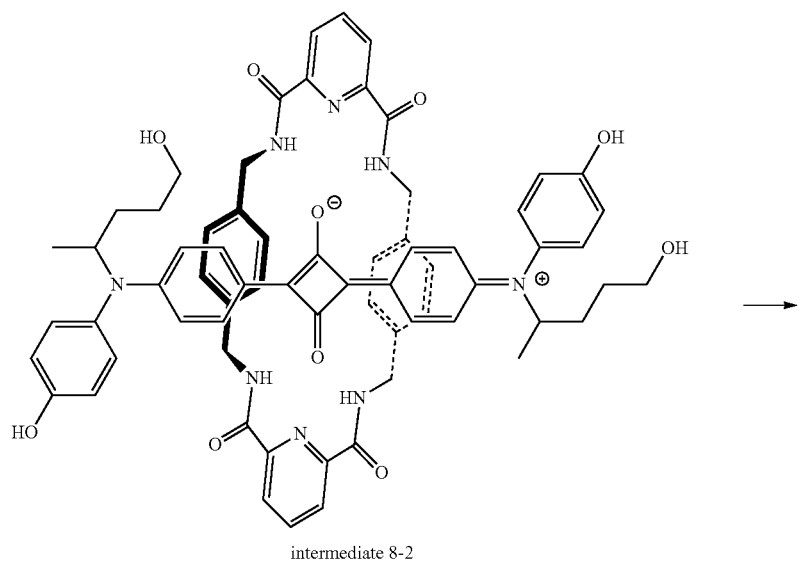
intermediate 8-2

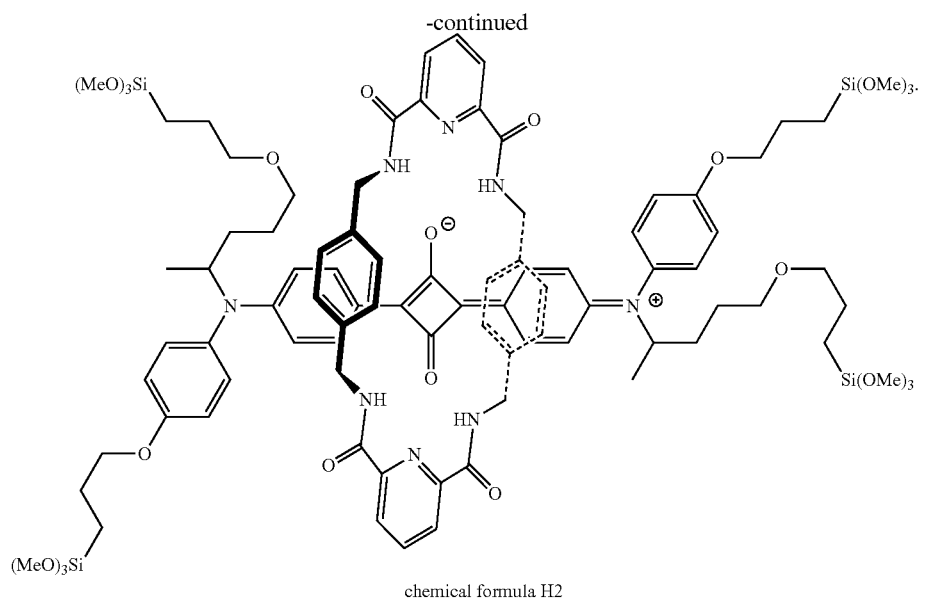

chemical formula H2

The compound represented by Intermediate 8-3 (5 mmol) and sodium hydride (30 mmol) were reacted in 25 mL of an N,N-dimethylformamide solvent for 1 hour, and (3-iodopropyl)trimethoxysilane (30 mmol) was added thereto and then, heated up to 50° C. After 8 hours, a product therefrom was separated through column chromatography, obtaining a compound represented by Chemical Formula H2.

[Chemical Formula H2]

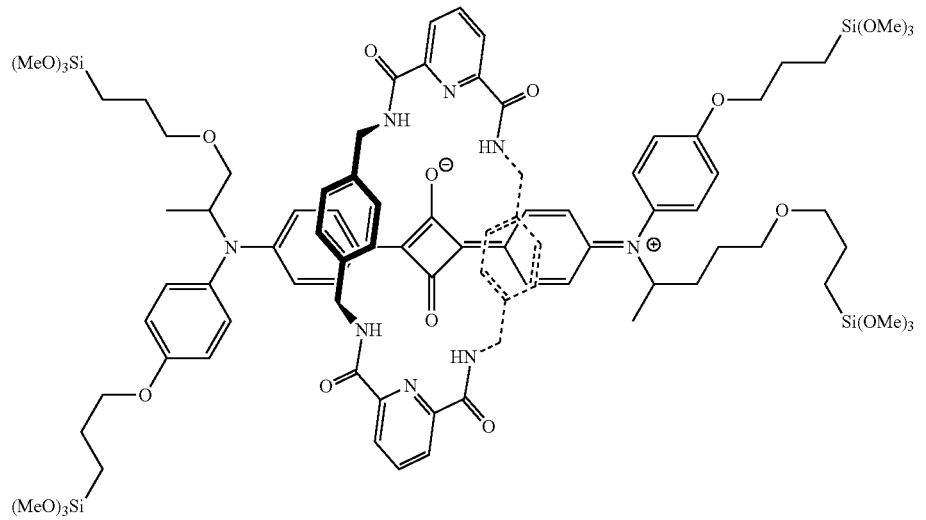

MALDI-TOF MS: 1804.3 m/z

Synthesis Example 33: Synthesis of Compound Represented by Intermediate 9-1

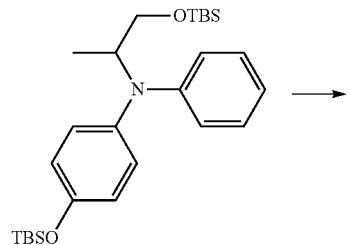

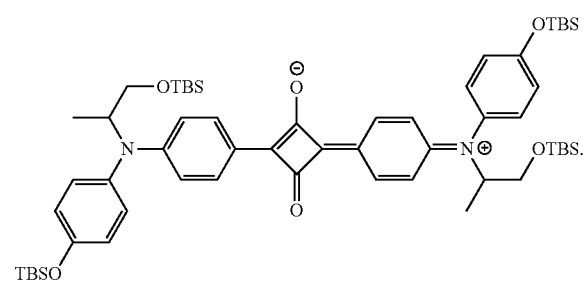

intermediate 9-1

A compound represented by Intermediate 9-1 was obtained according to the same method as Synthesis Example 1 except that [2-(tert-butyl-dimethyl-silanyloxy)-1-methyl-ethyl]-[4-(tert-butyl-dimethyl-silanyloxy)-phenyl]-phenyl-amine was used instead of the [4-(tert-butyl-dimethyl-silanyloxy)-phenyl]-(1-methyl-hexyl)-phenyl-amine.

Synthesis Example 34: Synthesis of Compound Represented by Intermediate 9-2

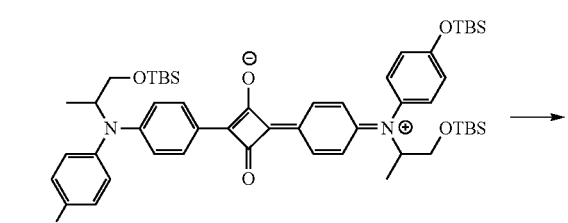

intermediate 9-1

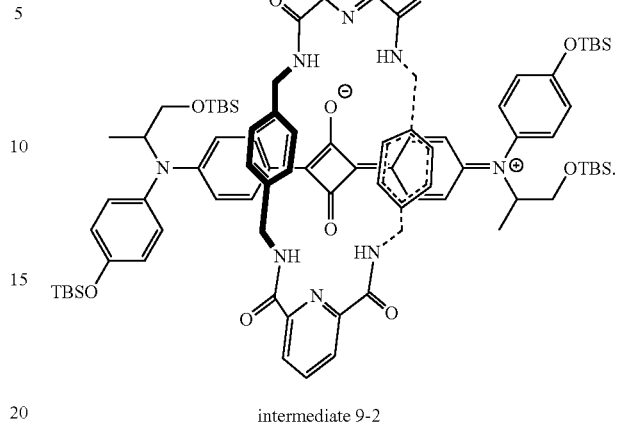

intermediate 9-2

A compound represented by Intermediate 9-2 was obtained according to the same method as Synthesis Example 2 except that a compound represented by Intermediate 9-1 was used instead of the compound represented by Intermediate 1-1.

Synthesis Example 35: Synthesis of Compound Represented by Intermediate 9-3

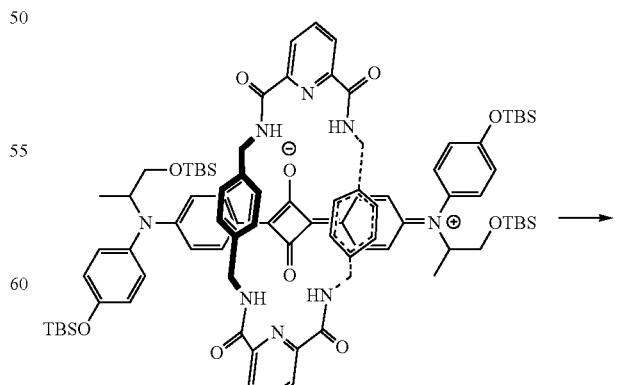

intermediate 9-2

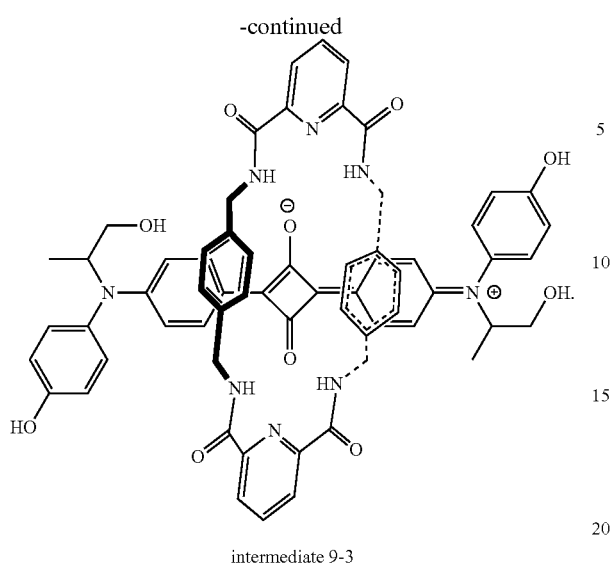
intermediate 9-3
A compound represented by Intermediate 9-3 was obtained according to the same method as Synthesis Example 31 except that a compound represented by Intermediate 9-2 was used instead of the compound represented by Intermediate 8-2.
Synthesis Example 36-1: Synthesis of Compound Represented by Chemical Formula I1
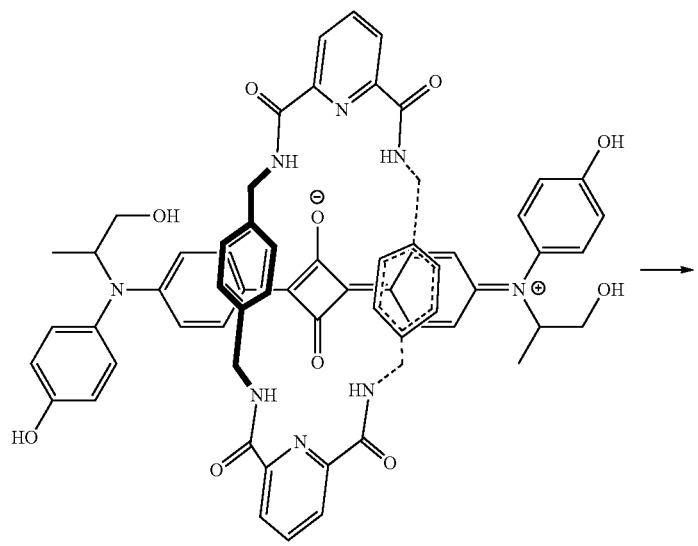
intermediate 9-3

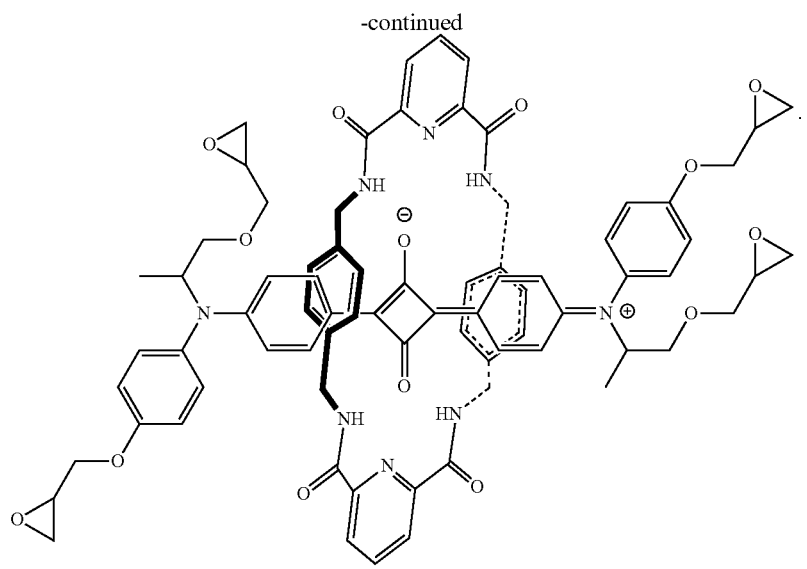
chemical formula I1
A compound represented by Chemical Formula I1 was obtained according to the same method as Synthesis Example 32-1 except that a compound represented by Intermediate 9-3 was used instead of the compound represented by Intermediate 8-3.
[Chemical Formula I1]
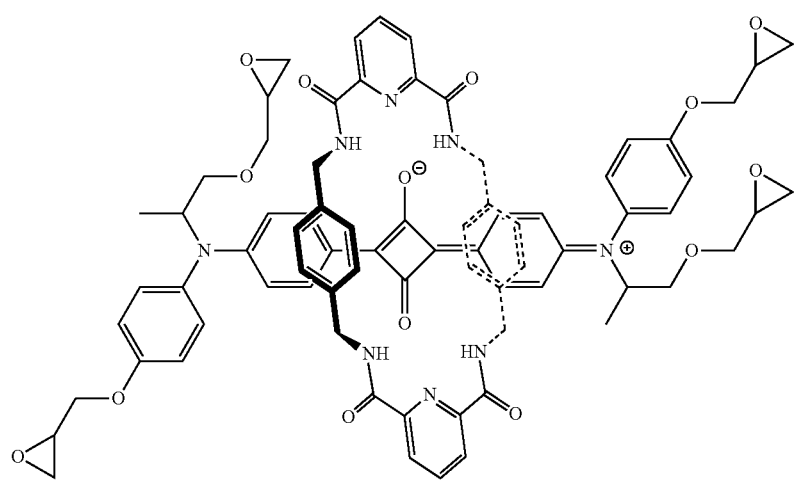
MALDI-TOF MS: 1323.5 m/z Synthesis Example 36-2: Synthesis of Compound Represented by Chemical Formula I2
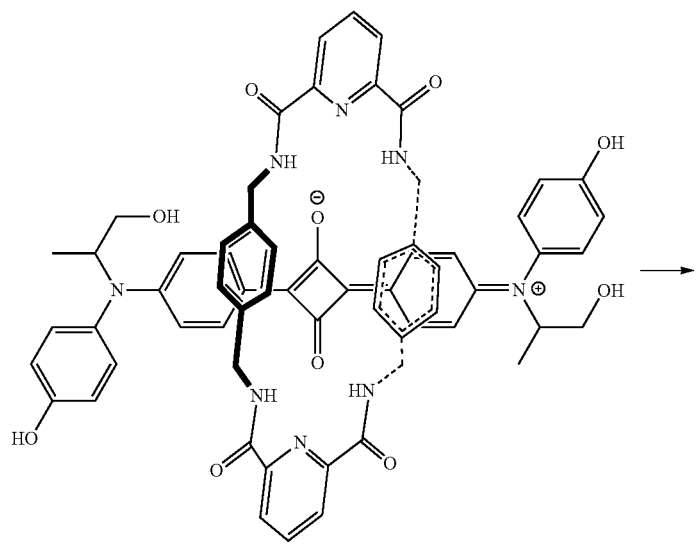
intermediate 9-3
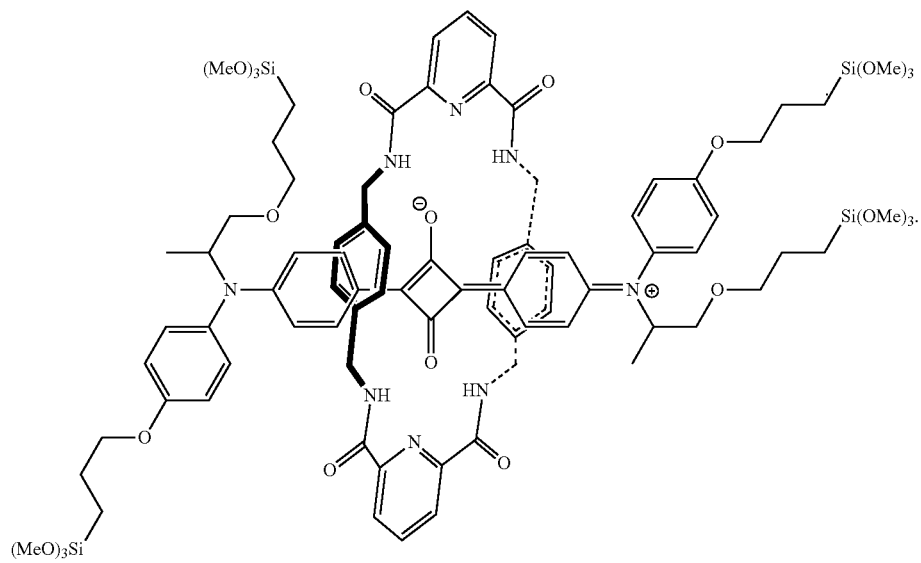
chemical formula I2
A compound represented by Chemical Formula 12 was obtained according to the same method as Synthesis Example 32-2 except that a compound represented by Intermediate 9-3 was used instead of the compound represented by Intermediate 8-3.

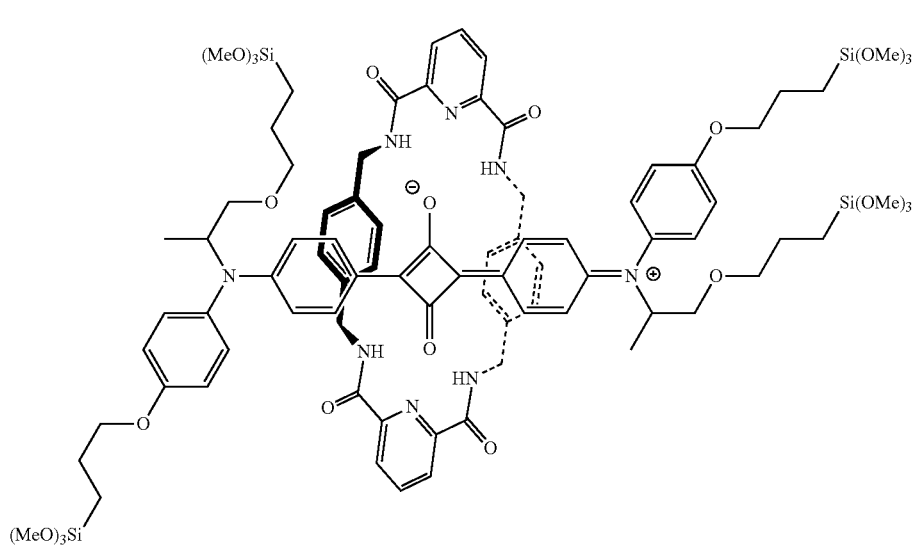

MALDI-TOF MS: 1748.2 m/z

Synthesis Example 37: Synthesis of Compound Represented by Intermediate 10-1

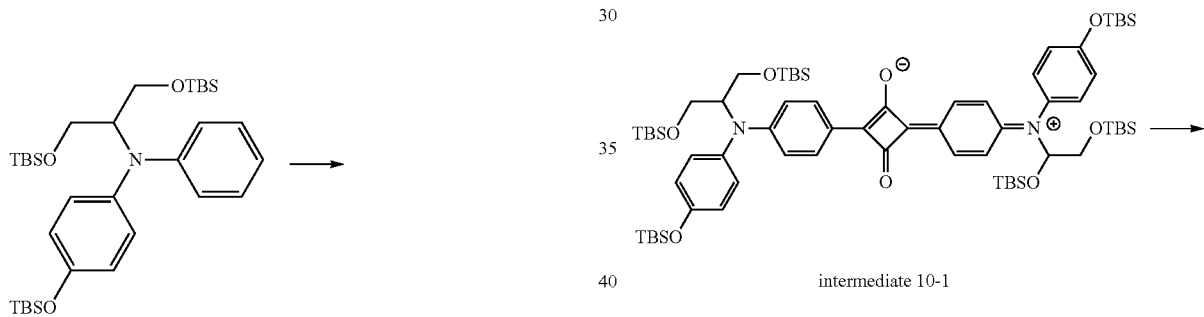

intermediate 10-1

A compound represented by Intermediate 10-1 was obtained according to the same method as Synthesis Example 1 except that [2-(tert-butyl-dimethyl-silanyloxy)-1-(tert-butyl-dimethyl-silanyloxymethyl)-ethyl]-[4-(tert-butyl-dimethyl-silanyloxy)-phenyl]-phenyl-amine was used instead of the [4-(tert-butyl-dimethyl-silanyloxy)-phenyl]-(1-methyl-hexyl)-phenyl-amine.

Synthesis Example 38: Synthesis of Compound Represented by Intermediate 10-2

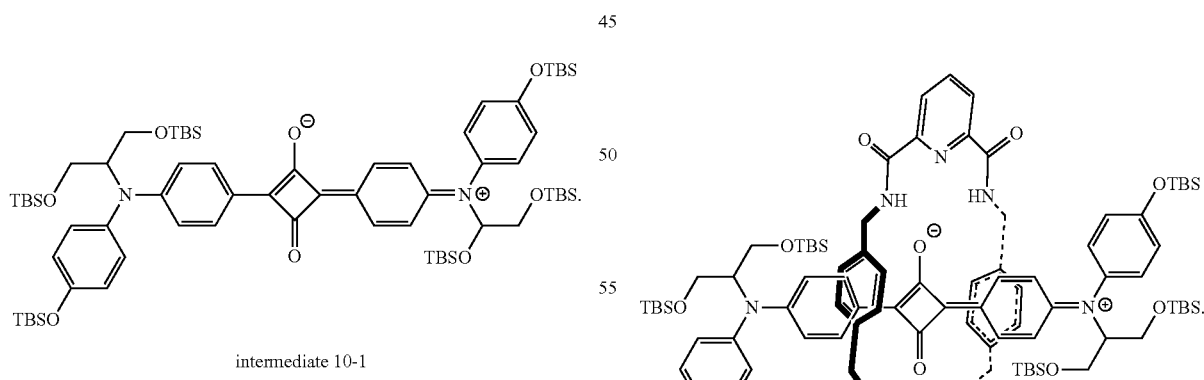

intermediate 10-1 intermediate 10-2

A compound represented by Intermediate 10-2 was obtained according to the same method as Synthesis Example 2 except that a compound represented by Intermediate 10-1 was used instead of the compound represented by Intermediate 1-1.

Synthesis Example 39: Synthesis of Compound Represented by Intermediate 10-3

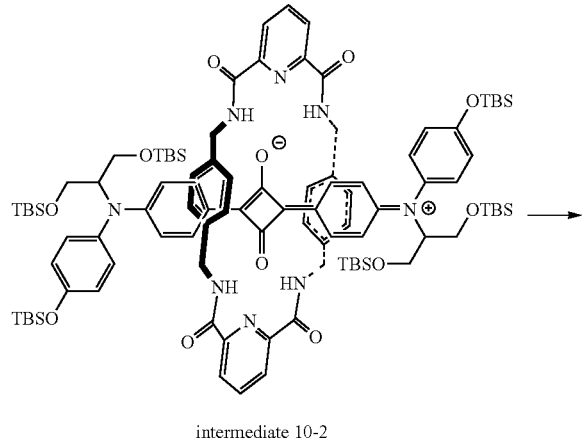

intermediate 10-2

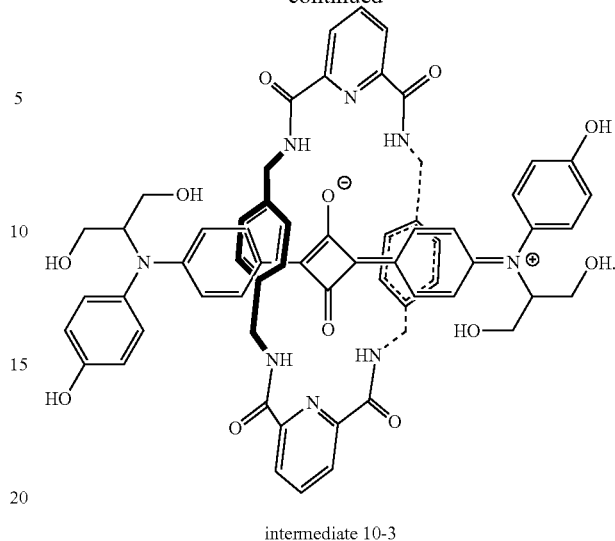

intermediate 10-3

The compound (5 mmol) represented by Intermediate 10-2 was dissolved in 50 mL of a tetrahydrofuran solvent, and tetrabutylammonium fluoride (44 mmol) was added thereto at ambient temperature. After 30 minutes, a product therein was separated through column chromatography, obtaining a compound represented by Intermediate 10-3.

Synthesis Example 40-1: Synthesis of Compound Represented by Chemical Formula J1

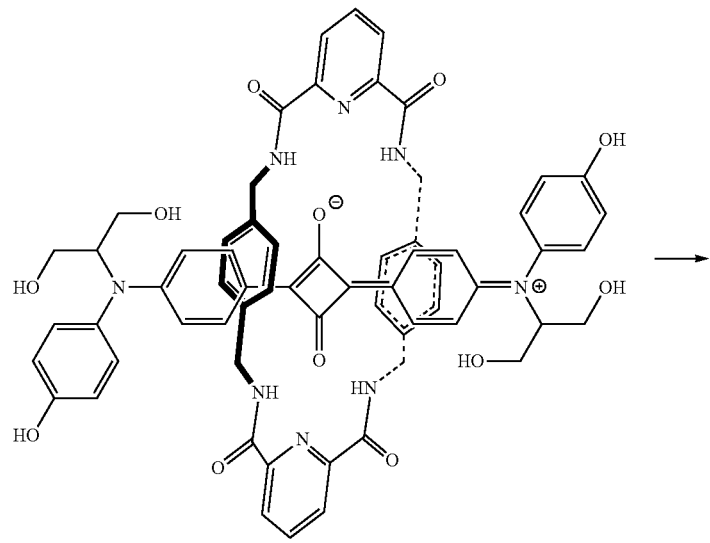

intermediate 10-3

-continued

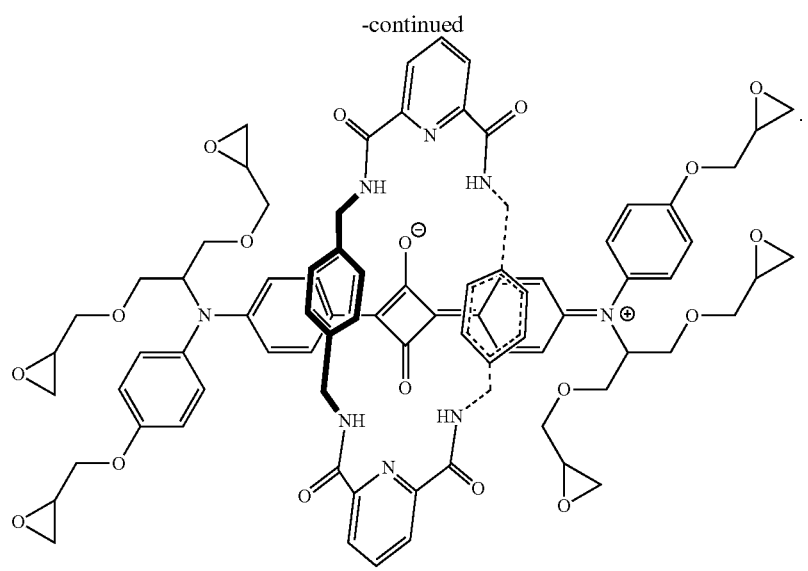

chemical formula J1

The compound (5 mmol) represented by Intermediate 10-3, KOH (100 mmol), and epichlorohydrin (200 mmol) were reacted in 25 mL of a dimethyl sulfoxide solvent for 2 hours and then, extracted with a 10% $NH_4Cl$ aqueous solution and ethyl acetate. An extract therefrom was separated through column chromatography, obtaining a compound represented by Chemical Formula J1.

[Chemical Formula J1]

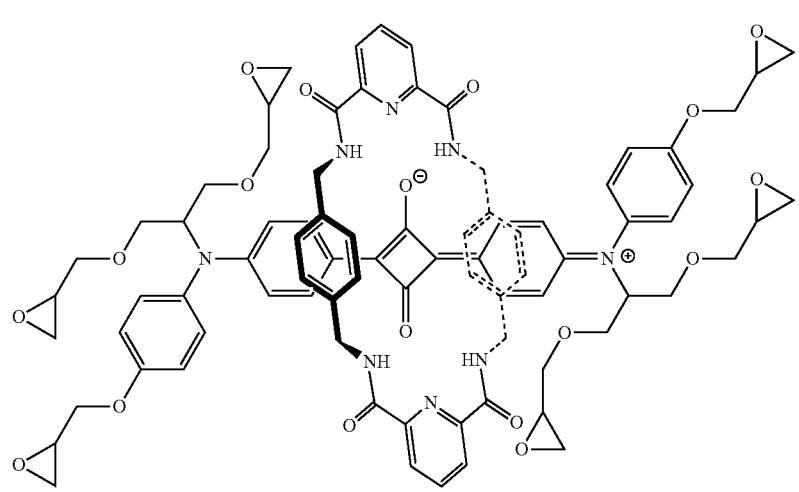

MALDI-TOF MS: 1468.5 m/z

Synthesis Example 40-2: Synthesis of Compound Represented by Chemical

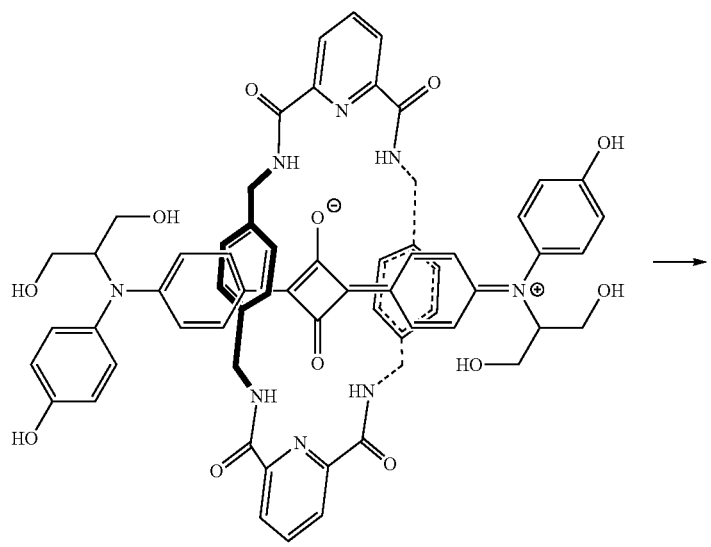

intermediate 10-3

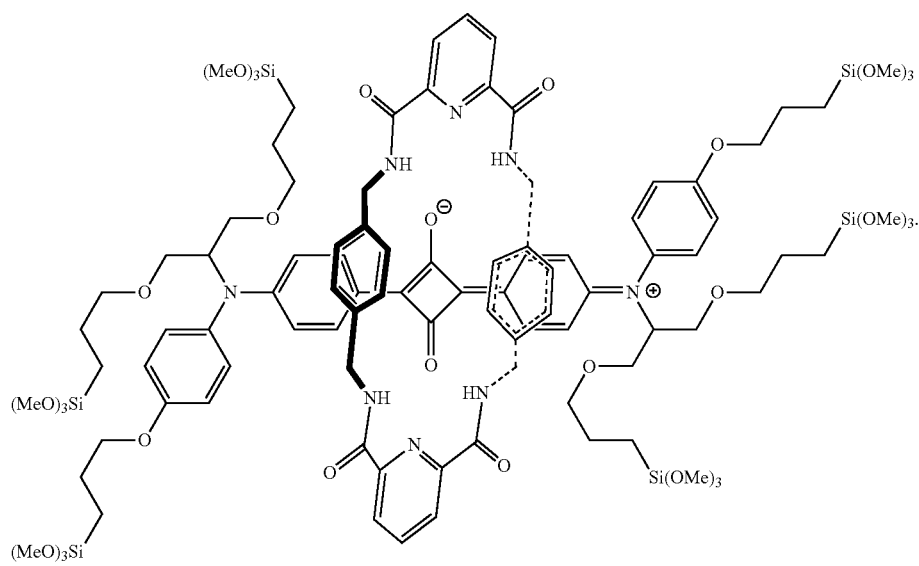

chemical formula J2

The compound (5 mmol) represented by Intermediate 10-3 and sodium hydride (45 mmol) were reacted in 25 mL of an N,N-dimethylformamide solvent for 1 hour, and (3-Iodopropyl)trimethoxysilane (45 mmol) was added thereto and then, heated up to 50° C. After 8 hours, a product therefrom was separated through column chromatography, obtaining a compound represented by Chemical Formula J2.

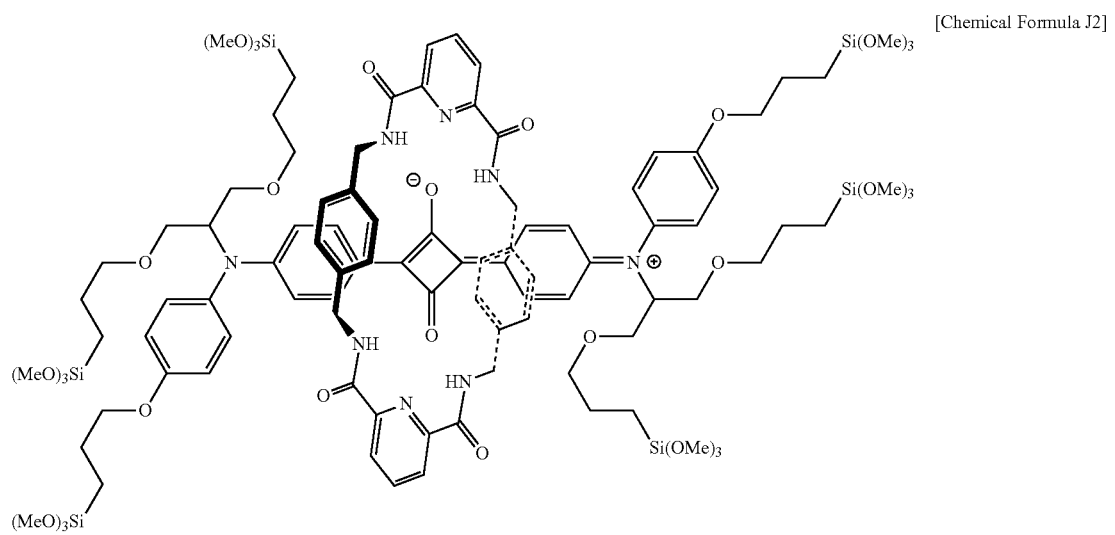

[Chemical Formula J2]

MALDI-TOF MS: 2105.1 m/z

Synthesis Example 41: Synthesis of Compound Represented by Intermediate 11-1

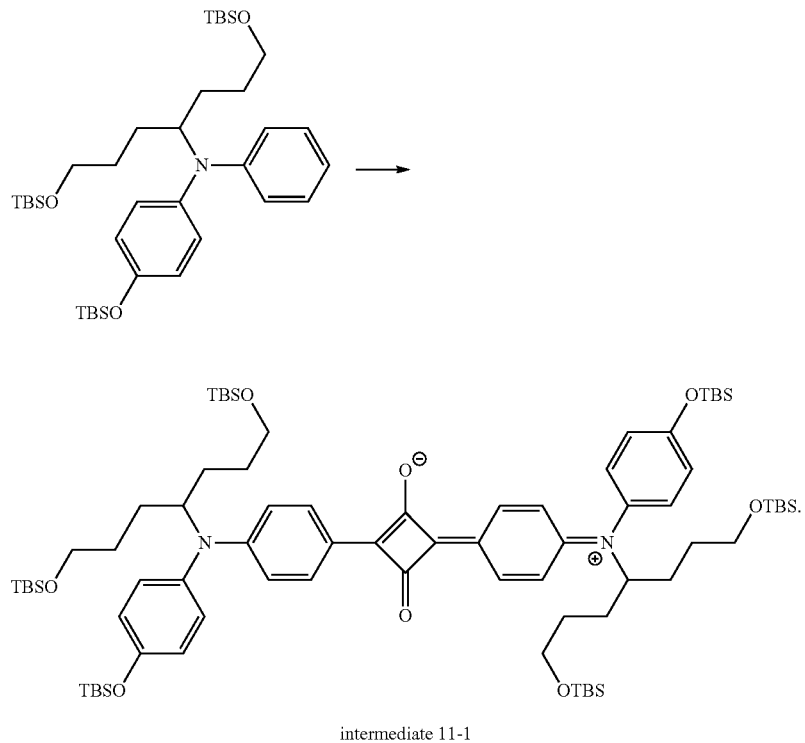

intermediate 11-1

A compound represented by Intermediate 11-1 was obtained according to the same method as Synthesis Example 1 except {4-(tert-butyl-dimethyl-silanyloxy)-1-[3-(tert-butyl-dimethyl-silanyloxy)-propyl]-butyl}-[4-(tert-butyl-dimethyl-silanyloxy)-phenyl]-phenyl-amine was used instead of the [4-(tert-butyl-dimethyl-silanyloxy)-phenyl]-(1-methyl-hexyl)-phenyl-amine.

Synthesis Example 42: Synthesis of Compound Represented by Intermediate 11-2
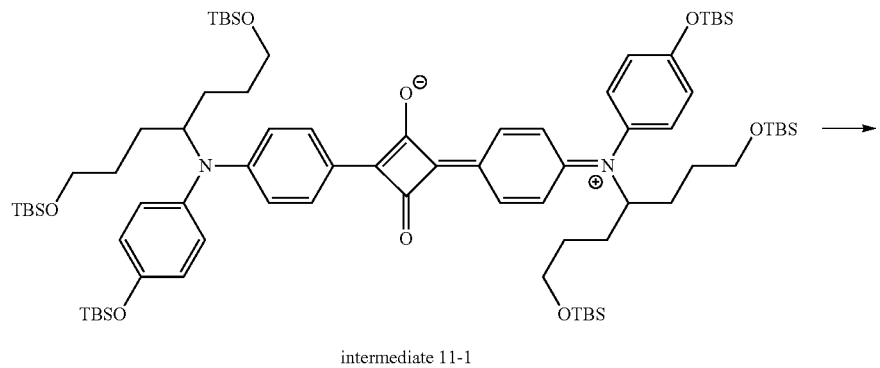
intermediate 11-1
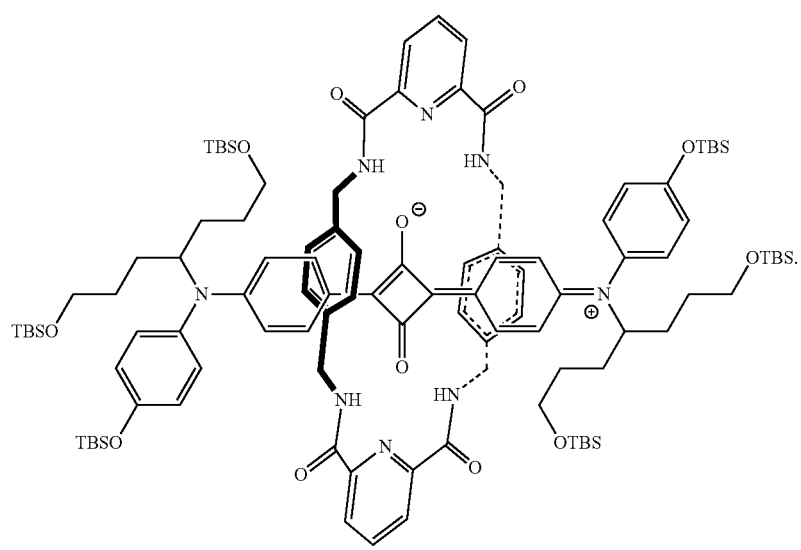
intermediate 11-2
A compound represented by Intermediate 11-2 was obtained according to the same method as Synthesis Example 2 except that a compound represented by Intermediate 11-1 was used instead of the compound represented by Intermediate 1-1.

Synthesis Example 43: Synthesis of Compound Represented by Intermediate 11-3
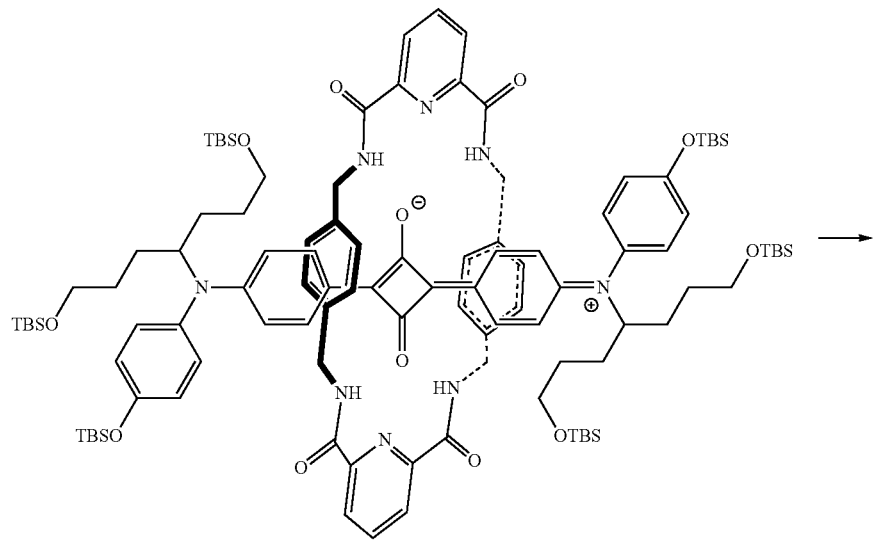
intermediate 11-2
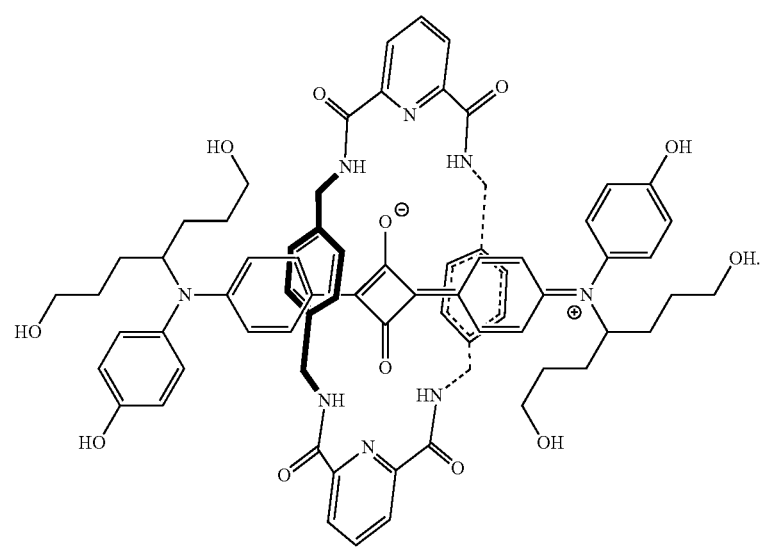
intermediate 11-3
A compound represented by Intermediate 11-3 was obtained according to the same method as Synthesis Example 39 except that a compound represented by Intermediate 11-2 was used instead of the compound represented by Intermediate 10-2.

Synthesis Example 44-1: Synthesis of Compound Represented by Chemical Formula K1
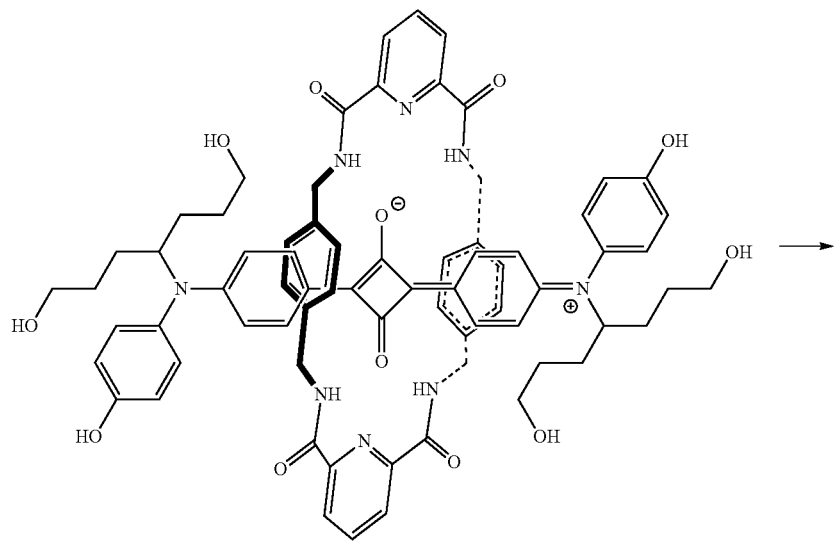
intermediate 11-3
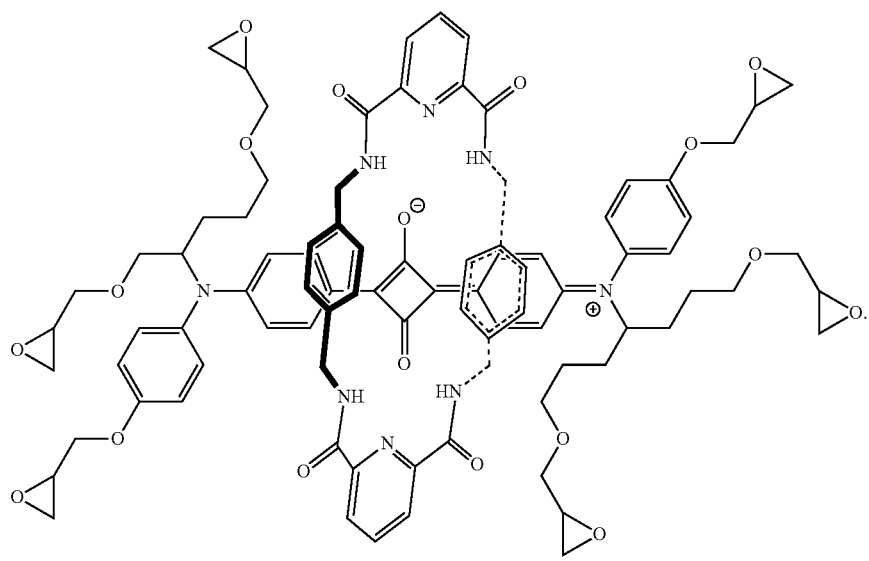
chemical formula K1
A compound represented by Chemical Formula K1 was obtained according to the same method as Synthesis Example 40-1 except that a compound represented by Intermediate 11-3 was used instead of the compound represented by Intermediate 10-3.

[Chemical Formula K1]
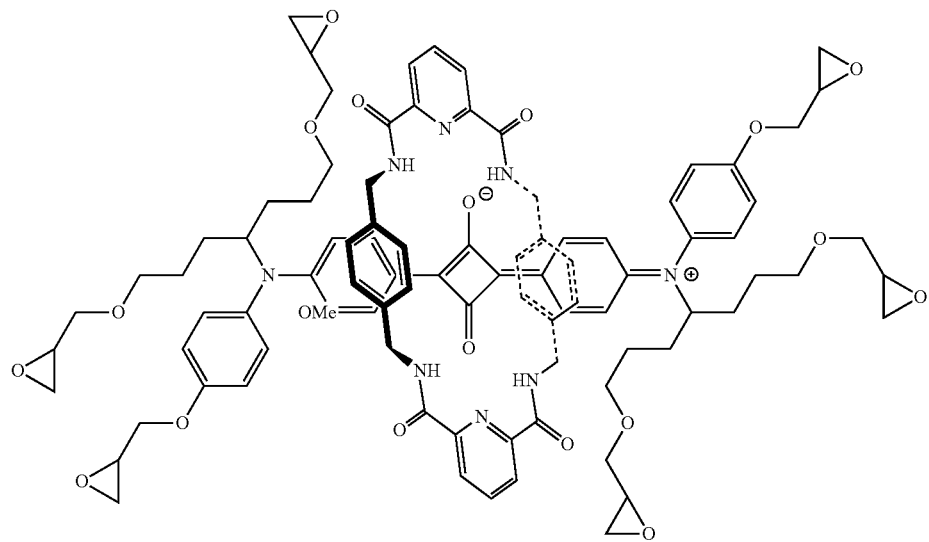
MALDI-TOF MS: 1579.8 m/z
Synthesis Example 44-2: Synthesis of Compound Represented by Chemical Formula K2
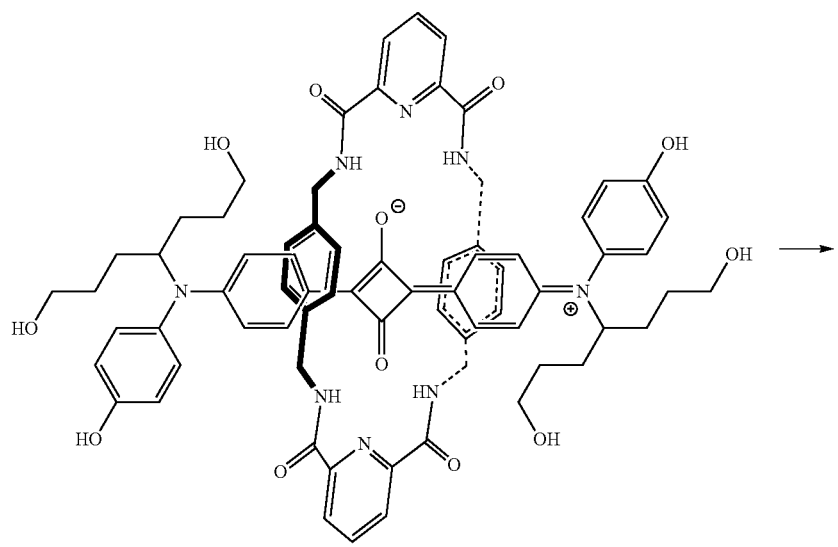
intermediate 11-3

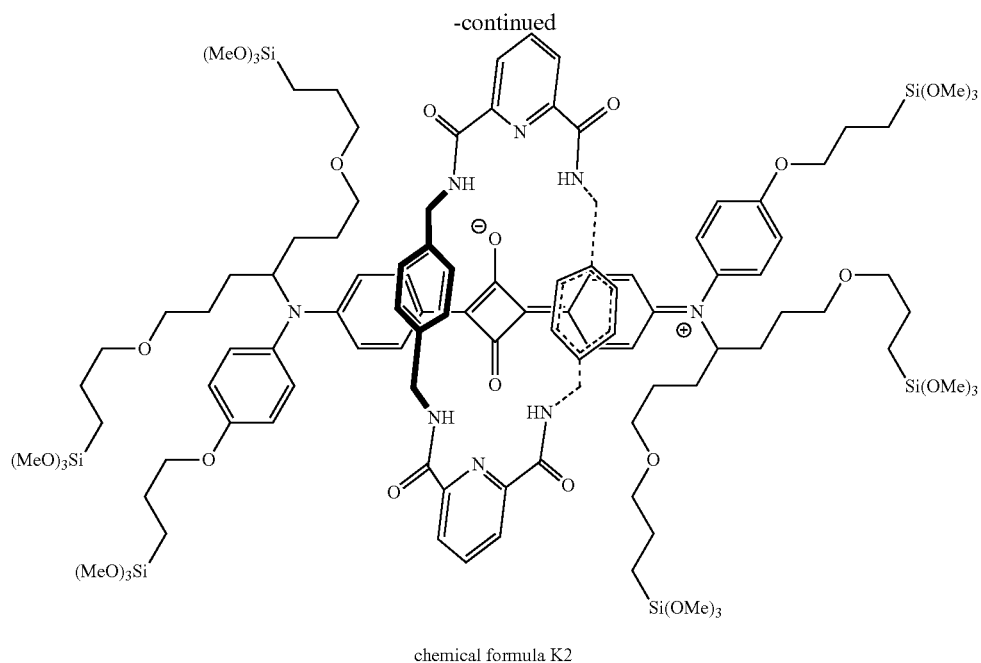

chemical formula K2

A compound represented by Chemical Formula K2 was obtained according to the same method as Synthesis Example 40-2 except that a compound represented by Intermediate 11-3 was used instead of the compound represented by Intermediate 10-3.

[Chemical Formula K2]

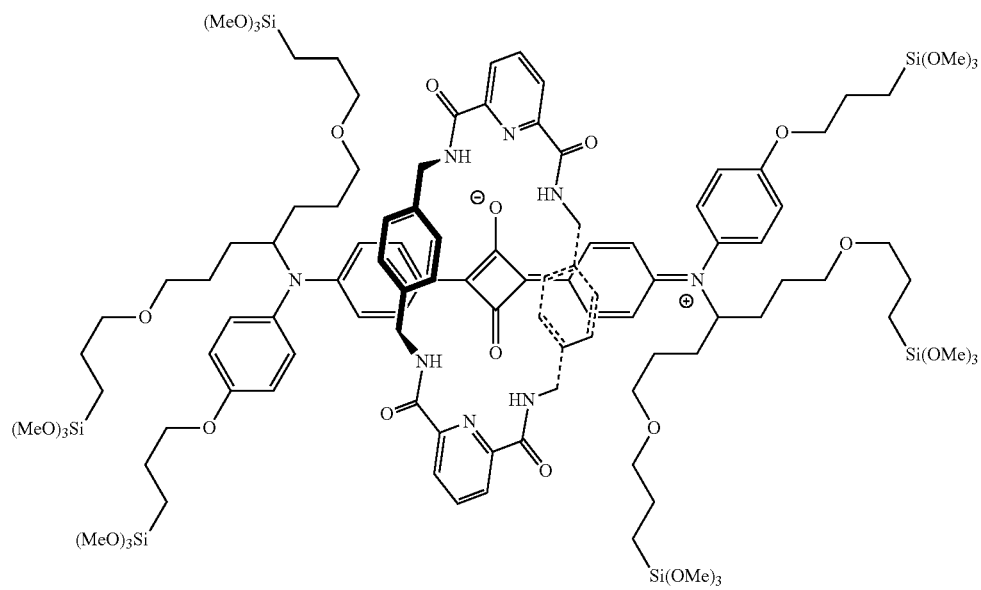

MALDI-TOF MS: 2217.0 m/z

Comparison Synthesis Example 1: Synthesis of Compound Represented by Chemical Formula C-1

(1-methyl-hexyl)-phenyl-p-tolyl-amine (100 mmol) and 3,4-dihydroxy-cyclobut-3-ene-1,2-dione (50 mmol) were added to toluene (300 mL) and butanol (300 mL) and then, refluxed, and water produced therein was removed with a Dean-stark distillation apparatus. After 12 hours, the reactant was stirred, distilled under a reduced pressure, and purified through column chromatography, obtaining a squarylium compound. This compound (5 mmol) was dissolved in 600 mL of a chloroform solvent, and a solution prepared by dissolving pyridine-2,6-dicarbonyl dichloride (20 mmol) and p-xylylenediamine (20 mmol) in 60 mL of chloroform was added dropwise thereto at ambient temperature for 5 hours. After 12 hours, a product therefrom was distilled under a reduced pressure and separated through column chromatography, obtaining a compound represented by Chemical Formula C-1.

[Chemical Formula C-1]

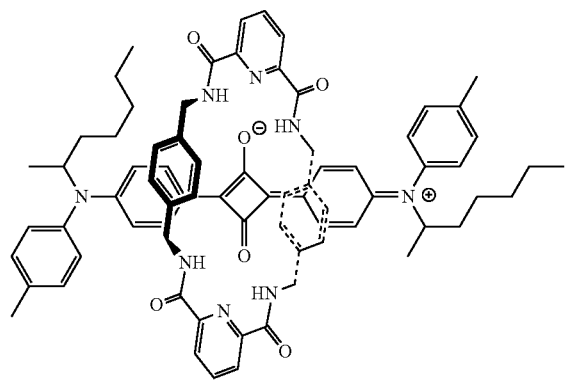

MALDI-TOF MS: 1175.5 m/z

Comparison Synthesis Example 2: Synthesis of Compound Represented by Chemical Formula C-2

Propionic acid 2-{(2-cyano-ethyl)-[4-(2-hydroxy-3,4-dioxo-cyclobut-1-enyl)-phenyl]-amino}-ethyl ester (60 mmol) and 1-(2-ethyl-hexyl)-1H-indole (60 mmol) were added to toluene (200 mL) and butanol (200 mL) and then, refluxed to remove water generated therefrom with a Dean-stark distiller. After stirring for 12 hours, the green reactant was distilled under a reduced pressure and purified through column chromatography to obtain an asymmetric squarylium-based compound. This compound (5 mmol) was dissolved in 600 mL of a chloroform solvent, pyridine-2,6-dicarbonyl dichloride (20 mmol) and p-xylylenediamine (20 mmol) were dissolved in 60 mL of chloroform, and then, the obtained solutions were simultaneously added dropwise at ambient temperature for 5 hours. After 12 hours, the obtained mixture was distilled under a reduced pressure and purified through column chromatography to obtain a compound represented by Chemical Formula C-2.

[Chemical Formula C-2]

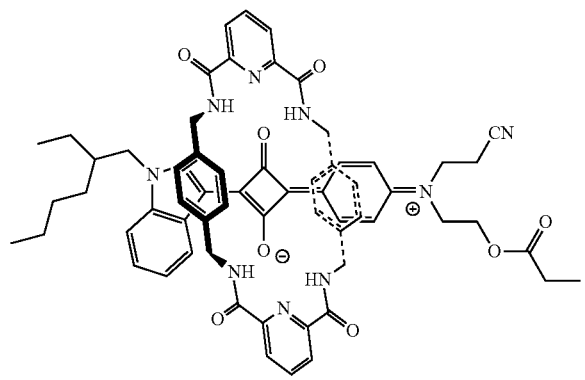

MALDI-TOF MS: 1088.48 m/z

Synthesis of Photosensitive Resin Composition

Example 1-1

The following components were mixed in each composition shown in Table 1 to prepare a photosensitive resin composition according to Example 1-1.

Specifically, a photopolymerization initiator was dissolved in a solvent, the solution was stirred at ambient temperature for 2 hours, a binder resin and a photopolymerizable monomer were added thereto, and the obtained mixture was stirred at ambient temperature for 2 hours. Subsequently, the compound (represented by Chemical Formula A1) according to Synthesis Example 4-1 as a colorant was added thereto and then, stirred for 1 hour at ambient temperature. Then, the product was three times filtered to remove impurities and prepare a photosensitive resin composition.

TABLE 1

| | Raw materials | Amount (unit: wt %) |
|---|---|---|
| Colorant Dye | Compound of Synthesis Example 4-1 | 20 |
| Binder resin | (A)/(B) = 15/85 (w/w), Molecular weight(Mw) = 22,000 g/mol (A): methacrylic acid (B): benzylmethacrylate | 3.5 |
| Photopolymerizable monomer | Dipentaerythritolhexaacrylate (DPHA) | 8.0 |
| Photopolymerization initiator | 1,2-octandione | 1.0 |
| | 2-dimethylamino-2-(4-methyl-benzyl)-1-(4-morpholin-4-yl-phenyl)-butan-l-one | 0.5 |
| Solvent | cyclohexanone | 37.0 |
| | PGMEA (Propylene Glycol Monomethyl Ether Acetate) | 30.0 |
| Total | | 100.00 |

Example 2-1

A photosensitive resin composition was prepared according to the same method as Example 1-1 except that the compound (represented by Chemical Formula B1) according to Synthesis Example 8-1 was used instead of the compound (represented by Chemical Formula A1) according to Synthesis Example 4-1.

Example 3-1

A photosensitive resin composition was prepared according to the same method as Example 1-1 except that the compound (represented by Chemical Formula C1) according to Synthesis Example 12-1 was used instead of the compound (represented by Chemical Formula A1) according to Synthesis Example 4-1.

Example 4-1

A photosensitive resin composition was prepared according to the same method as Example 1-1 except that the compound (represented by Chemical Formula D1) according to Synthesis Example 16-1 was used instead of the compound (represented by Chemical Formula A1) according to Synthesis Example 4-1.

Example 5-1

A photosensitive resin composition was prepared according to the same method as Example 1-1 except that the compound (represented by Chemical Formula E1) according to Synthesis Example 20-1 was used instead of the compound (represented by Chemical Formula A1) according to Synthesis Example 4-1.

Example 6-1

A photosensitive resin composition was prepared according to the same method as Example 1-1 except that the compound (represented by Chemical Formula F1) according to Synthesis Example 24-1 was used instead of the compound (represented by Chemical Formula A1) according to Synthesis Example 4-1.

Example 7-1

A photosensitive resin composition was prepared according to the same method as Example 1-1 except that the compound (represented by Chemical Formula G1) according to Synthesis Example 28-1 was used instead of the compound (represented by Chemical Formula A1) according to Synthesis Example 4-1.

Example 8-1

A photosensitive resin composition was prepared according to the same method as Example 1-1 except that the compound (represented by Chemical Formula H1) according to Synthesis Example 32-1 was used instead of the compound (represented by Chemical Formula A1) according to Synthesis Example 4-1.

Example 9-1

A photosensitive resin composition was prepared according to the same method as Example 1-1 except that the compound (represented by Chemical Formula I1) according to Synthesis Example 36-1 was used instead of the compound (represented by Chemical Formula A1) according to Synthesis Example 4-1.

Example 10-1

A photosensitive resin composition was prepared according to the same method as Example 1-1 except that the compound (represented by Chemical Formula J1) according to Synthesis Example 40-1 was used instead of the compound (represented by Chemical Formula A1) according to Synthesis Example 4-1.

Example 11-1

A photosensitive resin composition was prepared according to the same method as Example 1-1 except that the compound (represented by Chemical Formula K1) according to Synthesis Example 44-1 was used instead of the compound (represented by Chemical Formula A1) according to Synthesis Example 4-1.

Example 1-2

A photosensitive resin composition was prepared according to the same method as Example 1-1 except that the compound (represented by Chemical Formula A2) according to Synthesis Example 4-2 was used instead of the compound (represented by Chemical Formula A1) according to Synthesis Example 4-1.

Example 2-2

A photosensitive resin composition was prepared according to the same method as Example 1-1 except that the compound (represented by Chemical Formula B2) according to Synthesis Example 8-2 was used instead of the compound (represented by Chemical Formula A1) according to Synthesis Example 4-1.

Example 3-2

A photosensitive resin composition was prepared according to the same method as Example 1-1 except that the compound (represented by Chemical Formula C2) according to Synthesis Example 12-2 was used instead of the compound (represented by Chemical Formula A1) according to Synthesis Example 4-1.

Example 4-2

A photosensitive resin composition was prepared according to the same method as Example 1-1 except that the compound (represented by Chemical Formula D2) according to Synthesis Example 16-2 was used instead of the compound (represented by Chemical Formula A1) according to Synthesis Example 4-1.

Example 5-2

A photosensitive resin composition was prepared according to the same method as Example 1-1 except that the compound (represented by Chemical Formula E2) according to Synthesis Example 20-2 was used instead of the compound (represented by Chemical Formula A1) according to Synthesis Example 4-1.

Example 6-2

A photosensitive resin composition was prepared according to the same method as Example 1-1 except that the compound (represented by Chemical Formula F2) according to Synthesis Example 24-2 was used instead of the compound (represented by Chemical Formula A1) according to Synthesis Example 4-1.

Example 7-2

A photosensitive resin composition was prepared according to the same method as Example 1-1 except that the compound (represented by Chemical Formula G2) according to Synthesis Example 28-2 was used instead of the compound (represented by Chemical Formula A1) according to Synthesis Example 4-1.

Example 8-2

A photosensitive resin composition was prepared according to the same method as Example 1-1 except that the compound (represented by Chemical Formula H2) according to Synthesis Example 32-2 was used instead of the compound (represented by Chemical Formula A1) according to Synthesis Example 4-1.

Example 9-2

A photosensitive resin composition was prepared according to the same method as Example 1-1 except that the compound (represented by Chemical Formula 12) according to Synthesis Example 36-2 was used instead of the compound (represented by Chemical Formula A1) according to Synthesis Example 4-1.

Example 10-2

A photosensitive resin composition was prepared according to the same method as Example 1-1 except that the compound (represented by Chemical Formula J2) according to Synthesis Example 40-2 was used instead of the compound (represented by Chemical Formula A1) according to Synthesis Example 4-1.

Example 11-2

A photosensitive resin composition was prepared according to the same method as Example 1-1 except that the compound (represented by Chemical Formula K2) according to Synthesis Example 44-2 was used instead of the compound (represented by Chemical Formula A1) according to Synthesis Example 4-1.

Comparative Example 1

A photosensitive resin composition was prepared according to the same method as Example 1-1 except that the compound (represented by Chemical Formula C-1) according to Comparative Synthesis Example 1 was used instead of the compound (represented by Chemical Formula A1) according to Synthesis Example 4-1.

Comparative Example 2

A photosensitive resin composition was prepared according to the same method as Example 1-1 except that the compound (represented by Chemical Formula C-2) according to Comparative Synthesis Example 2 was used instead of the compound (represented by Chemical Formula A1) according to Synthesis Example 4-1.

Evaluation 1: Measurement of Chemical Resistance of Composition

The photosensitive resin compositions according to Examples 1-1 to 11-2 and Comparative Examples 1 and 2 were respectively used to form color filter specimens, and the color filter specimens were dipped in a PGMEA solution for 10 minutes at ambient temperature and then, evaluated with respect to chemical resistance by calculating an absorption intensity change ratio before and after the dipping in the solution as shown in Equation 1, and the results are shown in Table 2. (According to Equation 1, the smaller the value, the better the chemical resistance.)

Chemical resistance = $\{1 - $(absorption intensity after dipping in a solution)/(absorption intensity before dipping in the solution)$\} \times 100\%$ [Equation 1]

TABLE 2

(unit: %)

| | Chemical resistance |
|---|---|
| Example 1-1 | 1.5 |
| Example 2-1 | 1.7 |
| Example 3-1 | 1.5 |
| Example 4-1 | 1.5 |
| Example 5-1 | 1.4 |
| Example 6-1 | 1.6 |
| Example 7-1 | 1.8 |
| Example 8-1 | 0.7 |
| Example 9-1 | 0.9 |
| Example 10-1 | 0.6 |
| Example 11-1 | 0.6 |
| Example 1-2 | 3.0 |
| Example 2-2 | 3.4 |
| Example 3-2 | 3.1 |
| Example 4-2 | 3.2 |
| Example 5-2 | 3.3 |
| Example 6-2 | 3.4 |
| Example 7-2 | 2.3 |
| Example 8-2 | 2.0 |
| Example 9-2 | 2.3 |
| Example 10-2 | 2.0 |
| Example 11-2 | 1.7 |
| Comparative Example 1 | 90 |
| Comparative Example 2 | 92 |

Referring to Table 2, the photosensitive resin compositions of Examples 1-1 to 11-2 including a high content of the core-shell compound according to one embodiment exhibited excellent chemical resistance and thus were very suitable for a CMOS image sensor.

By way of summation and review, a CMOS image sensor may be developed along a technology trend of increasing the number of pixels and decreasing a size for realizing high-definition and down-sizing a device, but as the pixels become smaller, there may be a limit to manufacture a fine pattern by using a pigment, and accordingly, a dye may compensate for this. However, the dye may have issues in terms of processability during the pattern manufacture, compared with the pigment. In particular, the dye may have issues in terms of chemical resistance, because the pigment is fine particles and has crystallinity and thus insufficient solubility and thereby may not be eluted in a solvent such as PGMEA after the baking, and the dye may be an amorphous solid and thus dissolved out in the solvent after the baking. The CMOS image sensor may use a high content of a colorant and a binder resin or a monomer at a relatively lower ratio, and the chemical resistance of the dye may be difficult to improve.

One or more embodiments may provide a core-shell compound constituting a green pixel in a color filter for a CMOS image sensor.

The core-shell compound according to an embodiment may have excellent chemical resistance by itself, and thus may help maintain improved chemical resistance even after curing and thermal processes, and thus the photosensitive resin composition including this as a dye may form a fine pattern, thereby providing a green color filter for a CMOS image sensor.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A compound, comprising:
an inner part represented by Chemical Formula 1; and
an outer part surrounding the inner part, the outer part being represented by Chemical Formula 2:

[Chemical Formula 1]

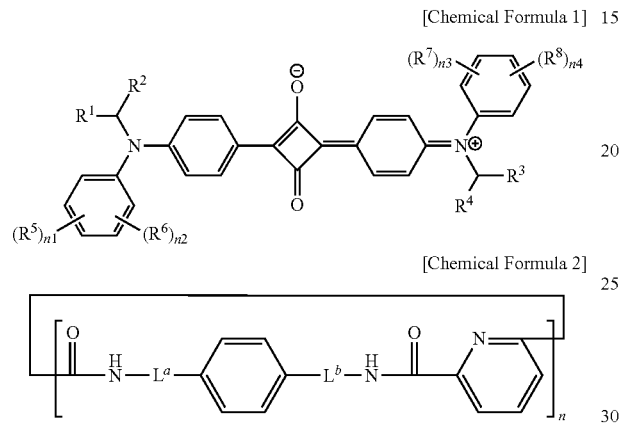

[Chemical Formula 2]

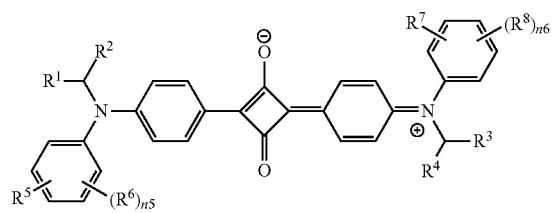

wherein, in Chemical Formula 1 and Chemical Formula 2,
$R^1$ to $R^8$ are each independently a hydrogen atom, a substituted or unsubstituted C1 to C20 alkyl group, or a substituted or unsubstituted C1 to C20 alkoxy group, provided that all of $R^1$ to $R^8$ are not simultaneously a hydrogen atom,
$R^1$ and $R^2$ are separate or are fused to each other to form a ring,
$R^3$ and $R^4$ are separate or are fused to each other to form a ring,
at least one of $R^1$, $R^2$, $R^5$, and $R^6$ is substituted with an epoxy group or a siloxane group at a terminal end thereof,
at least one of $R^3$, $R^4$, $R^7$, and $R^8$ is substituted with an epoxy group or a siloxane group at a terminal end thereof,
$L^a$ and $L^b$ are each independently a single bond or a substituted or unsubstituted C1 to C10 alkylene group,
n1, n2, n3, and n4 are each independently an integer of 0 to 5, 1≤n1+n2≤3, 1≤n3+n4≤3, and
n is an integer of greater than or equal to 2.

2. The compound as claimed in claim 1, wherein the substituent including an epoxy group or a siloxane group at the terminal end thereof includes an ether linking group (*—O—*).

3. The compound as claimed in claim 2, wherein:
at least one of $R^1$, $R^2$, $R^5$, and $R^6$ and at least one of $R^3$, $R^4$, $R^7$, and $R^8$ are independently represented by Chemical Formula 3-1 or Chemical Formula 3-2,

[Chemical Formula 3-1]

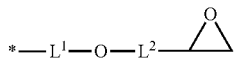

[Chemical Formula 3-2]

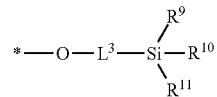

in Chemical Formula 3-1 and Chemical Formula 3-2,
$L^1$ and $L^2$ are each independently a single bond or a substituted or unsubstituted C1 to C20 alkylene group,
$L^3$ is a substituted or unsubstituted C1 to C20 alkylene group, and
$R^9$ to $R^{11}$ are each independently a substituted or unsubstituted C1 to C20 alkyl group or a substituted or unsubstituted C1 to C20 alkoxy group.

4. The compound as claimed in claim 1, wherein:
$R^5$ and $R^6$ are different from each other, and
$R^7$ and $R^8$ are different from each other.

5. The compound as claimed in claim 1, wherein any one of $R^1$, $R^2$, $R^5$, and $R^6$ and any one of $R^3$, $R^4$, $R^7$, and $R^8$ are independently substituted with an epoxy group or a siloxane group at the terminal end thereof.

6. The compound as claimed in claim 1, wherein any two of $R^1$, $R^2$, $R^5$, and $R^6$ and any two of the $R^3$, $R^4$, $R^7$, and $R^8$ are independently substituted with an epoxy group or a siloxane group at the terminal end thereof.

7. The compound as claimed in claim 1, wherein any three of $R^1$, $R^2$, $R^5$, and $R^6$ and any three of $R^3$, $R^4$, $R^7$, and $R^8$ are independently substituted with an epoxy group or a siloxane group at the terminal end thereof.

8. The compound as claimed in claim 5, wherein:
Chemical Formula 1 is represented by Chemical Formula 1-1A or Chemical Formula 1-1B:

[Chemical Formula 1-1A]

in Chemical Formula 1-1A,
$R^1$ to $R^4$, $R^6$, and $R^8$ are each independently a hydrogen atom, a substituted or unsubstituted C1 to C20 alkyl group, or a substituted or unsubstituted C1 to C20 alkoxy group, provided that all of $R^1$ to $R^4$, $R^6$, and $R^8$ are not simultaneously a hydrogen atom,
none of $R^1$ to $R^4$, $R^6$, and $R^8$ include an epoxy group,
$R^5$ and $R^7$ are each independently a C1 to C20 alkyl group substituted with an epoxy group at a terminal end thereof or a C1 to C20 alkoxy group substituted with an epoxy group at the terminal end, and
n5 and n6 are each independently an integer of 0 to 2,

[Chemical Formula 1-1B]

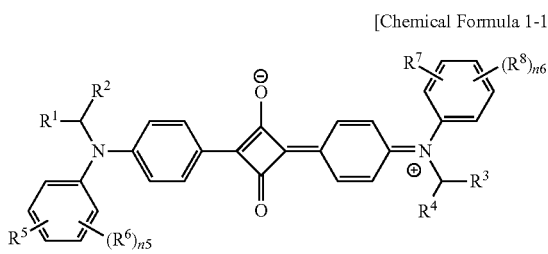

[Chemical Formula 1-2B]

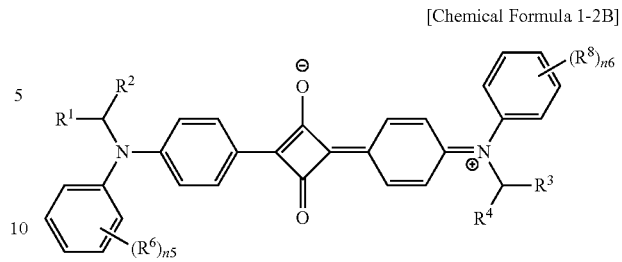

in Chemical Formula 1-1B, $R^1$ to $R^4$, $R^6$, and $R^8$ are each independently a hydrogen atom, a substituted or unsubstituted C1 to C20 alkyl group, or a substituted or unsubstituted C1 to C20 alkoxy group, provided that all of $R^1$ to $R^4$, $R^6$, and $R^8$ are not simultaneously a hydrogen atom, $R^1$ and $R^2$ are separate or are fused to each other to form a ring, $R^3$ and $R^4$ are separate or are fused to each other to form a ring, none of $R^1$ to $R^4$, $R^6$, and $R^8$ includes a siloxane group, $R^5$ and $R^7$ are each independently a C1 to C20 alkyl group substituted with a siloxane group at the terminal end thereof or a C1 to C20 alkoxy group substituted with a siloxane group at the terminal end thereof, and n5 and n6 are each independently an integer of 0 to 2.

9. The compound as claimed in claim 5, wherein:

Chemical Formula 1 is represented by Chemical Formula 1-2A or Chemical Formula 1-2B:

[Chemical Formula 1-2A]

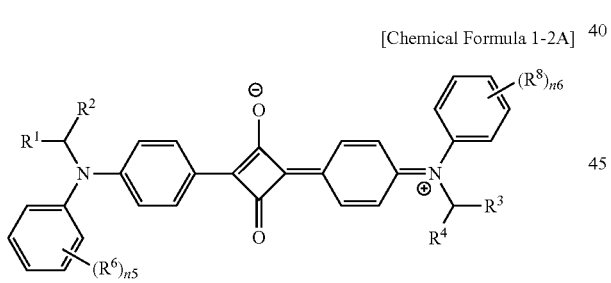

in Chemical Formula 1-2A, $R^2$, $R^4$, $R^6$, and $R^8$ are each independently a hydrogen atom, a substituted or unsubstituted C1 to C20 alkyl group, or a substituted or unsubstituted C1 to C20 alkoxy group, provided that all of $R^2$, $R^4$, $R^6$, and $R^8$ are not simultaneously a hydrogen atom, none of $R^2$, $R^4$, $R^6$, and $R^8$ includes an epoxy group, $R^1$ and $R^3$ are each independently a C1 to C20 alkyl group substituted with an epoxy group at the terminal end thereof or a C1 to C20 alkoxy group substituted with an epoxy group at the terminal end thereof, and n5 and n6 are each independently an integer of 0 to 2, in Chemical Formula 1-2B, $R^2$, $R^4$, $R^6$, and $R^8$ are each independently a hydrogen atom, a substituted or unsubstituted C1 to C20 alkyl group, or a substituted or unsubstituted C1 to C20 alkoxy group, provided that all of $R^2$, $R^4$, $R^6$, and $R^8$ are not simultaneously a hydrogen atom, none of $R^2$, $R^4$, $R^6$, and $R^8$ includes a siloxane group, $R^1$ and $R^3$ are each independently a C1 to C20 alkyl group substituted with a siloxane group at the terminal end thereof or a C1 to C20 alkoxy group substituted with a siloxane group at the terminal end thereof, and n5 and n6 are each independently an integer of 0 to 2.

10. The compound as claimed in claim 6, wherein:

Chemical Formula 1 is represented by Chemical Formula 1-3A or Chemical Formula 1-3B:

[Chemical Formula 1-3A]

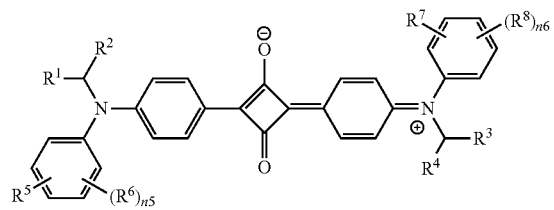

in Chemical Formula 1-3A, $R^2$, $R^4$, $R^6$, and $R^8$ are each independently a hydrogen atom, a substituted or unsubstituted C1 to C20 alkyl group, or a substituted or unsubstituted C1 to C20 alkoxy group, provided that all of $R^2$, $R^4$, $R^6$, and $R^8$ are not simultaneously a hydrogen atom, none of $R^2$, $R^4$, $R^6$, and $R^8$ includes an epoxy group, $R^1$, $R^3$, $R^5$, and $R^7$ are each independently a C1 to C20 alkyl group substituted with an epoxy group at the terminal end thereof or a C1 to C20 alkoxy group substituted with an epoxy group at the terminal end thereof, and n5 and n6 are each independently an integer of 0 to 2,

[Chemical Formula 1-3B]

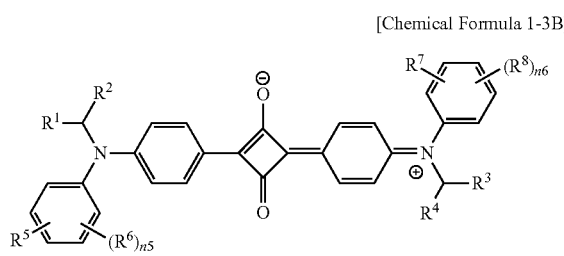

wherein, in Chemical Formula 1-3B, $R^2$, $R^4$, $R^6$, and $R^8$ are each independently a hydrogen atom, a substituted or unsubstituted C1 to C20 alkyl group, or a substituted or unsubstituted C1 to C20 alkoxy group, provided that all of $R^2$, $R^4$, $R^6$, and $R^8$ are not simultaneously a hydrogen atom, none of $R^2$, $R^4$, $R^6$, and $R^8$ includes a siloxane group, $R^1$, $R^3$, $R^5$, and $R^7$ are each independently a C1 to C20 alkyl group substituted with a siloxane group at the terminal end thereof or a C1 to C20 alkoxy group substituted with a siloxane group at the terminal end thereof, and n5 and n6 are each independently an integer of 0 to 2.

11. The compound as claimed in claim 7, wherein:

Chemical Formula 1 is represented by Chemical Formula 1-4A or Chemical Formula 1-4B:

[Chemical Formula 1-4A]

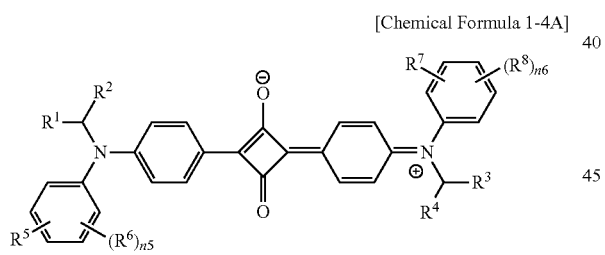

in Chemical Formula 1-4A, $R^6$ and $R^8$ are each independently a hydrogen atom, a substituted or unsubstituted C1 to C20 alkyl group, or a substituted or unsubstituted C1 to C20 alkoxy group, none of $R^6$ and $R^8$ includes an epoxy group, $R^1$ to $R^5$ and $R^7$ are each independently a C1 to C20 alkyl group substituted with an epoxy group at the terminal end thereof or a C1 to C20 alkoxy group substituted with an epoxy group at the terminal end thereof, and n5 and n6 are each independently an integer of 0 to 2,

[Chemical Formula 1-4B]

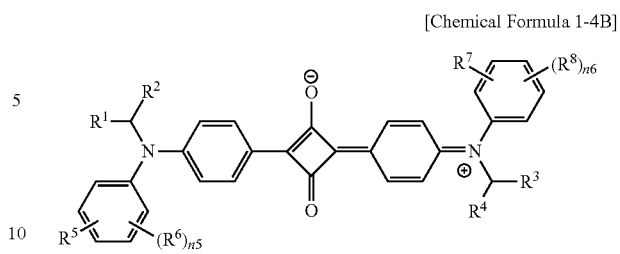

wherein, in Chemical Formula 1-4B, $R^6$ and $R^8$ are each independently a hydrogen atom, a substituted or unsubstituted C1 to C20 alkyl group, or a substituted or unsubstituted C1 to C20 alkoxy group, none of $R^6$ and $R^8$ includes a siloxane group, $R^1$ to $R^5$ and $R^7$ are each independently a C1 to C20 alkyl group substituted with a siloxane group at the terminal end thereof or a C1 to C20 alkoxy group substituted with a siloxane group at the terminal end thereof, and n5 and n6 are each independently an integer of 0 to 2.

12. The compound as claimed in claim 1, wherein the inner part represented by Chemical Formula 1 has a maximum absorption wavelength at 610 nm to 640 nm.

13. The compound as claimed in claim 1, wherein the outer part represented by Chemical Formula 2 is represented by Chemical Formula 2-1:

[Chemical Formula 2-1]

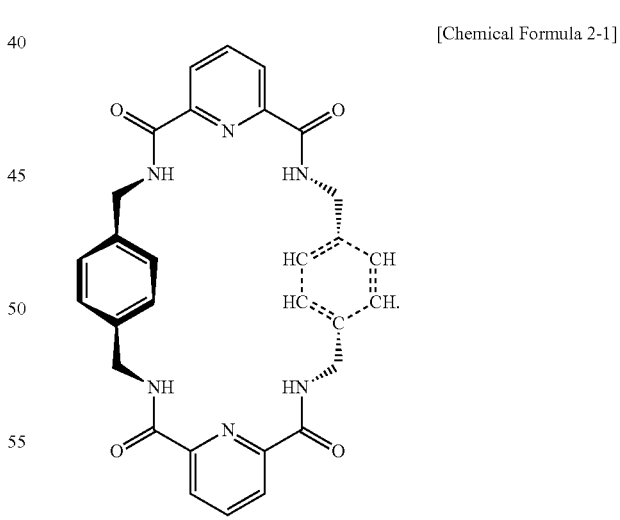

14. The compound as claimed in claim 1, wherein the compound is represented by one of Chemical Formula A1 to Chemical Formula K1 and A2 to Chemical Formula K2:

[Chemical Formula A1]
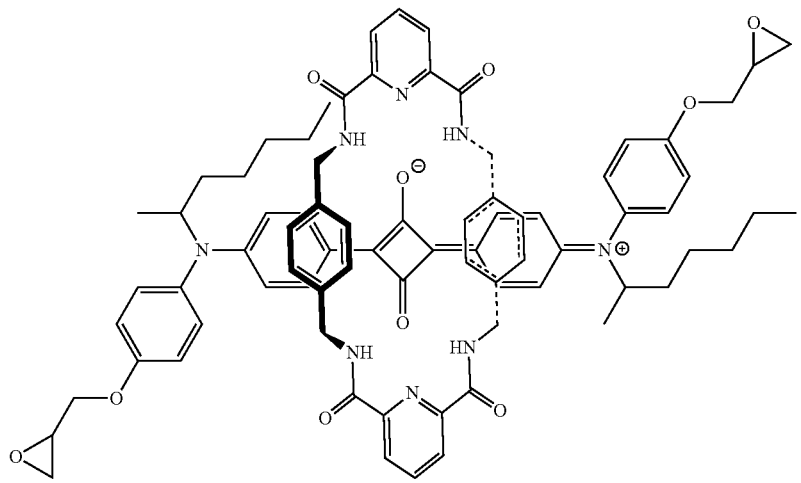
[Chemical Formula B1]
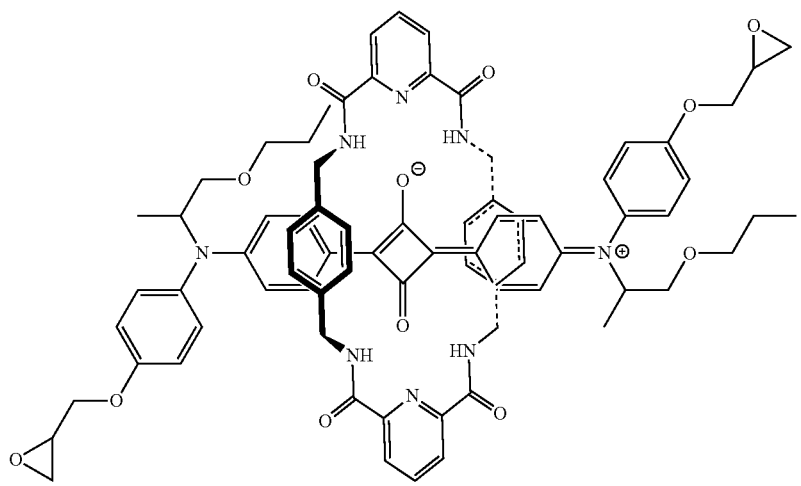
[Chemical Formula C1]
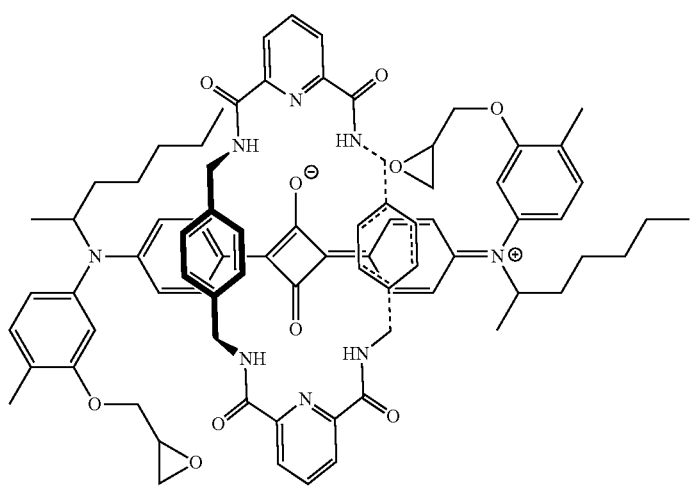

[Chemical Formula D1]
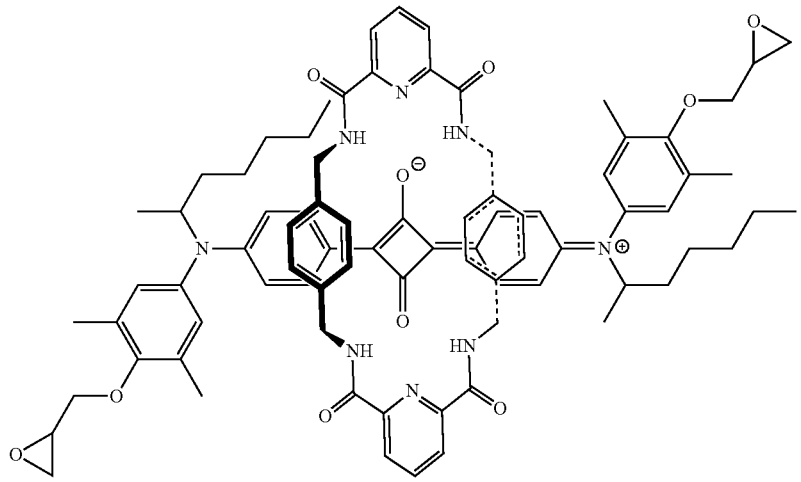
[Chemical Formula E1]
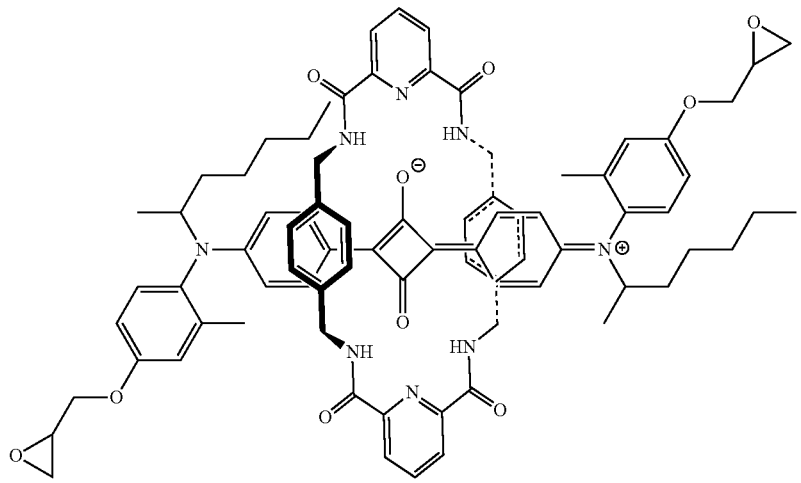
[Chemical Formula F1]
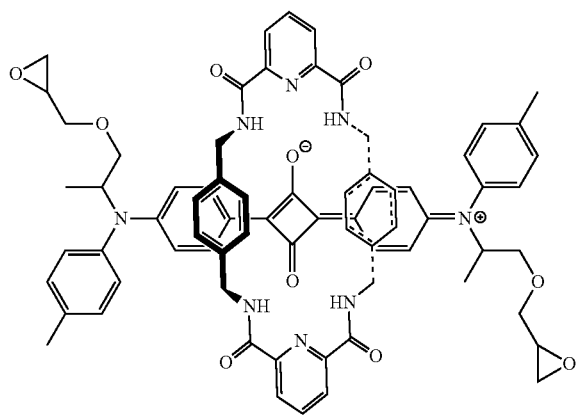
[Chemical Formula G1]
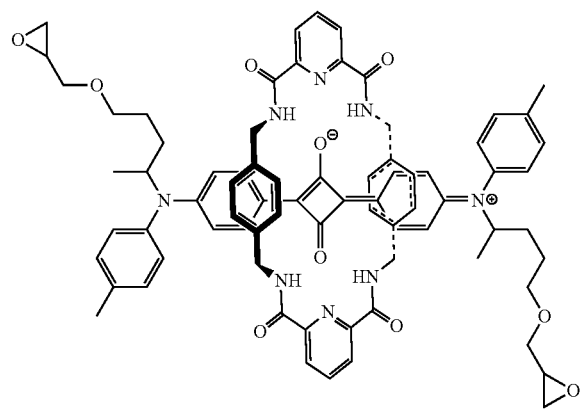

-continued
[Chemical Formula H1]
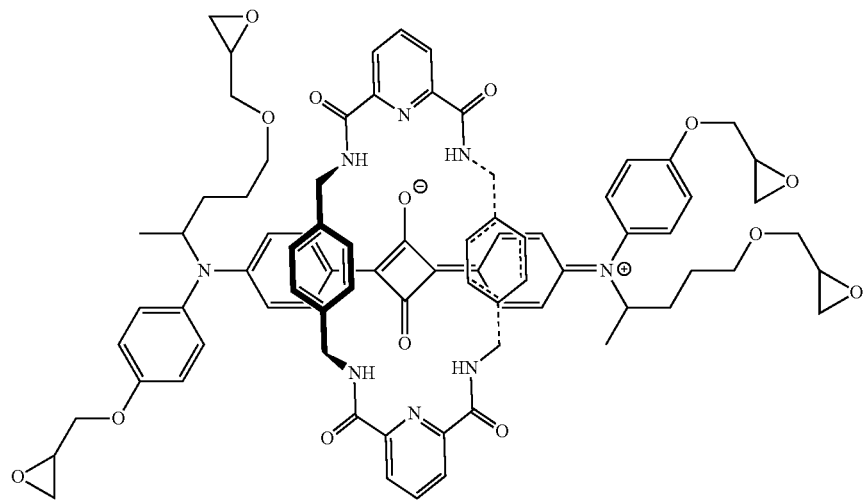
[Chemical Formula I1]
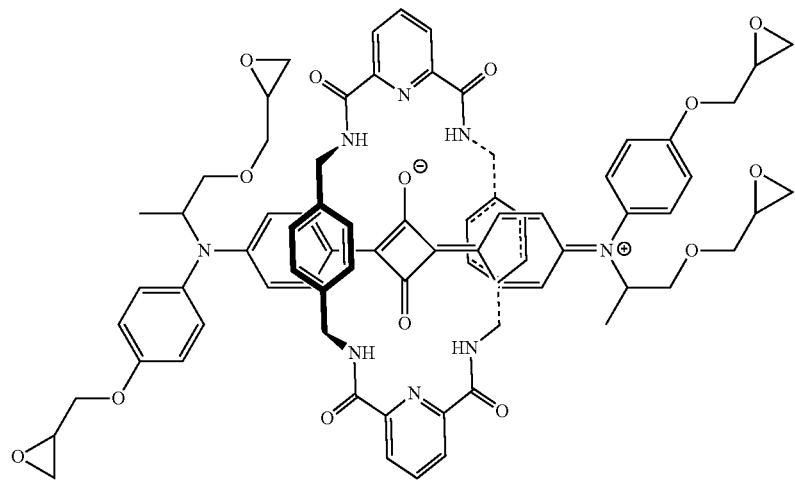
[Chemical Formula J1]
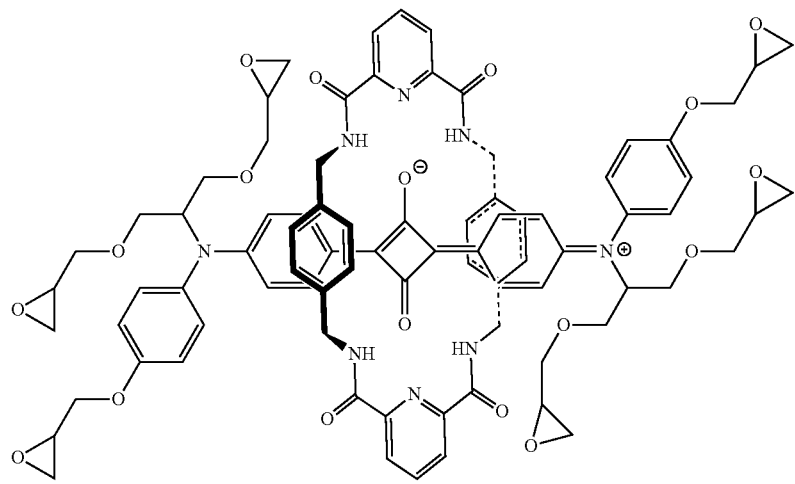

-continued
[Chemical Formula K1]
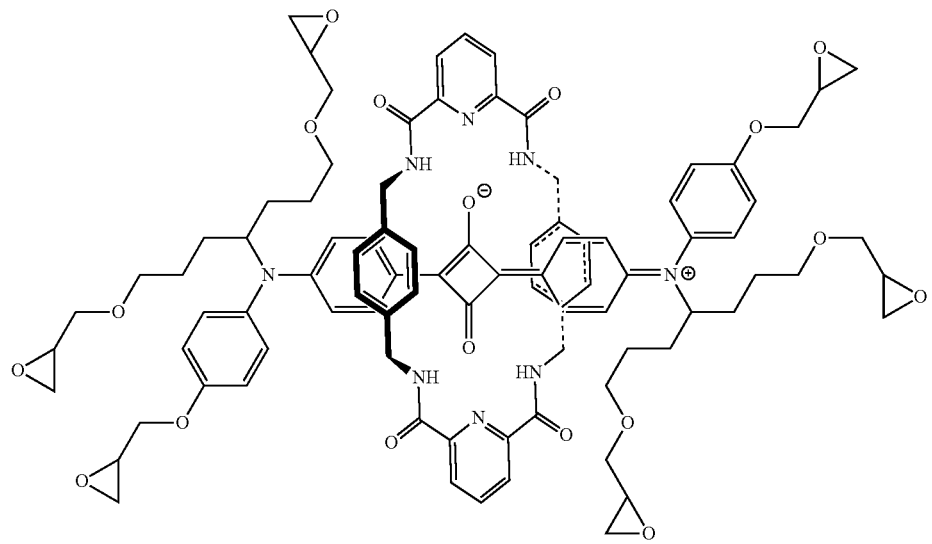
[Chemical Formula A2]
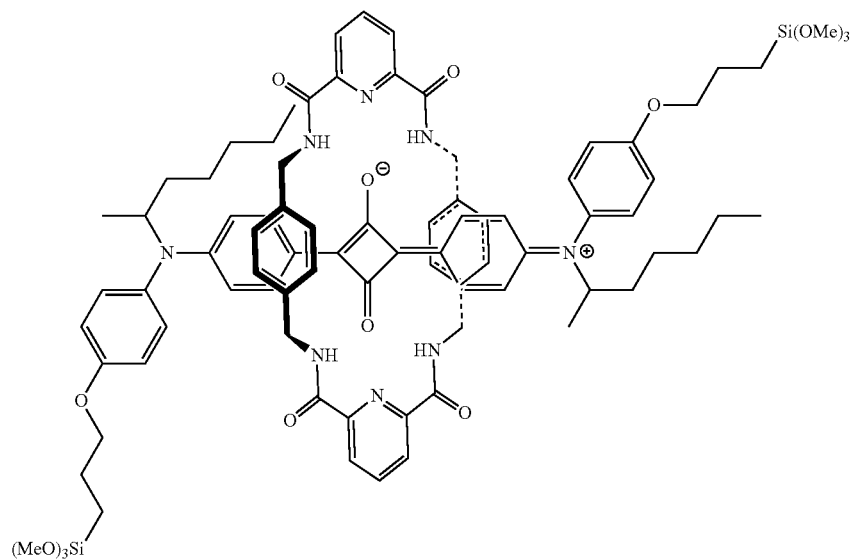
[Chemical Formula B2]
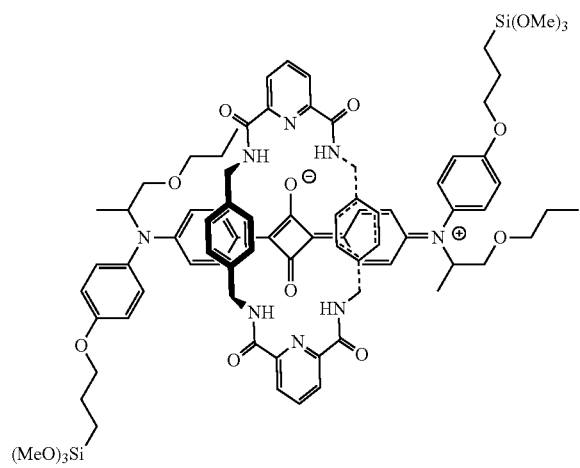
[Chemical Formula C2]
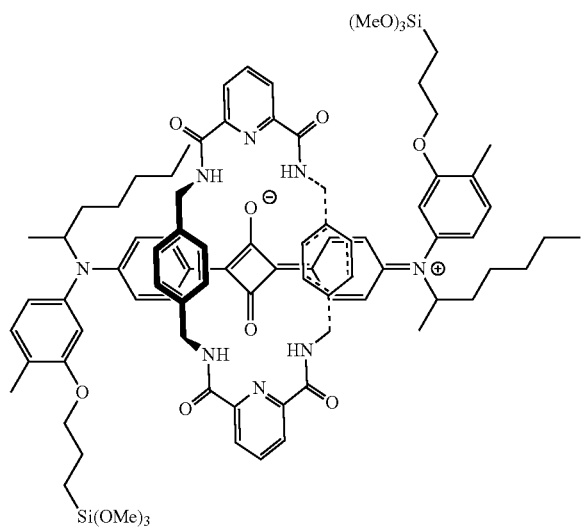

[Chemical Formula D2]
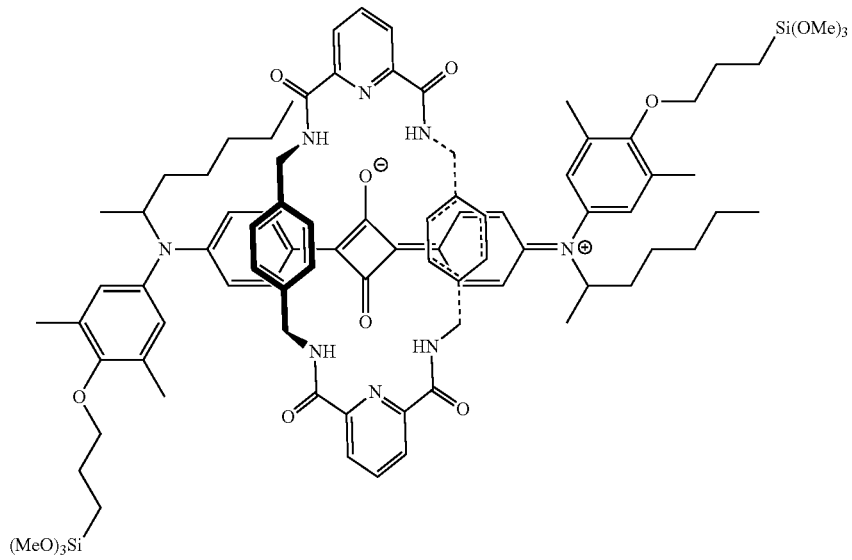
[Chemical Formula E2]
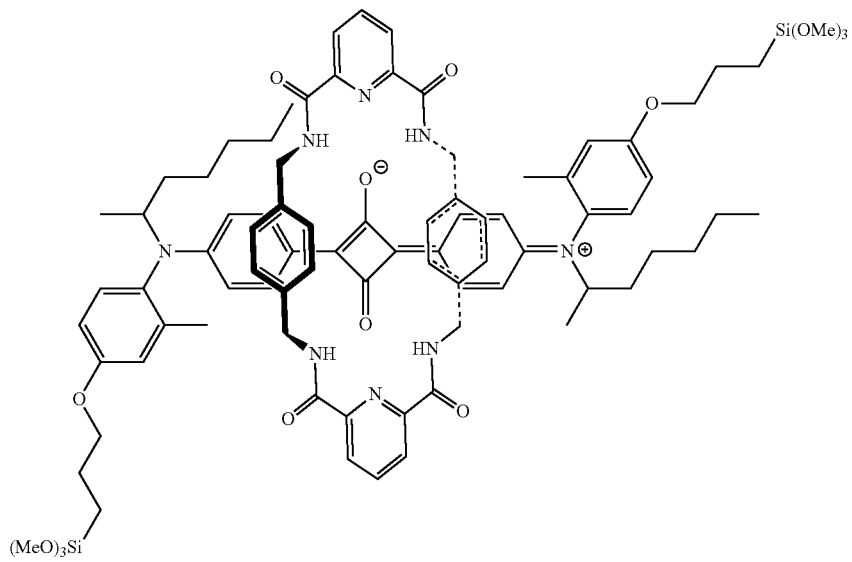
[Chemical Formula F2]
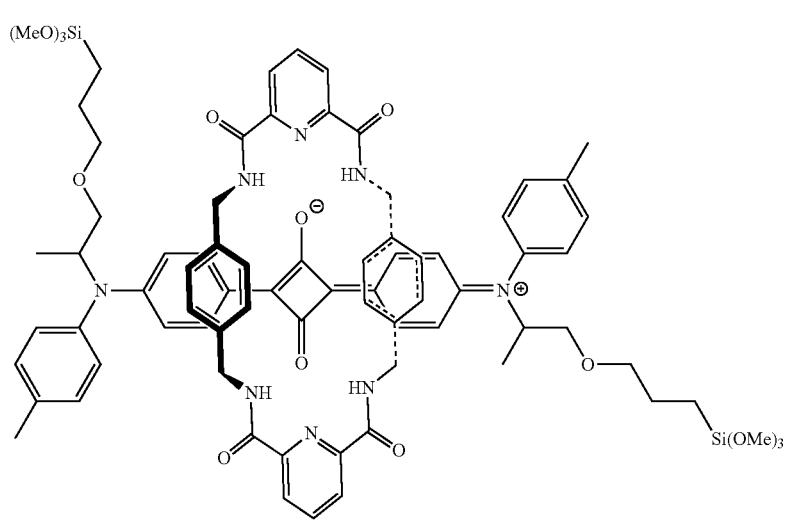

[Chemical Formula G2]
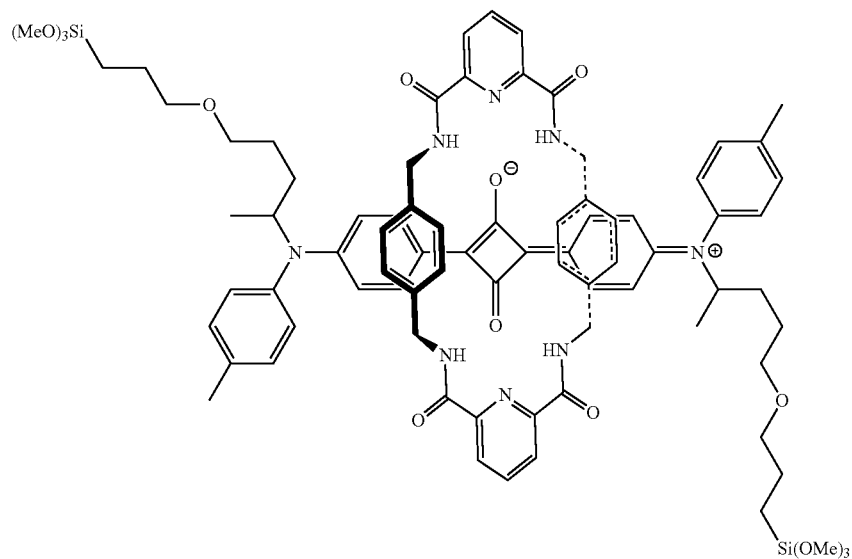
[Chemical Formula H2]
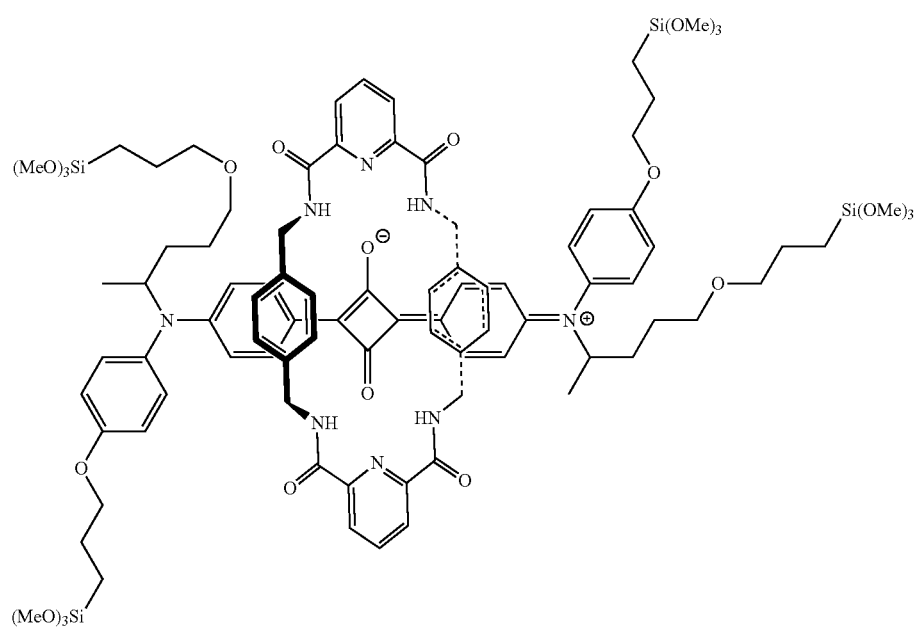

-continued
[Chemical Formula I2]
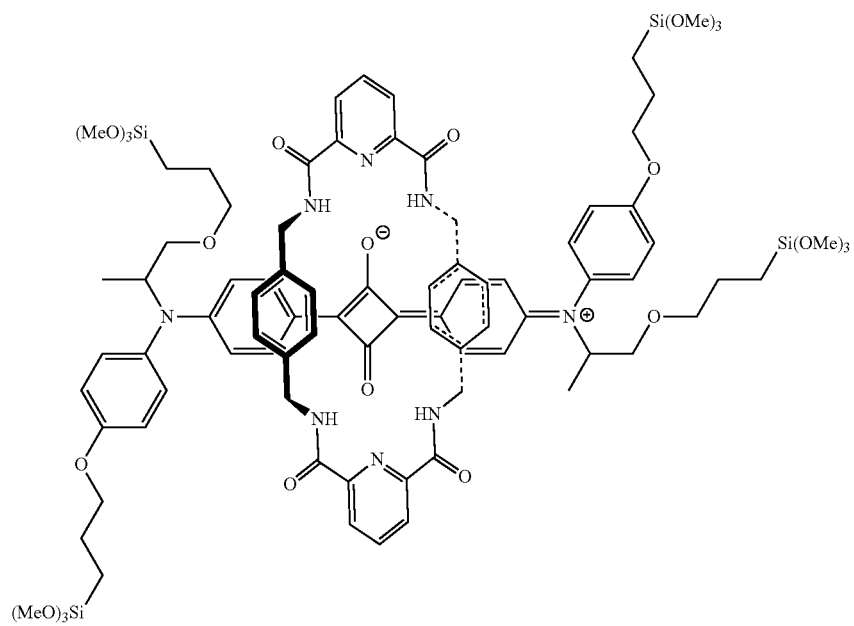
[Chemical Formula J2]
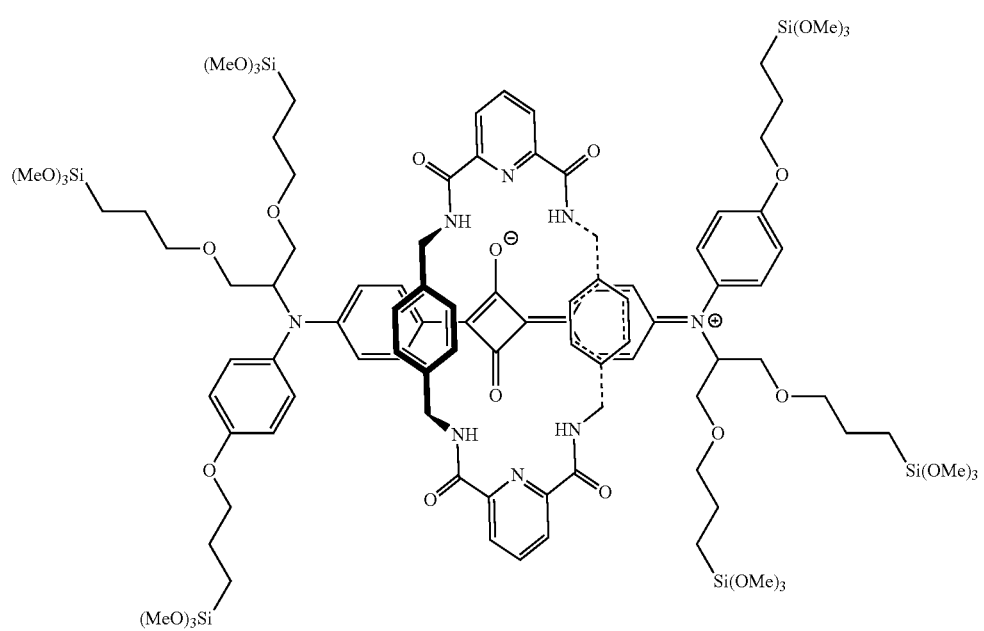

-continued

[Chemical Formula K2]

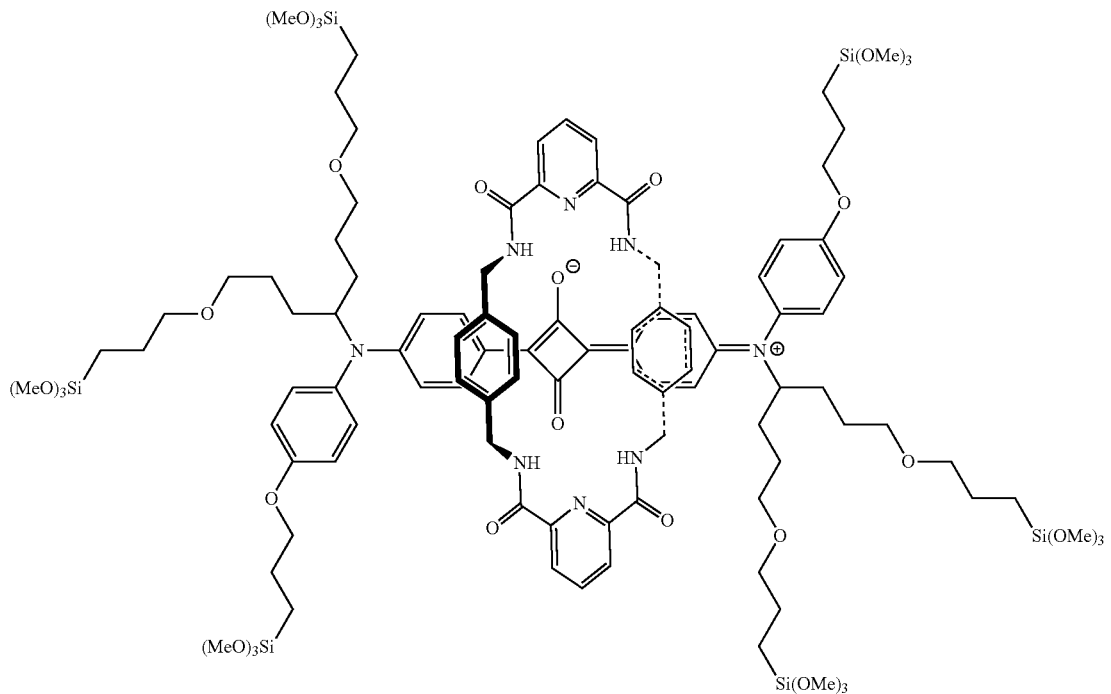

15. A photosensitive resin composition comprising the compound as claimed in claim 1.

16. The photosensitive resin composition as claimed in claim 15, further comprising a binder resin, a photopolymerizable monomer, a photopolymerization initiator, and a solvent.

17. The photosensitive resin composition as claimed in claim 15, wherein the photosensitive resin composition is for a CMOS image sensor.

18. A photosensitive resin layer produced by using the photosensitive resin composition as claimed in claim 15.

19. A color filter comprising the photosensitive resin layer as claimed in claim 18.

20. A CMOS image sensor comprising the color filter as claimed in claim 19.

* * * * *